(12) United States Patent
Kawano et al.

(10) Patent No.: US 11,450,820 B2
(45) Date of Patent: Sep. 20, 2022

(54) LIGHT-EMITTING DEVICE, LIGHT-EMITTING APPARATUS, ELECTRONIC DEVICE, AND LIGHTING DEVICE

(71) Applicant: Semiconductor Energy Laboratory Co., Ltd., Kanagawa-ken (JP)

(72) Inventors: Yuta Kawano, Kanagawa (JP); Hiromitsu Kido, Kanagawa (JP); Toshiki Sasaki, Kanagawa (JP); Tomoya Yamaguchi, Kanagawa (JP); Hideko Yoshizumi, Kanagawa (JP); Satoshi Seo, Kanagawa (JP)

(73) Assignee: Semiconductor Energy Laboratory Co., Ltd.

( * ) Notice: Subject to any disclaimer, the term of this patent is extended or adjusted under 35 U.S.C. 154(b) by 275 days.

(21) Appl. No.: 16/896,483

(22) Filed: Jun. 9, 2020

(65) Prior Publication Data
US 2020/0395555 A1   Dec. 17, 2020

(30) Foreign Application Priority Data
Jun. 14, 2019   (JP) .............................. JP2019-111025

(51) Int. Cl.
*H01L 51/00*   (2006.01)
*H01L 51/56*   (2006.01)
*H01L 51/50*   (2006.01)

(52) U.S. Cl.
CPC ........ *H01L 51/0074* (2013.01); *H01L 51/006* (2013.01); *H01L 51/0052* (2013.01); *H01L 51/0058* (2013.01); *H01L 51/0061* (2013.01); *H01L 51/0071* (2013.01); *H01L 51/0072* (2013.01); *H01L 51/0085* (2013.01); *H01L 51/001* (2013.01); *H01L 51/5004* (2013.01); *H01L 51/5016* (2013.01); *H01L 51/56* (2013.01); *H01L 2251/552* (2013.01); *H01L 2251/558* (2013.01)

(58) Field of Classification Search
CPC .. C09K 11/06; H01L 51/5012; H01L 51/5016
See application file for complete search history.

(56) References Cited

U.S. PATENT DOCUMENTS

| | | | |
|---|---|---|---|
| 9,917,257 B2 * | 3/2018 | Lee ..................... | H01L 51/0059 |
| 2017/0141331 A1 * | 5/2017 | Kim ..................... | C07F 7/0814 |
| 2017/0288154 A1 * | 10/2017 | Seo ....................... | C09K 11/06 |
| 2019/0031673 A1 * | 1/2019 | Yamaguchi ......... | H01L 51/5206 |

FOREIGN PATENT DOCUMENTS

JP   2017-188671 A   10/2017

* cited by examiner

*Primary Examiner* — Andrew J Coughlin
(74) *Attorney, Agent, or Firm* — Husch Blackwell LLP

(57) ABSTRACT

To provide a light-emitting device not only including a light-emitting layer in which energy is efficiently transferred from a host material to a guest material but also having high reliability. In the light-emitting device, the light-emitting layer includes an organic compound having a specific naphthofuropyrazine skeleton as a host material and a light-emitting substance (e.g., an organometallic complex) whose T1 level ($T_G$) is within a certain range as a guest material, thereby increasing not only the efficiency of energy transfer from the host material to the guest material but also the reliability.

19 Claims, 19 Drawing Sheets

LIGHT-EMITTING DEVICE, LIGHT-EMITTING APPARATUS, ELECTRONIC DEVICE, AND LIGHTING DEVICE

BACKGROUND OF THE INVENTION

1. Field of the Invention

One embodiment of the present invention relates to a light-emitting device, a light-emitting apparatus, an electronic device, and a lighting device. Note that one embodiment of the present invention is not limited thereto. That is, one embodiment of the present invention relates to an object, a method, a manufacturing method, or a driving method. One embodiment of the present invention relates to a process, a machine, manufacture, or a composition of matter.

2. Description of the Related Art

A light-emitting device (also referred to as an organic EL device or an organic EL element) including an EL layer between a pair of electrodes uses electroluminescence (EL) and has characteristics such as thinness, light weight, high-speed response to input signals, and low power consumption. Thus, a display including such a light-emitting device has attracted attention as a next-generation flat panel display.

In a light-emitting device, voltage application between the pair of electrodes causes, in the EL layer, recombination of electrons and holes injected from the electrodes, which brings a light-emitting substance (an organic compound) contained in the EL layer into an excited state. Light is emitted when the light-emitting substance returns to the ground state from the excited state. The excited state can be a singlet excited state (S*) and a triplet excited state (T*). Light emission from a singlet excited state is referred to as fluorescence, and light emission from a triplet excited state is referred to as phosphorescence. The statistical generation ratio thereof in the light-emitting device is considered to be S*:T*=1:3. Since the spectrum of light emitted from a light-emitting substance peculiar to the light-emitting substance, the use of different types of organic compounds as light-emitting substances makes it possible to obtain light-emitting devices which exhibit various colors.

For example, device structure improvements and material development of such light-emitting devices have been actively pursued so that device characteristics and reliability can be improved (see Patent Document 1, for example).

REFERENCE

[Patent Document 1] Japanese Published Patent Application No. 2017-188671

SUMMARY OF THE INVENTION

Reducing damage due to driving of a light-emitting device while considering the mechanism of energy transfer between a host material and a guest material in a light-emitting layer of the device is important for the improvement of the device characteristics and reliability.

In view of the above, one embodiment of the present invention provides a light-emitting device not only including a light-emitting layer in which the efficiency of energy transfer from a host material to a guest material is increased but also having high reliability. Another embodiment of the present invention provides a light-emitting device including a light-emitting layer in which the efficiency of energy transfer from a host material to a guest material is increased. Another embodiment of the present invention provides a highly reliable light-emitting device.

Note that the descriptions of these objects do not preclude the existence of other objects. One embodiment of the present invention does not have to achieve all the objects. Other objects will be apparent from and can be derived from the descriptions of the specification, the drawings, the claims, and the like.

According to one embodiment of the present invention, a light-emitting layer of a light-emitting device includes an organic compound having a specific naphthofuropyrazine skeleton as a host material and a light-emitting substance (e.g., an organometallic complex) whose T1 level ($T_G$) is within a certain range as a guest material, thereby increasing not only the efficiency of energy transfer from the host material to the guest material but also the reliability.

One embodiment of the present invention is a light-emitting device which includes an EL layer between a pair of electrodes and in which the EL layer includes a light-emitting layer. The light-emitting layer includes an organic compound having a naphtho[2',1':4,5]furo[2,3-b]pyrazine skeleton and a phosphorescent substance. The T1 level of the phosphorescent substance ($T_G$) is lower than or equal to 2.5 eV. Note that $T_G$ represents the T1 level derived from an absorption edge of an absorption spectrum of the phosphorescent substance.

Another embodiment of the present invention is a light-emitting device which includes an EL layer between a pair of electrodes and in which the EL layer includes a light-emitting layer. The light-emitting layer includes an organic compound having a naphtho[2',1':4,5]furo[2,3-b]pyrazine skeleton and an organometallic complex including a diazine skeleton.

In each of the above structures, the diazine skeleton is preferably a pyrazine skeleton or a pyrimidine skeleton.

Another embodiment of the present invention is a light-emitting device which includes an EL layer between a pair of electrodes and in which the EL layer includes a light-emitting layer. The light-emitting layer includes a first organic compound represented by a general formula (G1) and a phosphorescent substance. The T1 level of the phosphorescent substance ($T_G$) is lower than or equal to 2.5 eV. Note that $T_G$ represents the T1 level derived from an absorption edge of an absorption spectrum of the phosphorescent substance.

[Chemical Formula 1]

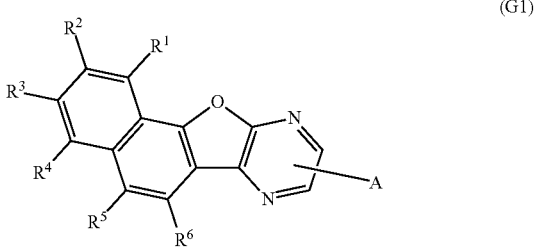

(G1)

In the formula, Q represents oxygen or sulfur. A represents a group with a molecular weight lower than or equal to 1000, and $R^1$ to $R^6$ independently represent any one of hydrogen, a substituted or unsubstituted alkyl group having 1 to 6 carbon atoms, a substituted or unsubstituted cycloalkyl group having 3 to 7 carbon atoms, and a substituted or unsubstituted aryl group having 6 to 30 carbon atoms.

In each of the above structures, a difference between the T1 level of the organic compound ($T_H$) and the T1 level of the phosphorescent substance ($T_G$) preferably satisfies Expression (1) shown below. Note that $T_G$ is a T1 level derived from an absorption edge of an absorption spectrum of the phosphorescent substance, and $T_H$ is a T1 level derived from an emission edge on a short wavelength side of a phosphorescence spectrum of the organic compound.

[Expression 1]

$$0.1 \text{ eV} \leq T_H - T_G \leq 0.4 \text{ eV} \quad (1)$$

In each of the above structures, a difference between the T1 level of the organic compound ($T_H$) and the T1 level of the phosphorescent substance ($T_G$) further preferably satisfies Expression (2) shown below. Note that $T_G$ is a T1 level derived from an absorption edge of an absorption spectrum of the phosphorescent substance, and $T_H$ is a T1 level derived from an emission edge on a short wavelength side of a phosphorescence spectrum of the organic compound.

[Expression 2]

$$0.2 \text{ eV} \leq T_H - T_G \leq 0.4 \text{ eV} \quad (2)$$

One embodiment of the present invention includes, in its category, in addition to a light-emitting apparatus including the light-emitting device described above, an electronic device including a light-emitting device or a light-emitting apparatus (specifically, an electronic device including a light-emitting device or a light-emitting apparatus and a connection terminal or an operation key) and a lighting device including a light-emitting device or a light-emitting apparatus (specifically, a lighting device including a light-emitting device or a light-emitting device and a housing). Accordingly, the light-emitting device in this specification refers to an image display device or a light source (including a lighting device). In addition, a light-emitting apparatus includes, in its category, a module in which a light-emitting apparatus is connected to a connector such as a flexible printed circuit (FPC) or a tape carrier package (TCP), a module in which a printed wiring board is provided on the tip of a TCP, and a module in which an integrated circuit (IC) is directly mounted on a light-emitting device by a chip on glass (COG) method.

One embodiment of the present invention can provide a light-emitting device not only including a light-emitting layer in which the efficiency of energy transfer from the host material to the guest material is increased but also having high reliability.

Another embodiment of the present invention can provide a light-emitting apparatus, an electronic device, and a display device each having high reliability. Another embodiment of the present invention can provide a light-emitting apparatus, an electronic device, and a display device each with low power consumption.

Note that the descriptions of the effects do not preclude the existence of other effects. One embodiment of the present invention does not need to have all the effects listed above. Other effects will be apparent from and can be derived from the descriptions of the specification, the drawings, the claims, and the like. A novel light-emitting device with improved reliability can be provided.

DETAILED DESCRIPTION OF THE INVENTION

Figure 1A:
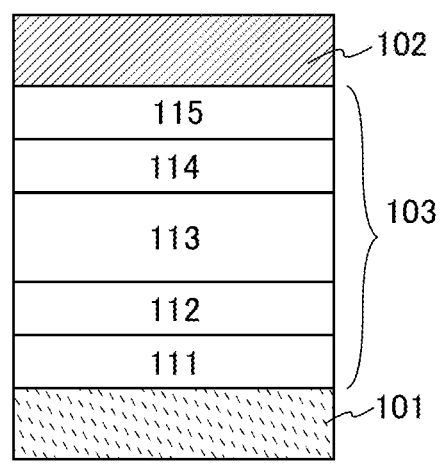
FIGS. 1A and 1B each illustrate a structure of a light-emitting device.

Embodiments and examples of a light-emitting device of the present invention will be described in detail below with reference to the drawings. Note that the present invention is not limited to the following description, and the modes and details of the present invention can be modified in various ways without departing from the spirit and scope of the present invention. Therefore, the present invention should not be construed as being limited to the description in the following embodiments.

Note that the position, size, range, or the like of each component illustrated in drawings and the like is not accurately represented in some cases for easy understanding. Therefore, the disclosed invention is not necessarily limited to the position, size, range, or the like disclosed in the drawings and the like.

In the description of modes of the present invention with reference to the drawings in this specification and the like, the same components in different diagrams are denoted by the same reference numeral.

Embodiment 1

In this embodiment, light-emitting devices of embodiments of the present invention will be described with reference to FIGS. 1A and 1B. Note that the light-emitting devices each have a structure in which an EL layer is positioned between a pair of electrodes. The EL layer includes at least a light-emitting layer and can include functional layers such as a hole-injection layer, a hole-transport layer, an electron-transport layer, and an electron-injection layer as appropriate.

The light-emitting layer is a layer containing a light-emitting substance (a guest material) and also contains a host material. Note that the light-emitting layer may contain a plurality of organic compounds (e.g., a first organic compound and a second organic compound (or a host material and an assist material)) which function as host materials.

Light emission from the light-emitting device is obtained when, in the light-emitting layer, energy is transferred from the host material in an excited state generated by recombination of carriers (holes and electrons) to the guest material and the guest material emits light. In the light-emitting device described in this embodiment, an organic compound having a specific naphthofuropyrazine skeleton, preferably a naphtho[2',1':4,5]furo[2,3-b]pyrazine skeleton, is used as the host material, and a light-emitting substance (e.g., an organometallic complex) whose T1 level is within a certain range, preferably lower than or equal to 2.5 eV, is used as the guest material. Accordingly, the efficiency of energy transfer from the host material in the excited state to the guest material can be increased.

<<Structure of Light-Emitting Devices>>

Figure 1B:
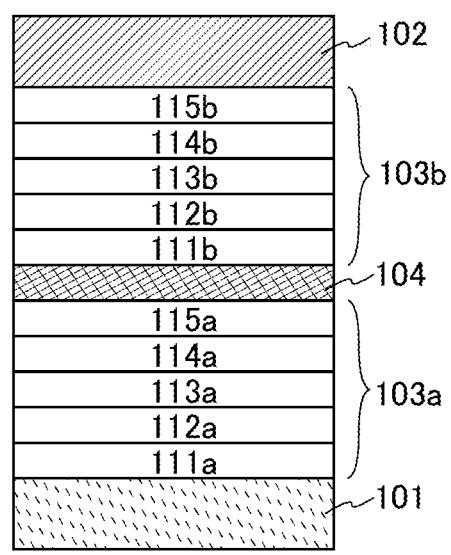

FIGS. 1A and 1B each illustrate an example of a light-emitting device including an EL layer that includes a light-emitting layer between a pair of electrodes. Specifically, an EL layer 103 is provided between a first electrode 101 and a second electrode 102. For example, in the case where the first electrode 101 is an anode, the EL layer 103 has a structure in which a hole-injection layer 111, a hole-transport layer 112, a light-emitting layer 113, an electron-transport layer 114, and an electron-injection layer 115 are stacked as functional layers in this order.

Embodiments of the present invention also include light-emitting devices having other structures, such as a light-emitting device that can be driven at low voltage by having a structure (a tandem structure) where a plurality of EL layers are provided between a pair of electrodes and a charge-generation layer is provided between the EL layers, and a light-emitting device having a micro-optical resonator (microcavity) structure between a pair of electrodes and thus having improved optical characteristics. The charge-generation layer has a function of injecting electrons into one of the adjacent EL layers and injecting holes into the other of the EL layers when voltage is applied between the first electrode 101 and the second electrode 102.

At least one of the first electrode 101 and the second electrode 102 of the light-emitting device is a light-transmitting electrode (e.g., a transparent electrode or a transflective electrode). In the case where the light-transmitting electrode is a transparent electrode, the transparent electrode has a visible light transmittance higher than or equal to 40%. In the case where the light-transmitting electrode is a transflective electrode, the transflective electrode has a visible light reflectance higher than or equal to 20% and lower than or equal to 80%, preferably higher than or equal to 40% and lower than or equal to 70%, These electrodes preferably have a resistivity of $1 \times 10^{-2}$ $\Omega$Cm or less.

Furthermore, when one of the first electrode 101 and the second electrode 102 is a reflective electrode in the light-emitting device of one embodiment of the present invention, the visible light reflectance of the reflective electrode is higher than or equal to 40% and lower than or equal to 100%, preferably higher than or equal to 70% and lower than or equal to 100%. This electrode preferably has a resistivity of $1 \times 10^{-2}$ $\Omega$cm or less.

<First Electrode and Second Electrode>

As materials for the first electrode 101 and the second electrode 102, any of the following materials can be used in an appropriate combination as long as the above functions of the electrodes can be fulfilled. For example, a metal, an alloy, an electrically conductive compound, a mixture of these, and the like can be used as appropriate. Specifically, an In—Sn oxide (also referred to as ITO), an In—Si—Sn oxide (also referred to as ITSO), an In—Zn oxide, an In—W—Zn oxide, or the like can be used. In addition, it is possible to use a metal such as aluminum (Al), titanium (Ti), chromium (Cr), manganese (Mn), iron (Fe), cobalt (Co), nickel (Ni), copper (Cu), gallium (Ga), zinc (Zn), indium (In), tin (Sn), molybdenum (Mo), tantalum (Ta), tungsten (W), palladium (Pd), gold (Au), platinum (Pt), silver (Ag), yttrium (Y), or neodymium (Nd) or an alloy containing an appropriate combination of any of these metals. It is also possible to use a Group 1 element or a Group 2 element in the periodic table that is not described above (e.g., lithium (Li), cesium (Cs), calcium (Ca), or strontium (Sr)), a rare earth metal such as europium (Eu) or ytterbium (Yb), an alloy containing an appropriate combination of any of these elements, graphene, or the like.

For fabrication of these electrodes, a sputtering method or a vacuum evaporation method can be used.

<Hole-Injection Layer>

The hole-injection layer 111 facilitates hole injection from the first electrode 101 serving as an anode to the EL layer 103 and contains an organic acceptor material and a material having a high hole-injection property.

The organic acceptor material allows holes to be generated in another organic compound whose HOMO level is close to the LUMO level of the organic acceptor material when charge separation is caused between the organic acceptor material and the organic compound. Thus, as the organic acceptor material, a compound having an electron-withdrawing group (a halogen group or a cyano group), such as a quinodimethane derivative, a chloranil derivative, and a hexaazatriphenylene derivative, can be used. Examples of the organic acceptor material are 7,7,8,8-tetracyano-2,3,5, 6-tetrafluoroquinodimethane (abbreviation: F$_4$-TCNQ), 3,6-difluoro-2,5,7,7,8,8-hexacyanoquinodimethane, chloranil, 2,3,6,7,10,11-hexacyano-1,4,5,8,9,12-hexaazatriphenylene (abbreviation: HAT-CN), 1,3,4,5,7,8-hexafluorotetracyano-naphthoquinodimethane (abbreviation: F6-TCNNQ), 2-(7-dicyanomethylene-1,3,4,5,6,8,9,10-octafluoro-7H-pyren-2-ylidene)malononitrile, and the like.

Note that among organic acceptor materials, a compound in which electron-withdrawing groups are bonded to a condensed aromatic ring having a plurality of heteroatoms, such as HAT-CN, in particular is preferred because it is thermally stable. A [3]radialene derivative having an electron-withdrawing group (a cyano group or a halogen group such as a fluoro group in particular) which has a high acceptor property and stable film quality against heat, is particularly favorable. Besides, a [3]radialene derivative, which has a very high electron-accepting property, is preferred; specific examples are α,α',α''-1,2,3-cyclopropanetriylidenetris[4-cyano-2,3,5,6-tetrafluorobenzeneacetonitrile], α,α',α''-1,2,3-cyclopropanetriylidenetris[2,6-dichloro-3,5-difluoro-4-(trifluoromethyl)benzeneacetonitrile], α,α',α''-1,2,3-cyclopropanetriylidenetris[2,3,4,5,6-pentafluorobenzeneacetonitrile], and the like.

Examples of the material having a high hole-injection property are transition metal oxides such as a molybdenum oxide, a vanadium oxide, a ruthenium oxide, a tungsten oxide, and a manganese oxide. Other examples are phthalocyanine-based compounds such as phthalocyanine (abbreviation: $H_2Pc$) and copper phthalocyanine (abbreviation: CuPc), and the like.

Other examples are aromatic amine compounds, which are low molecular compounds, such as 4,4',4''-tris(N,N-diphenylamino)triphenylamine (abbreviation: TDATA), 4,4',4''-tris[N-(3-methylphenyl)-N-phenylamino]triphenylamine (abbreviation: MTDATA), 4,4'-bis[N-(4-diphenylaminophenyl)-N-phenylamino]biphenyl (abbreviation: DPAB), 4,4'-bis(N-{4-[N'-(3-methylphenyl)-N'-phenylamino]phenyl}-N-phenylamino)biphenyl (abbreviation: DNTPD), 1,3,5-tris[N-(4-diphenylaminophenyl)-N-phenylamino]benzene (abbreviation: DPA3B), 3-[N-(9-phenylcarbazol-3-yl)-N-phenylamino]-9-phenylcarbazole (abbreviation: PCzPCA1), 3,6-bis[N-(9-phenylcarbazol-3-yl)-N-phenylamino]-9-phenylcarbazole (abbreviation: PCzPCA2), 3-[N-(1-naphthyl)-N-(9-phenylcarbazol-3-yl)amino]-9-phenylcarbazole (abbreviation: PCzPCN1), and the like.

Other examples are high-molecular compounds (e.g., oligomers, dendrimers, and polymers) such as poly(N-vinylcarbazole) (abbreviation: PVK), poly(4-vinyltriphenylamine) (abbreviation: PVTPA), poly[N-(4-{N-[4-(4-diphenylamino)phenyl]phenyl-N'-phenylamino}phenyl) methacrylamide] (abbreviation: PTPDMA), poly[N,N'-bis(4-butylphenyl)-N,N-bis(phenyl)benzidine] (abbreviation: Poly-TPD), and the like. Alternatively, a high-molecular compound to which acid is added, such as poly(3,4-ethylenedioxythiophene)/poly(styrenesulfonic acid) (abbreviation: PEDOT/PSS) or polyaniline/poly(styrenesulfonic acid) (abbreviation: PAni/PSS), can be used.

Alternatively, as the material having a high hole-injection property, a composite material containing a hole-transport material and an acceptor material (electron-accepting material) can be used. In that case, the acceptor material extracts electrons from the hole-transport material, so that holes are generated in the hole-injection layer 111 and the holes are injected into the light-emitting layer 113 through the hole-transport layer 112. Note that the hole-injection layer 111 may be formed to have a single-layer structure using a composite material containing a hole-transport material and an acceptor material (electron-accepting material), or a layered structure of a layer containing a hole-transport material and a layer containing an acceptor material (electron-accepting material).

As the hole-transport material, it is preferable to use a substance having a hole mobility higher than or equal to $1\times10^{-6}$ $cm^2/Vs$ in the case where the square root of the electric field strength [V/cm] is 600. Note that other substances may be used as long as the substances have a hole-transport property higher than an electron-transport property.

As the hole-transport material, materials having a high hole-transport property, such as a π-electron rich heteroaromatic compound (e.g., a carbazole derivative and a furan derivative) and an aromatic amine (a compound having an aromatic amine skeleton), are preferable.

Examples of the above carbazole derivative (a compound having a carbazole skeleton) include a bicarbazole derivative (e.g., a 3,3'-bicarbazole derivative) and an aromatic amine having a carbazolyl group.

Specific examples of the bicarbazole derivative (e.g., a 3,3'-bicarbazole derivative) are 3,3'-bis(9-phenyl-9H-carbazole) (abbreviation: PCCP), 9,9'-bis(1,1'-biphenyl-4-yl)-3,3'-bi-9H-carbazole, 9,9'-bis(1,1'-biphenyl-3-yl)-3,3'-bi-9H-carbazole, 9-(1,1'-biphenyl-3-yl)-9'-(1,1'-biphenyl-4-yl)-9H,9'H-3,3'-bicarbazole (abbreviation: mBPCCBP), 9-(2-naphthyl)-9'-phenyl-9H,9'H-3,3'-bicarbazole (abbreviation: βNCCP), and the like.

Specific examples of the above aromatic amine having a carbazolyl group include 4-phenyl-4'-(9-phenyl-9H-carbazol-3-yl)triphenylamine (abbreviation: PCBA1BP), N-(4-biphenyl)-N-(9,9-dimethyl-9H-fluoren-2-yl)-9-phenyl-9H-carbazol-3-amine (abbreviation: PCBiF), N-(1,1'-biphenyl-4-yl)-N-[4-(9-phenyl-9H-carbazol-3-yl)phenyl]-9,9-dimethyl-9H-fluoren-2-amine (abbreviation: PCBBiF), 4,4'-diphenyl-4''-(9-phenyl-9H-carbazol-3-yl)triphenylamine (abbreviation: PCBBi1BP), 4-(1-naphthyl)-4'-(9-phenyl-9H-carbazol-3-yl)triphenylamine (abbreviation: PCBANB), 4,4'-di(1-naphthyl)-4''-(9-phenyl-9H-carbazol-3-yl)triphenylamine (abbreviation: PCBNBB), 4-phenyldiphenyl-(9-phenyl-9H-carbazol-3-yl)amine (abbreviation: PCA1BP), N,N'-bis(9-phenylcarbazol-3-yl)-N,N'-diphenylbenzene-1,3-diamine (abbreviation: PCA2B), N,N',N''-triphenyl-N,N',N''-tris(9-phenylcarbazol-3-yl)benzene-1,3,5-triamine (abbreviation: PCA3B), 9,9-dimethyl-N-phenyl-N-[4-(9-phenyl-9H-carbazol-3-yl)phenyl]fluoren-2-amine (abbreviation: PCBAF), N-phenyl-N-[4-(9-phenyl-9H-carbazol-3-yl)phenyl]spiro-9,9'-bifluoren-2-amine (abbreviation: PCBASF), 3-[N-(9-phenylcarbazol-3-yl)-N-phenylamino]-9-phenylcarbazole (abbreviation: PCzPCA1), 3,6-bis[N-(9-phenylcarbazol-3-yl)-N-phenylamino]-9-phenylcarbazole (abbreviation: PCzPCA2), 3-[N-(1-naphthyl)-N-(9-phenylcarbazol-3-yl)amino]-9-phenylcarbazole (abbreviation: PCzPCN1), 3-[N-(4-diphenylaminophenyl)-N-phenylamino]-9-phenylcarbazole (abbreviation: PCzDPA1), 3,6-bis[N-(4-diphenylaminophenyl)-N-phenylamino]-9-phenylcarbazole (abbreviation: PCzDPA2), 3,6-bis[N-(4-diphenylaminophenyl)-N-(1-naphthyl)amino]-9-phenylcarbazole (abbreviation: PCzTPN2), 2-[N-(9-phenylcarbazol-3-yl)-N-phenylamino]spiro-9,9'-bifluorene (abbreviation: PCASF), N-[4-(9H-carbazol-9-yl)phenyl]-N-(4-phenyl)phenylaniline (abbreviation: YGA1BP), N,N'-bis[4-(carbazol-9-yl)phenyl]-N,N'-diphenyl-9,9-dimethylfluorene-2,7-diamine (abbreviation: YGA2F), and 4,4',4''-tris(carbazol-9-yl)triphenylamine (abbreviation: TCTA).

Other examples of the carbazole derivative (the compound including a carbazole skeleton) include 3-[4-(9-phenanthryl)-phenyl]-9-phenyl-9H-carbazole (abbreviation: PCPPn), 3-[4-(1-naphthyl)-phenyl]-9-phenyl-9H-carbazole (abbreviation: PCPN), 1,3-bis(N-carbazolyl)benzene (abbreviation: mCP), 4,4'-di(N-carbazolyl)biphenyl (abbreviation: CBP), 3,6-bis(3,5-diphenylphenyl)-9-phenylcarbazole (abbreviation; CzTP), 1,3,5-tris[4-(N-carbazolyl)phenyl]

benzene (abbreviation: TCPB), and 9-[4-(10-phenyl-9-anthracenyl)phenyl]-9H-carbazole (abbreviation: CzPA).

Specific examples of the above furan derivative (the compound having a furan skeleton) include compounds having a thiophene skeleton, such as 4,4',4''-(benzene-1,3,5-triyl)tri(dibenzothiophene) (abbreviation: DBT3P-II), 2,8-diphenyl-4-[4-(9-phenyl-9H-fluoren-9-yl)phenyl]dibenzothiophene (abbreviation: DBTFLP-III), and 4-[4-(9-phenyl-9H-fluoren-9-yl)phenyl]-6-phenyldibenzothiophene (abbreviation: DBTFLP-IV), 4,4',4''-(benzene-1,3,5-triyl)tri(dibenzofuran) (abbreviation: DBF3P-II), and 4-{3-[3-(9-phenyl-9H-fluoren-9-yl)phenyl]phenyl}dibenzofuran (abbreviation: mmDBFFLBi-II).

Specific examples of the above aromatic amine (the compound including an aromatic amine skeleton) include 4,4'-bis[N-(1-naphthyl)-N-phenylamino]biphenyl (abbreviation: NPB or α-NPD), N,N'-bis(3-methylphenyl)-N,N'-diphenyl-[1,1'-biphenyl]-4,4'-diamine (abbreviation: TPD), 4,4'-bis[N-(spiro-9,9'-bifluoren-2-yl)-N-phenylamino]biphenyl (abbreviation: BSPB), 4-phenyl-4'-(9-phenylfluoren-9-yl)triphenylamine (abbreviation: BPAFLP), 4-phenyl-3'-(9-phenylfluoren-9-yl)triphenylamine (abbreviation: mBPAFLP), N-(9,9-dimethyl-9H-fluoren-2-yl)-N-{9,9-dimethyl-2-[N'-phenyl-N'-(9,9-dimethyl-9H-fluoren-2-yl)amino]-9H-fluoren-7-yl}phenylamine (abbreviation: DFLADFL), N-(9,9-dimethyl-2-diphenylamino-9H-fluoren-7-yl)diphenylamine (abbreviation: DPNF), 2-[N-(4-diphenylaminophenyl)-N-phenylamino]spiro-9,9'-bifluorene (abbreviation: DPASF), 2,7-bis[N-(4-diphenylaminophenyl)-N-phenylamino]-spiro-9,9'-bifluorene (abbreviation: DPA2SF), 4,4',4''-tris[N-(1-naphthyl)-N-phenylamino]triphenylamine (abbreviation: 1'-TNATA), 4,4',4''-tris(N,N-diphenylamino)triphenylamine (abbreviation: TDATA), 4,4',4''-tris[N-(3-methylphenyl)-N-phenylamino]triphenylamine (abbreviation: m-MTDATA), N,N'-di(p-tolyl)-N,N'-diphenyl-p-phenylenediamine (abbreviation: DTDPPA), 4,4'-bis[N-(4-diphenylaminophenyl)-N-phenylamino]biphenyl (abbreviation: DPAB), N,N'-bis{4-(bis(3-methylphenyl)amino]phenyl}-N,N'-diphenyl-(1,1'-biphenyl)-4,4'-diamine (abbreviation: DNTPD), and 1,3,5-tris[N-(4-diphenylaminophenyl)-N-phenylamino]benzene (abbreviation: DPA3B).

Other examples of the hole-transport materials are high-molecular compounds such as poly(N-vinylarbazole) (abbreviation: PVK), poly(4-vinyltriphenylamine) (abbreviation; PVTPA), poly[N-(4-{N'-[4-(4-diphenylamino)phenyl]phenyl-N'-phenylamino}phenyl)methacrylamide] (abbreviation: PTPDMA), and poly[N,N'-bis(4-butylphenyl)-N,N'-bis(phenyl)benzidine] (abbreviation: Poly-TPD).

Note that the hole-transport material is not limited to the above examples, and any of a variety of known materials may be used alone or in combination as the hole-transport material.

As the acceptor material for the hole-injection layer 111, an oxide of a metal belonging to any of Group 4 to Group 8 of the periodic table can be used. Specific examples include molybdenum oxide, vanadium oxide, niobium oxide, tantalum oxide, chromium oxide, tungsten oxide, manganese oxide, and rhenium oxide. Among these oxides, molybdenum oxide is especially preferable since it is stable in the air, has a low hygroscopic property, and is easy to handle. It is also possible to use any of the above organic acceptor materials.

The hole-injection layer 111 can be formed by any of known film formation methods such as a vacuum evaporation method.

<Hole-Transport Layer>

The hole-transport layer 112 transports holes injected from the first electrode 101 through the hole-injection layer 111, to the light-emitting layer 113. The hole-transport layer 112 contains a hole-transport material. Thus, the hole-transport layer 112 can be formed using a hole-transport material described above as the hole-transport material that can be used for the hole-injection layer 111.

Note that in the light-emitting device of one embodiment of the present invention, the same organic compound as that for the hole-transport layer 112 may be used for the light-emitting layer 113. The use of the same organic compounds for the hole-transport layer 112 and the light-emitting layer 113 allows efficient hole transport from the hole-transport layer 112 to the light-emitting layer 113.

<Light-Emitting Layer>

The light-emitting layer 113 in the light-emitting device of one embodiment of the present invention includes the light-emitting substance (guest material) and one or more kinds of organic compounds (host material) in which the light-emitting substance is dispersed. The light-emitting layer 113 in the light-emitting device of one embodiment of the present invention particularly preferably includes an organic compound having a specific naphthofuropyrazine skeleton (further preferably, a naphtho[2',1':4,5]furo[2,3-b] pyrazine skeleton) as the host material, and a phosphorescent substance (e.g., an organometallic complex having a diazine skeleton (e.g., a pyrazine skeleton or a pyrimidine skeleton)) whose T1 level (denoted by $T_G$, which means the T1 level derived from an absorption edge of the absorption spectrum of the phosphorescent substance) is within a certain range (preferably, lower than or equal to 2.5 eV) as the guest material. In addition, a difference ($T_H$-$T_G$) between the T1 level of the guest material ($T_G$) and the T1 level of the host material (denoted by $T_H$, which means the T1 level derived from the emission edge on the short wavelength side of the phosphorescence spectrum of the organic compound) in the light-emitting layer 113 preferably satisfies Expression (1) shown below. This is based on the discovery by the present inventors that, although the T1 level of the host material ($T_H$) needs to be higher than the T1 level of the guest material ($T_G$) by at least a certain value for both adequate efficiency and lifetime, the too high T1 level ($T_H$) often impairs lifetime. Note that one embodiment of the present invention has a view different from the conventional view that the T1 level of the host material is preferably as high as possible. For this viewpoint, the $T_H$-$T_G$ is preferably less than or equal to 0.3 eV.

[Expression 3]

$$0.1 \text{ eV} \leq T_H - T_G \leq 0.4 \text{ eV} \tag{1}$$

The difference between the T1 level of the guest material ($T_G$) and the T1 level of the host material (denoted by $T_H$, which means the T1 level derived from the emission edge on the short wavelength side of the phosphorescence spectrum of the organic compound) in the light-emitting layer 113 further preferably satisfies Expression (2) shown below.

[Expression 4]

$$0.2 \text{ eV} \leq T_H - T_G \leq 0.4 \text{ eV} \tag{2}$$

With the light-emitting layer 113 having such a structure, the efficiency of energy transfer from the host material to the guest material can be high and the light-emitting device can be highly reliable.

As the above T1 level of the host material ($T_H$), the value obtained from the emission edge on the short wavelength side of the phosphorescence spectrum (the onset of the spectrum) of the host material is used. The emission edge of a phosphorescence spectrum is the wavelength at the intersection of the horizontal axis and a tangent drawn to the curve on the short wavelength side at around the half of a peak on the shortest wavelength side. From this value, the T1 level of the host material ($T_H$) can be obtained.

The above T1 level of the guest material ($T_G$) can be obtained from the absorption edge of the absorption spectrum of the guest material. The absorption edge of an absorption spectrum is the wavelength at the intersection of the horizontal axis and a tangent drawn to the curve on the longest wavelength side of the absorption spectrum at around the half of a peak or a shoulder peak on the longest wavelength side. From this value, the T1 level of the guest material ($T_G$) can be obtained.

As the light-emitting substance (guest material) that can be used for the light-emitting layer 113, a substance emitting fluorescence (a fluorescent substance), a substance emitting phosphorescence (a phosphorescent substance), a substance exhibiting thermally activated delayed fluorescence (a thermally activated delayed fluorescent (TADF) material), other light-emitting substances, or the like can be used. Note that in one embodiment of the present invention, as described above, the light-emitting substance (e.g., an organic complex having a diazine skeleton (e.g., a pyrazine skeleton or a pyrimidine skeleton)) whose T1 level ($T_G$) is within a certain range (preferably, lower than or equal to 2.5 eV) is particularly preferably used. Alternatively, a substance whose emission color is blue, violet, bluish violet, green, yellowish green, yellow, orange, red, or the like can be used as appropriate. Alternatively, the light-emitting layer 113 may include a plurality of light-emitting layers containing different light-emitting substances, to exhibit different emission colors (e.g., complementary emission colors may be combined to achieve white light emission). Alternatively, one light-emitting layer may include a plurality of different light-emitting substances.

As the one or more kinds of organic compounds (e.g., host materials), various carrier-transport materials such as the TADF material given above can be used in addition to electron-transport materials and hole-transport materials. As the host material, a hole-transport material that can be used for the hole-transport layer 112 described above, an electron-transport material that can be used for the electron-transport layer 114 described later, or the like can be used. Specifically, one or more kinds of materials appropriately selected from the materials described in this specification or known materials can be used as the hole-transport materials, the electron-transport materials, or the like, for example.

Examples of the fluorescent substance that can be used as a guest material in the light-emitting layer 113 are as follows. Other fluorescent substances can also be used.

The examples include 5,6-bis[4-(10-phenyl-9-anthryl) phenyl]-2,2'-bipyridine (abbreviation: PAP2BPy), 5,6-bis [4'-(10-phenyl-9-anthryl)biphenyl-4-yl]-2,2'-bipyridine (abbreviation: PAPP2BPy), N,N'-diphenyl-N,N'-bis[4-(9-phenyl-9H-fluoren-9-yl)phenyl]pyrene-1,6-diamine (abbreviation: 1,6FLPAPm),N,N'-bis(3-methylphenyl)-N,N'-bis[3-(9-phenyl-9H-fluoren-9-yl)phenyl]pyrene-1,6-diamine (abbreviation: 1,6mMemFLPAPm), N,N'-bis[4-(9H-carbazol-9-yl)phenyl]-N,N'-diphenylstilbene-4,4'-diamine (abbreviation: YGA2S), 4-(9H-carbazol-9-yl)-4'-(10-phenyl-9-anthryl)triphenylamine (abbreviation: YGAPA), 4-(9H-carbazol-9-yl)-4'-(9,10-diphenyl-2-anthryl)triphenylamine (abbreviation: 2YGAPPA), N,9-diphenyl-N-[4-(10-phenyl-9-anthryl)phenyl]-9H-carbazol-3-amine (abbreviation: PCAPA), perylene, 2,5,8,11-tetra(tert-butyl) perylene (abbreviation: TBP), 4-(10-phenyl-9-anthryl)-4'-(9-phenyl-9H-carbazol-3-yl)triphenylamine (abbreviation: PCBAPA), N,N'-(2-tert-butylanthracene-9,10-diyldi-4,1-phenylene)bis[N,N',N'-triphenyl-1,4-phenylenediamine] (abbreviation: DPABPA), N,9-diphenyl-N-[4-(9,10-diphenyl-2-anthryl)phenyl]-9H-carbazol-3-amine (abbreviation: 2PCAPPA), N-[4-(9,10-diphenyl-2-anthryl)phenyl]-N,N', N'-triphenyl-1,4-phenylenediamine (abbreviation: 2DPAPPA), N,N,N',N',N'',N'',N''',N'''-octaphenyldibenzo[g, p]chrysene-2,7,10,15-tetraamine (abbreviation: DBC1), coumarin 30, N-(9,10-diphenyl-2-anthryl)-N,9-diphenyl-9H-carbazol-3-amine (abbreviation: 2PCAPA), N-[9,10-bis (1,1'-biphenyl-2-yl)-2-anthryl]-N,9-diphenyl-9H-carbazol-3-amine (abbreviation: 2PCABPhA), N-(9,10-diphenyl-2-anthryl)-N,N',N'-triphenyl-1,4-phenylenediamine (abbreviation: 2DPAPA), N-[9,1)-bis(1,1'-biphenyl-2-yl)-2-anthryl]-N,N',N'-triphenyl-1,4-phenylenediamine (abbreviation: 2DPABPhA), 9,10-bis(1,1'-biphenyl-2-yl)-N-[4-(9H-carbazol-9-yl)phenyl]-N-phenylanthracen-2-amine (abbreviation: 2YGABPhA), N,N,9-triphenylanthracen-9-amine (abbreviation: DPhAPhA), coumarin 545T, N,N'-diphenylquinacridone (abbreviation: DPQd), rubrene, 5,12-bis(1,1'-biphenyl-4-yl)-6,1-diphenyltetracene (abbreviation: BPT), 2-(2-{2-[4-(dimethylamino)phenyl]ethenyl}-6-methyl-4H-pyran-4-ylidene)propanedinitrile (abbreviation: DCM1), 2-{2-methyl-6-[2-2,3,6,7-tetrahydro-1H,5H-benzo [if]quinolizin-9-yl)ethenyl]-4H-pyran-4-ylidene}propanedinitrile (abbreviation: DCM2), N,N,N',N'-tetrakis(4-methylphenyl)tetracene-5,11-diamine (abbreviation: p-mPhTD), 7,14-diphenyl-N,N,N',N'-tetrakis (4-methylphenyl)acenaphtho[1,2-a]fluoranthene-3,10-diamine (abbreviation: p-mPhAFD), 2-{2-isopropyl-6-[2-(1, 1,7,7-tetramethyl-2,3,6,7-tetrahydro-1H,5H-benzo[ij] quinolizin-9-yl)ethenyl]-4H-pyran-4-ylidene}propanedinitrile (abbreviation: DCJTI), 2-{2-tert-butyl-6-[2-(1,1,7,7-tetramethyl-2,3,6,7-tetrahydro-1H,5H-benzo[if]quinolizin-9-yl)ethenyl]-4H-pyran-4-ylidene}propanedinitrile (abbreviation: DCJTB), 2-(2,6-bis{2-[4-(dimethylamino)phenyl]ethenyl}-4H-pyran-4-ylidene)propanedinitrile (abbreviation: BisDCM), 2-(2,6-bis [2-(8-methoxy-1,1,7,7-tetramethyl-2,3,6,7-tetrahydro-1H, 5H-benzo[i]quinolizin-9-yl)ethenyl]-4H-pyran-4-ylidene) propanedinitrile (abbreviation: BisDCJTM), N,N'-diphenyl-N,N'-(1,6-pyrene-diyl)bis[(6-phenylbenzo[b]naphtho[1,2-d] furan)-8-amine] (abbreviation:1,6BufAPrn-03), 3,10-bis[N-(9-phenyl-9H-carbazol-2-yl)-N-phenylamino]naphtho[2,3-b; 6,7-b']bisbenzofuran (abbreviation: 3,10PCA2Nbf(IV)-02), and 3,10-bis[N-(dibenzofuran-3-yl)-N-phenylamino] naphtho[2,3-b; 6,7-b']bisbenzofuran (abbreviation: 3,10FrA2Nbf(IV)-02). Condensed aromatic diamine compounds typified by pyrenediamine compounds such as 1,6FLPAPrn, 1,6mMemFLPAPrn, and 1,6BnfAPrn-03 are particularly preferred because of their high hole-trapping properties, high emission efficiency, and high reliability.

Examples of the phosphorescent substance that can be used as a guest material in the light-emitting layer 113 are as follows.

The examples include an organometallic iridium complex having a 4H-triazole skeleton, such as tris{2-[5-(2-methylphenyl)-4-(2,6-dimethylphenyl)-4H-1,2,4-triazol-3-yl-κN2]phenylκ-C}iridium(III) (abbreviation: [Ir(mpptz-dmp)$_3$]), tris(5-methyl-3,4-diphenyl-4H-1,2,4-triazolato) iridium(III) (abbreviation: [Ir(Mptz)$_3$]), and tris[4-(3-biphenyl)-5-isopropyl-3-phenyl-4H-1,2,4-triazolato]iridium(III) (abbreviation: [Ir(iPrptz-3b)$_3$]); an organometallic iridium complex having a 1H-triazole skeleton, such as tris[3- methyl-1-(2-methylphenyl)-5-phenyl-1H-1,2,4-triazolato]iridium(III) (abbreviation: [Ir(Mptz1-mp)$_3$]) and tris(1-methyl-5-phenyl-3-propyl-1H-1,2,4-triazolato)iridium(III) (abbreviation: [Ir(Prptz1-Me)$_3$]); an organometallic iridium complex having an imidazole skeleton, such as fac-tris[1-(2,6-diisopropylphenyl)-2-phenyl-1H-imidazole]iridium (III) (abbreviation: [Ir(iPrpmi)$_3$]) and tris[3-(2,6-dimethylphenyl)-7-methylimidazo[1,2-f]phenanthridinato]iridium (II) (abbreviation: [Ir(dmpimpt-Me)$_3$]); and an organometallic iridium complex in which a phenylpyridine derivative having an electron-withdrawing group is a ligand, such as bis[2-(4',6'-difluorophenyl)pyridinato-N,C$^{2'}$]iridium (II) tetrakis(1-pyrazolyl)borate (abbreviation: FIr6), bis[2-(4',6'-difluorophenyl)pyridinato-N,C$^{2'}$]iridium(III)picolinate (abbreviation: FIrpic), bis{2-[3',5'-bis(trifluoromethyl)phenyl]pyridinato-N,C$^{2'}$}iridium(III) picolinate (abbreviation: [Ir(CF$_3$ppy)$_2$(pic)]) and bis[2-(4',6'-difluorophenyl)pyridinato-N,C$^{2'}$]iridium(III) acetylacetonate (abbreviation: FIr(acac)). These compounds emit blue phosphorescence and have an emission peak at 440 nm to 520 nm.

Other examples include organometallic iridium complexes having a pyrimidine skeleton, such as tris(4-methyl-6-phenylpyrimidinato)iridium(III) (abbreviation: [Ir(mppm)$_3$]), tris(4-tert-butyl-6-phenylpyrimidinato)iridium(III) (abbreviation: [Ir(tBuppm)$_3$]), (acetylacetonato)bis(6-methyl-4-phenylpyrimidinato)iridium(III) (abbreviation: [Ir(mppm)$_2$(acac)]), (acetylacetonato)bis(6-tert-butyl-4-phenylpyrimidinato)iridium(III) (abbreviation: [Ir(tBuppm)$_2$(acac)]), (acetylacetonato)bis[6-(2-norbornyl)-4-phenylpyrimidinato]iridium(III) (abbreviation: [Ir(nbppm)$_2$(acac)]), (acetylacetonato)bis[5-methyl-6-(2-methylphenyl)-4-phenylpyrimidinato]iridium(III) (abbreviation: [Ir(mpmppm)$_2$(acac)]), and (acetylacetonato)bis(4,6-diphenylpyrimidinato)iridium(III) (abbreviation: [Ir(dppm)$_2$(acac)]); organometallic iridium complexes having a pyrazine skeleton, such as (acetylacetonato)bis(3,5-dimethyl-2-phenylpyrazinato)iridium(II) (abbreviation: [Ir(mppr-Me)$_2$(acac)]) and (acetylacetonato)bis(5-isopropyl-3-methyl-2-phenylpyrazinato)iridium(III) (abbreviation: [Ir(mppr-iPr)$_2$(acac)]); organometallic iridium complexes having a pyridine skeleton, such as tris(2-phenylpyridinato-N,C$^2$)iridium(III) (abbreviation: [Ir(ppy)$_3$]), bis(2-phenylpyridinato-N,C$^2$)iridium(III) acetylacetonate (abbreviation: [Ir(ppy)$_2$(acac)]), bis(benzo[h]quinolinato)iridium(III) acetylacetonate (abbreviation: [Ir(bzq)$_2$(acac)]), tris(benzo[h]quinolinato)iridium(III) (abbreviation: [Ir(bzq)$_3$]), tris(2-phenylquinolinato-N,C$^{2'}$)iridium(III) (abbreviation: [Ir(pq)$_3$]); and bis(2-phenylquinolinato-N,C$^{2'}$)iridium(III) acetylacetonate(abbreviation: [Ir(pq)$_2$(acac)]); and a rare earth metal complex such as tris(acetylacetonato)(monophenanthroline)terbium(II)(abbreviation:[Tb(acac)$_3$(Phen)]). These are mainly compounds that emit green phosphorescence and have an emission peak at 500 nm to 600 nm. Note that organometallic iridium complexes having a pyrimidine skeleton have distinctively high reliability and emission efficiency and thus are especially preferable.

Other examples include organometallic iridium complexes having a pyrimidine skeleton, such as (diisobutyrylmethanato)bis[4,6-bis(3-methylphenyl)pyrimidinato]iridium(III) (abbreviation: [Ir(5mdppm)$_2$(dibm)]), bis[4,6-bis(3-methylphenyl)pyrimidinato](dipivaloylmethanato)iridium(III) (abbreviation: [Ir(5mdppm)$_2$(dpm)]), and bis[4,6-di(naphthalen-1-yl)pyrimidinato(dipivaloylmethanato) iridium(III) (abbreviation: [Ir(d1npm)$_2$(dpm)]); organometallic iridium complexes having a pyrazine skeleton, such as (acetylacetonato)bis(2,3,5-triphenylpyrazinato)iridium(III) (abbreviation: [Ir((tppr)$_2$(acac)]), bis(2,3,5-triphenylpyrazinato)(dipivaloylmethanato)iridium(III) (abbreviation: [Ir(tppr)$_2$(dpm)]), and (acetylacetonato)bis[2,3-bis(4-fluorophenyl)quinoxalinato]iridium(II) (abbreviation: [Ir(Fdpq)$_2$(acac)]); organometallic iridium complexes having a pyridine skeleton, such as tris(1-phenylisoquinolinato-N,C$^{2'}$)iridium(III) (abbreviation: [Ir(piq)$_3$]) and bis(1-phenylisoquinolinato-N,C$^{2'}$)iridium(III)acetylacetonate (abbreviation:[Ir(piq)$_2$(acac)]); platinum complexes such as 2,3,7,8,12,13,17,18-octaethyl-21H,23H-porphyrinplatinum (II) (abbreviation: [PtOEP]); and rare earth metal complexes such as tris(1,3-diphenyl-1,3-propanedionato) (monophenanthroline)europium(III) (abbreviation: [Eu(DBM)$_3$(Phen)]) and tris[1-(2-thenoyl)-3,3,3-trifluoroacetonato (monophenanthroline)europium(III) (abbreviation: (Eu(TTA)$_3$(Phen)]). These compounds emit red phosphorescence and have an emission peak at 600 nm to 700 nm. Furthermore, the organometallic iridium complexes having a pyrazine skeleton can provide red light emission with favorable chromaticity.

Besides the above-described materials, known phosphorescent substances can also be used.

Examples of the TADF material that can be used as the guest material in the light-emitting layer 113 areas follows.

Examples of the TADF material include a fullerene, a derivative thereof, an acridine, a derivative thereof, and an eosin derivative. Furthermore, a metal-containing porphyrin, such as a porphyrin containing magnesium (Mg), zinc (Zn), cadmium (Cd), tin (Sn), platinum (Pt), indium (In), or palladium (Pd), can be given. Examples of the metal-containing porphyrin include a protoporphyrin-tin fluoride complex (SnF$_2$(Proto IX)), a mesoporphyrin-tin fluoride complex (SnF$_2$(Meso IX)), a hematoporphyrin-tin fluoride complex (SnF$_2$(Hemato IX)), a coproporphyrin tetramethyl ester-tin fluoride complex (SnF$_2$(Copro III-4Me)), an octaethylporphyrin-tin fluoride complex (SnF$_2$(OEP)), an etioporphyrin-tin fluoride complex (SnF$_2$(Etio I)), and an octaethylporphyrin-platinum chloride complex (PtCl$_2$OEP), which are represented by the following structural formulae.

[Chemical Formulae 2]

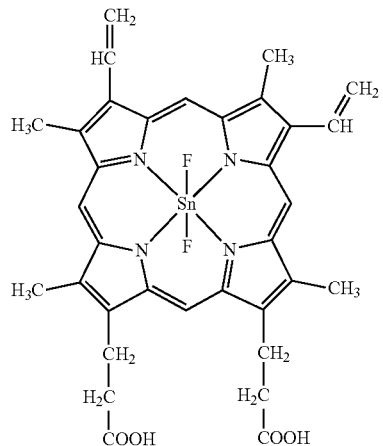

-continued

SnF$_2$(Meso IX)
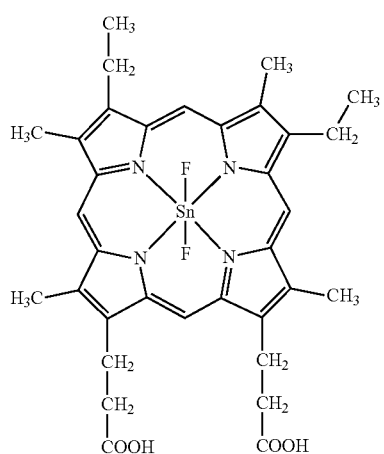

SnF$_2$(Hemato IX)
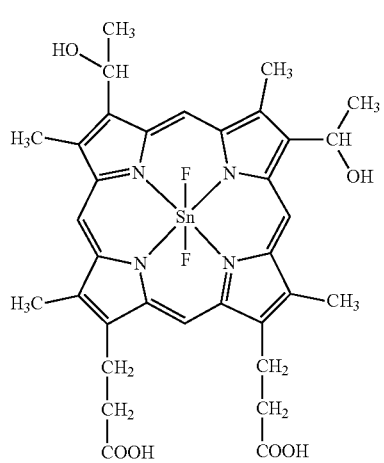

SnF$_2$(Copro III-4Me)
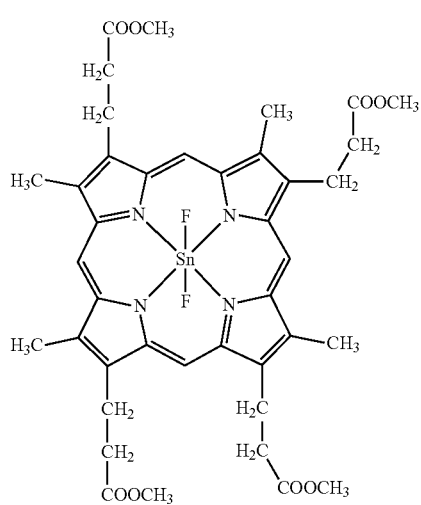

-continued

SnF$_2$(OEP)
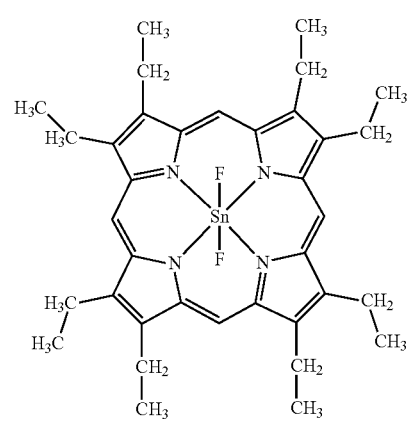

SnF$_2$(Etio 1)
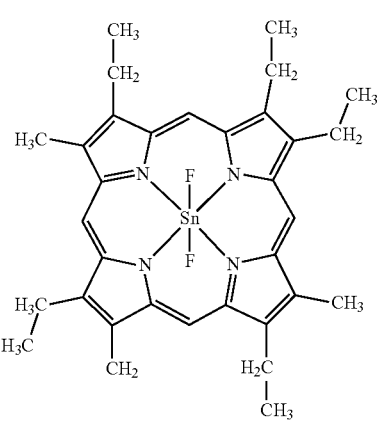

PtCl$_2$OEP
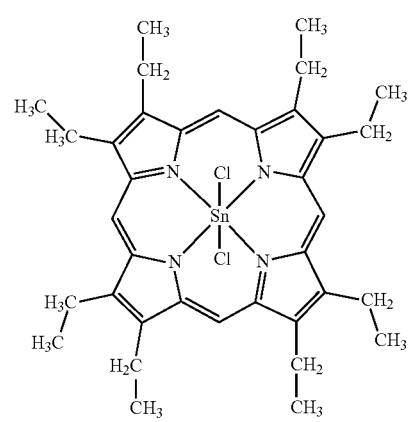

In addition, a heterocyclic compound having one or both of a π-electron rich heteroaromatic ring and a π-electron deficient heteroaromatic ring that is represented by the following structural formulae, such as 2-biphenyl-4-yl)-4,6-bis(12-phenylindolo[2,3-a]carbazol-11-yl)-1,3,5-triazine (abbreviation: PIC-TRZ), 2-{4-[3-(N-phenyl-9H-carbazol-3-yl)-9H-carbazol-9-yl]phenyl}-4,6-diphenyl-1,3,5-triazine (abbreviation: PCCzPTzn), 2-[4-(10H-phenoxazin-10-yl)phenyl]-4,6-diphenyl-1,3,5-triazine (abbreviation: PXZ-TRZ), 3-[4-(5-phenyl-5,10-dihydrophenazin-10-yl)phenyl]-4,5-diphenyl-1,2,4-triazole (abbreviation: PPZ-3TPT), 3-(9,9-dimethyl-9H-acridin-10-yl)-9H-xanthen-9-one (abbreviation: ACRXTN), bis[4-(9,9-dimethyl-9,10-dihydroacridine)phenyl]sulfone (abbreviation: DMAC-DPS), 10-phenyl-10H,10'H-spiro[acridin-9,9'-anthacen]-10'-one (abbreviation: ACRSA), 4-(9'-phenyl-3,3'-bi-9H-carbazol-9-yl)benzofuro[3,2-d]pyrimidine (abbreviation: 4PCCzBfpm), 4-[4-(9'-phenyl-3,3'-bi-9H-carbazol-9-yl)phenyl]benzofuro[3,2-d]pyrimidine (abbreviation: 4PCCzPBfpm), or 9-[3-(4,6-diphenyl-1,3,5-triazin-2-yl)phenyl]-9'-phenyl-2,3'-bi-9H-carbazole (abbreviation: mPCCzPTzn-02) may be used.
[Chemical Formulae 3]
PIC-TRZ
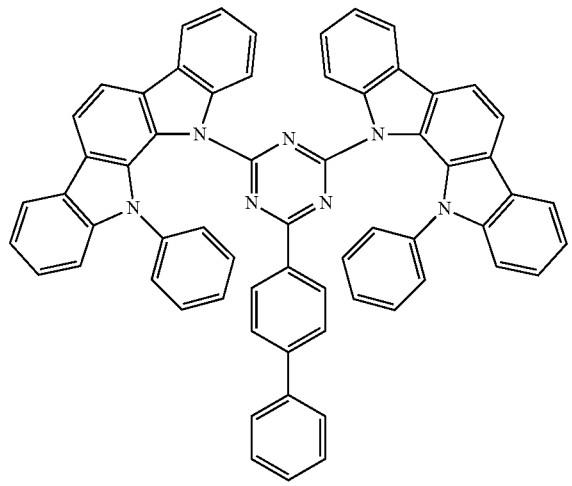
PXZ-TRZ
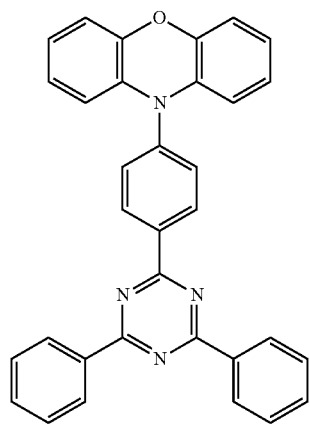
PPZ-3PTPT
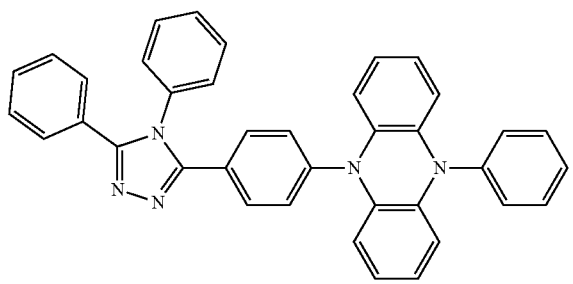
PCCzPTzn
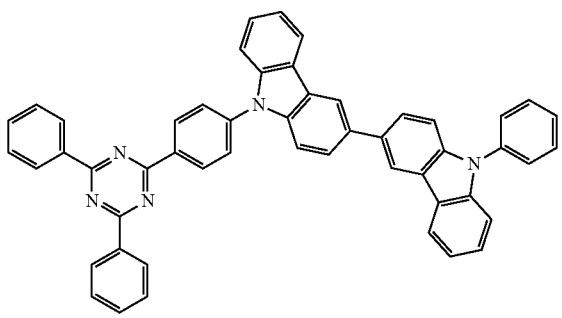
ACRSA
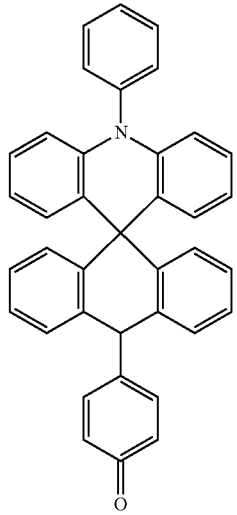
ACRXTN
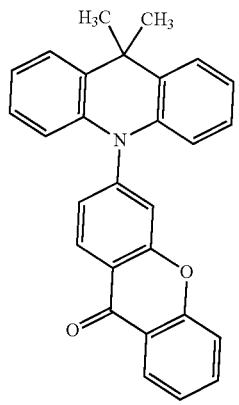
DMAC-DPS
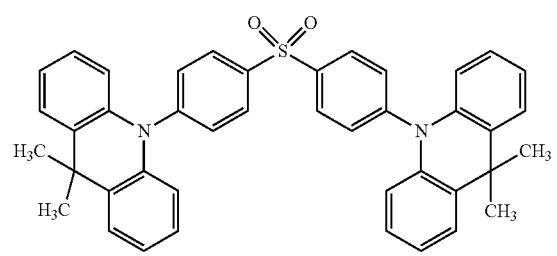

-continued

4PCCzPBfpm

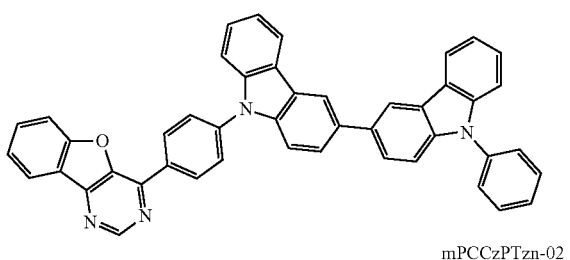

mPCCzPTzn-02

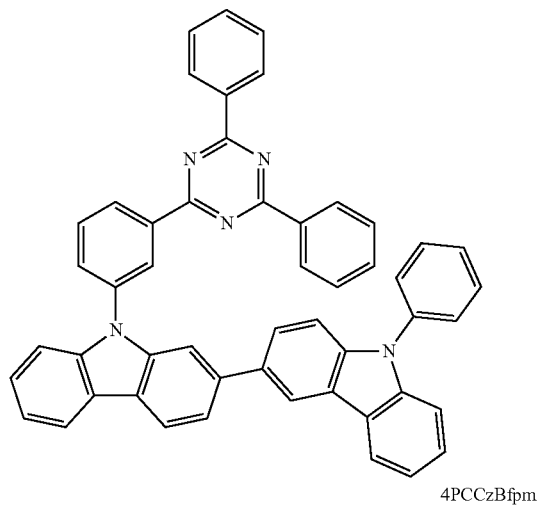

4PCCzBfpm

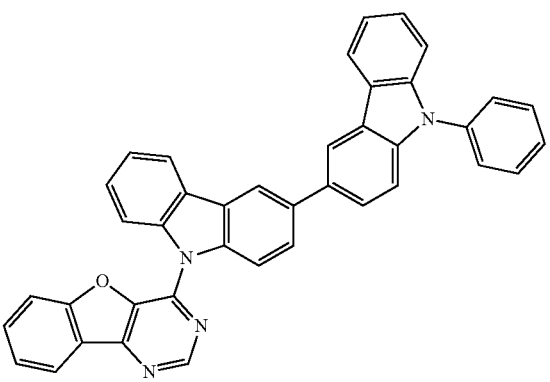

Such a heterocyclic compound is preferred because of having excellent electron-transport and hole-transport properties owing to a π-electron rich heteroaromatic ring and a π-electron deficient heteroaromatic ring. Among skeletons having the π-electron deficient heteroaromatic ring, a pyridine skeleton, a diazine skeleton (a pyrimidine skeleton, a pyrazine skeleton, and a pyridazine skeleton), and a triazine skeleton are preferred because of their high stability and reliability. In particular, a benzofuropyrimidine skeleton, a benzothienopyrimidine skeleton, a benzofuropyrazine skeleton, and a benzothienopyrazine skeleton are preferred because of their high accepting properties and reliability.

Among skeletons having the π-electron rich heteroaromatic ring, an acridine skeleton, a phenoxazine skeleton, a phenothiazine skeleton, a furan skeleton, a thiophene skeleton, and a pyrrole skeleton have high stability and reliability; therefore, at least one of these skeletons is preferably included. As a furan skeleton, a dibenzofuran skeleton is preferable. As a thiophene skeleton, a dibenzothiophene skeleton is preferable. As a pyrrole skeleton, an indole skeleton, a carbazole skeleton, an indolocarbazole skeleton, a bicarbazole skeleton, and a 3-(9-phenyl-9H-carbazol-3-yl)-9H-carbazole skeleton are particularly preferable.

Note that a substance in which the π-electron rich heteroaromatic ring is directly bonded to the π-electron deficient heteroaromatic ring is particularly preferred because the electron-donating property of the π-electron rich heteroaromatic ring and the electron-accepting property of the π-electron deficient heteroaromatic ring are both improved, the energy difference between the S1 level and the T1 level becomes small, and thus thermally activated delayed fluorescence can be obtained with high efficiency. Note that an aromatic ring to which an electron-withdrawing group such as a cyano group is bonded may be used instead of the π-electron deficient heteroaromatic ring. As a π-electron rich skeleton, an aromatic amine skeleton, a phenazine skeleton, or the like can be used. As a π-electron deficient skeleton, a xanthene skeleton, a thioxanthene dioxide skeleton, an oxadiazole skeleton, a triazole skeleton, an imidazole skeleton, an anthraquinone skeleton, a skeleton containing boron such as phenylborane or boranthrene, an aromatic ring or a heteroaromatic ring having a cyano group or a nitrile group such as benzonitrile or cyanobenzene, a carbonyl skeleton such as benzophenone, a phosphine oxide skeleton, a sulfone skeleton, or the like can be used.

As described above, π-electron deficient skeleton and a π-electron rich skeleton can be used instead of at least one of the π-electron deficient heteroaromatic ring and the π-electron rich heteroaromatic ring.

Note that a TADF material is a material having a small difference between the S1 level and the T1 level and a function of converting triplet excitation energy into singlet excitation energy by reverse intersystem crossing. Thus, a TADF material can upconvert triplet excitation energy into singlet excitation energy (i.e., reverse intersystem crossing) using a small amount of thermal energy and efficiently generate a singlet excited state. In addition, the triplet excitation energy can be converted into luminescence.

An exciplex whose excited state is formed of two kinds of substances has an extremely small difference between the S1 level and the T1 level and functions as a TADF material capable of converting triplet excitation energy into singlet excitation energy.

A phosphorescence spectrum observed at a low temperature (e.g., 77 K to 10 K) is used for an index of the T1 level in this case. When the level of energy with a wavelength of the line obtained by extrapolating a tangent to the fluorescent spectrum at a tail on the short wavelength side is the S1 level and the level of energy with a wavelength of the line obtained by extrapolating a tangent to the phosphorescence spectrum at a tail on the short wavelength side is the T1 level, the difference between the S1 level and the T1 level of the TADF material is preferably smaller than or equal to 0.3 eV, further preferably smaller than or equal to 0.2 eV.

When the TADF material is used as the guest material in the light-emitting layer 113, the S1 level and the T1 level of the host material are preferably higher than the S1 level and the T1 level of the TADF material, respectively.

As the host material of the light-emitting layer 113, any of the following hole-transport materials or electron-transport material can be used as needed. In one embodiment of the present invention, the light-emitting layer 113 is preferably formed using an organic compound having a specific naphthofuropyrazine skeleton (a naphtho[2',1':4,5]furo[2,3-]pyrazine skeleton) as the host material, and the light-emitting substance whose T1 level is lower than or equal to 2.5 eV or the organometallic complex which has a diazine skeleton (e.g., a pyrazine skeleton or a pyrimidine skeleton)) and whose T1 level is lower than or equal to 2.5 eV. Among naphthofuropyrazine skeletons, a naphtho[2',1':4,5]furo[2,3-b]pyrazine skeleton in particular has a high T1 level of 2.5 eV or more, which allows the T1 excitation energy to be transferred to the light-emitting substance whose T1 level is lower than or equal to 2.5 eV without deactivation. In addition, among naphthofuropyrazine skeletons, a naphtho[2',1':4,5]furo[2,3-b]pyrazine skeleton in particular has a phosphorescent spectrum that considerably overlaps with an MLCT absorption band of the organometallic complex having a diazine skeleton (e.g., a pyrazine skeleton or a pyrimidine skeleton). This optimizes the energy transfer efficiency and enables stable excitation of such a complex, whereby the light-emitting device can have improved durability and high reliability.

An organic compound represented below by a general formula (G1) can be used as the above organic compound having a naphthofuropyrazine skeleton (a naphtho[2',1':4,5]furo[2,3-b]pyrazine skeleton).

[Chemical Formula 4]

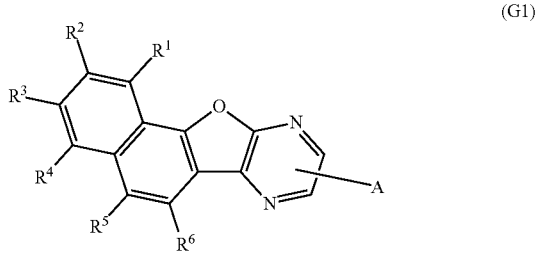

(G1)

In the formula, Q represents oxygen or sulfur. A represents a group with a molecular weight lower than or equal to 1000, and $R^1$ to $R^6$ independently represent any one of hydrogen, a substituted or unsubstituted alkyl group having 1 to 6 carbon atoms, a substituted or unsubstituted cycloalkyl group having 3 to 7 carbon atoms, and a substituted or unsubstituted aryl group having 6 to 30 carbon atoms.

Specific examples of the alkyl group having 1 to 6 carbon atoms in the above general formula (G1) are a methyl group, an ethyl group, a propyl group, an isopropyl group, a butyl group, a se-butyl group, an isobutyl group, a tert-butyl group, a pentyl group, an isopentyl group, a sec-pentyl group, a tert-pentyl group, a neopentyl group, a hexyl group, an isohexyl group, a 3-methylpentyl group, a 2-methylpentyl group, a 2-ethylbutyl group, a 1,2-dimethylbutyl group, a 2,3-dimethylbutyl group, an n-heptyl group, and the like.

Specific examples of the cycloalkyl group having 3 to 7 carbon atoms in the above general formula (G1) are a cyclopropyl group, a cyclobutyl group, a cyclopentyl group, a cyclohexyl group, a 1-methylcyclohexyl group, a 2,6-dimethylcyclohexyl group, a cycloheptyl group, a cyclooctyl group, and the like.

Specific examples of the aryl group having 6 to 30 carbon atoms in the above general formula (G1) are a phenyl group, an o-tolyl group, an m-tolyl group, a p-tolyl group, a mesityl group, an o-biphenyl group, an m-biphenyl group, a p-biphenyl group, a 1-naphthyl group, a 2-naphthyl group, a fluorenyl group, a 9,9-dimethylfluorenyl group, a spirofluorenyl group, a phenanthrenyl group, an anthracenyl group, a fluoranthenyl group, and the like.

The organic compound having the above structure (the naphthofuropyrazine skeleton (naphtho[2',1':4,5]furo[2,3-b]pyrazine skeleton) is used as the host material and an organometallic complex having a diazine skeleton (e.g., a pyrazine skeleton or a pyrimidine skeleton)) whose T1 level is lower than or equal to 2.5 eV is used as the light-emitting substance in the light-emitting layer 113. The difference between the T1 level of the organic compound as the host material and the T1 level of the light-emitting substance (guest material) is preferably greater than or equal to 0.2 eV and less than or equal to 0.4 eV. Among naphthofuropyrazine skeletons, a naphtho[2',1':4,5]furo[2,3-b]pyrazine skeleton in particular has a high T1 level of 2.5 eV or more, which allows the T1 excitation energy to be transferred to the light-emitting substance whose T1 level is lower than or equal to 2.5 eV without deactivation. In addition, among naphthofuropyrazine skeletons, a naphtho[2',1':4,5]furo[2,3-b]pyrazine skeleton in particular has a phosphorescent spectrum that considerably overlaps with an MLCT absorption band of the organometallic complex having a diazine skeleton (e.g., a pyrazine skeleton or a pyrimidine skeleton). This optimizes the energy transfer efficiency and enables stable excitation of such a complex, whereby the light-emitting device can have improved durability and high reliability. Such a complex can be more stably excited and the light-emitting device can have improved durability when the difference between the T1 level of the organic compound as the host material and the T1 level of the light-emitting substance (guest material) is within an appropriate range, i.e., greater than or equal to 0.2 eV and less than or equal to 0.4 eV in the light-emitting layer 113 including the organometallic complex having a diazine skeleton (e.g., a pyrazine skeleton or a pyrimidine skeleton) as the light-emitting substance.

Specific examples of the organic compound represented by the above general formula (G1) are shown by the following structural formulae (100) to (123).

[Chemical Formulae 5]

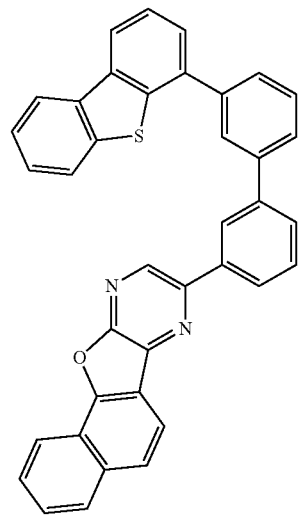

(100)

(101)
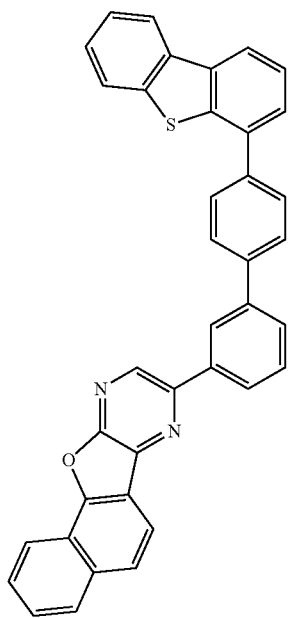
(102)
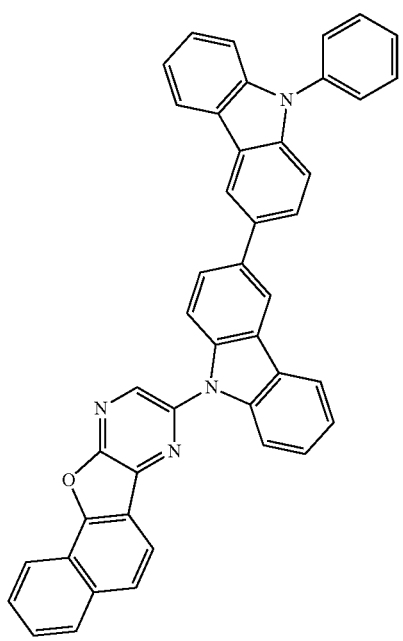
(103)
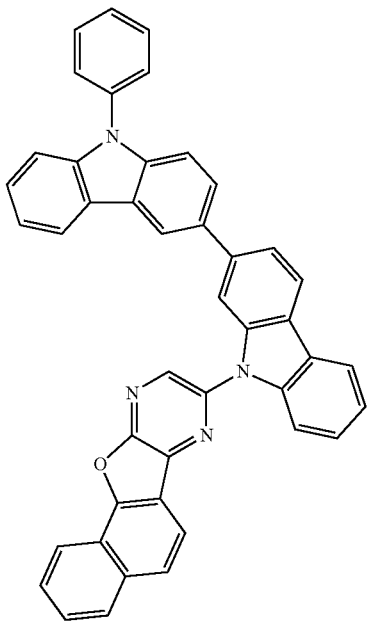
(104)
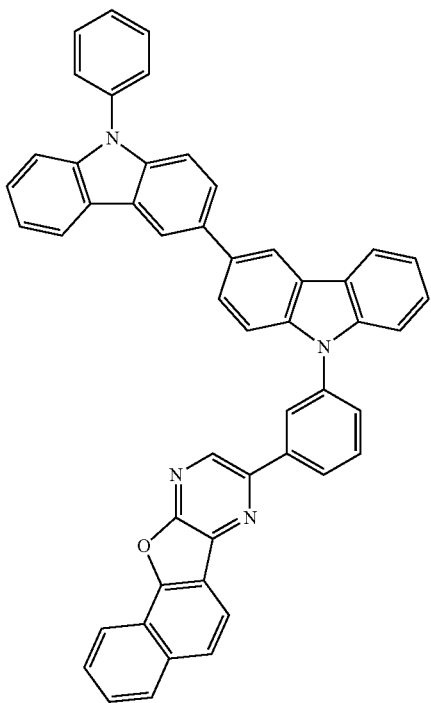

(105)
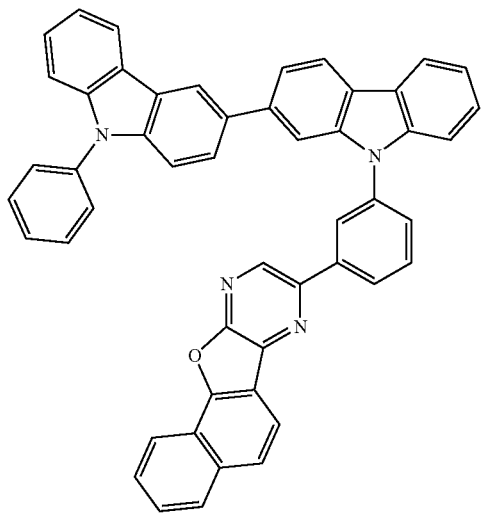
(106)
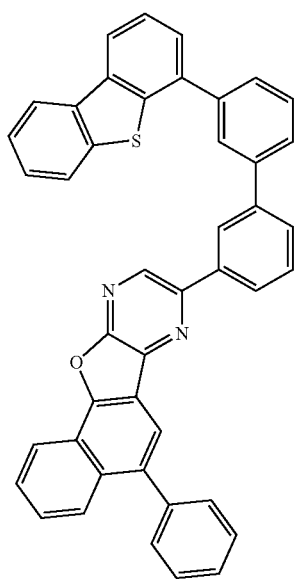
(107)
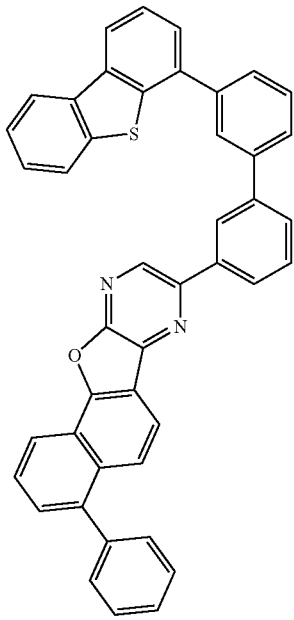
(108)
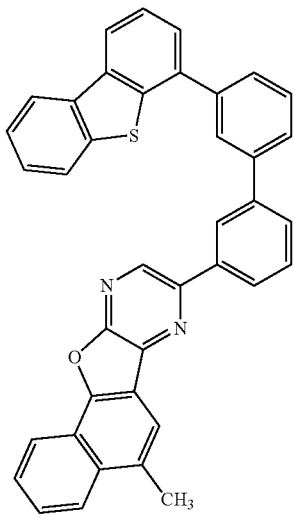

(109)
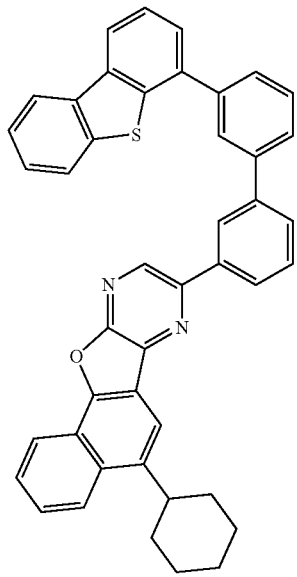
[Chemical Formulae 6]
(110)
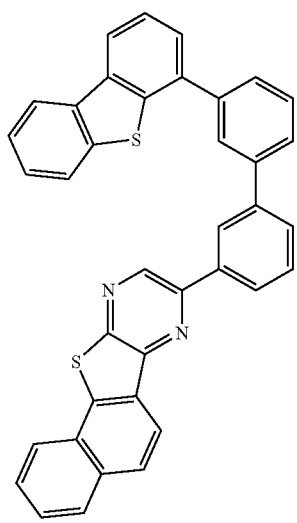
(111)
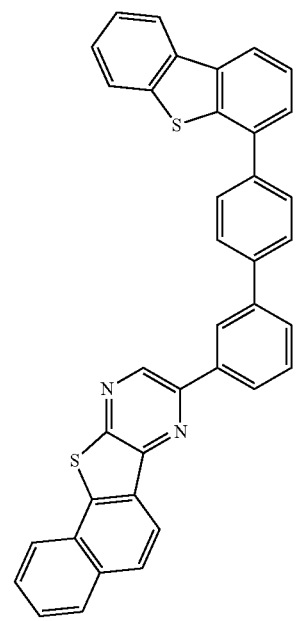
(112)
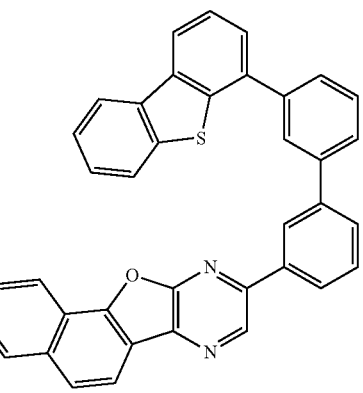
(113)
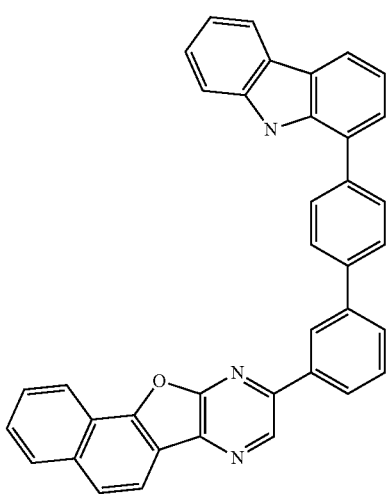

(114)
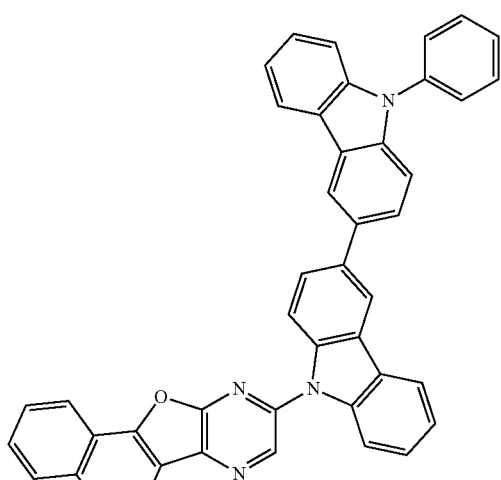
(115)
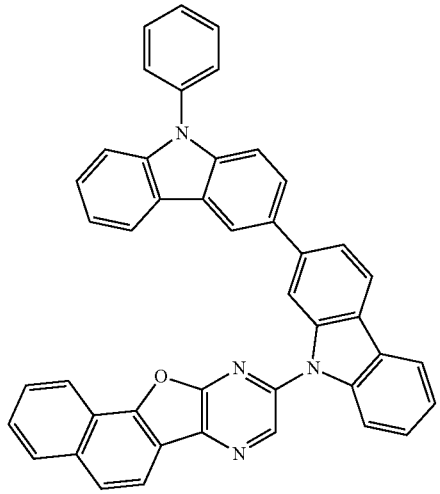
(116)
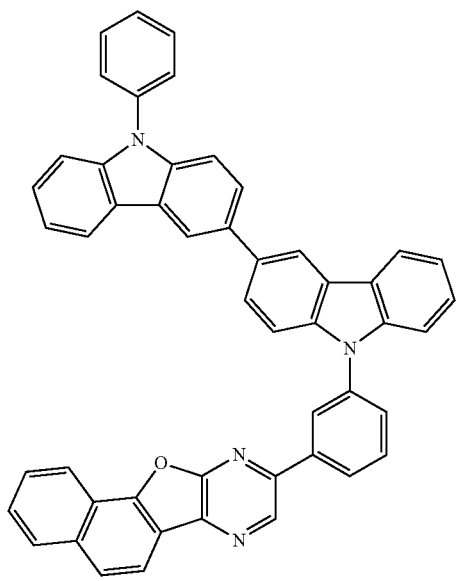
(117)
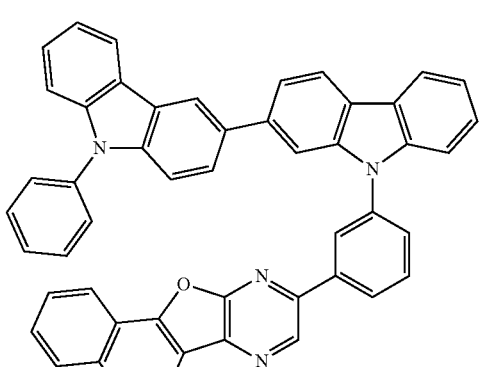
(118)
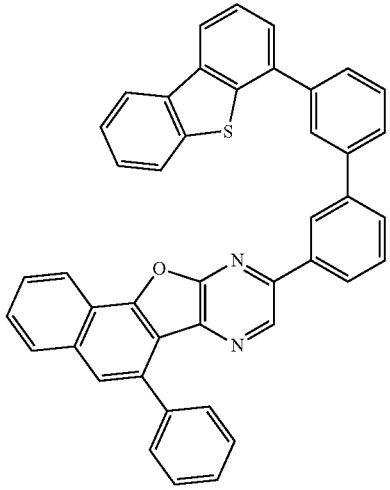
(119)
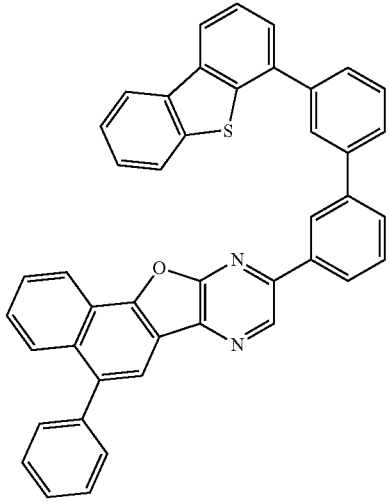

[Chemical Formulae 7]

(120)
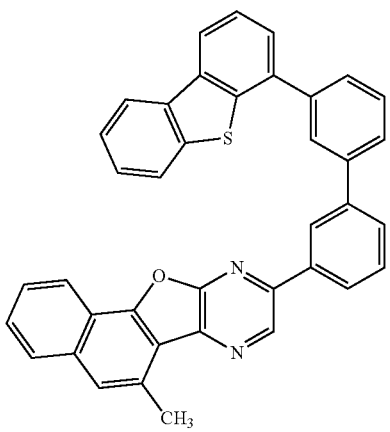

(121)
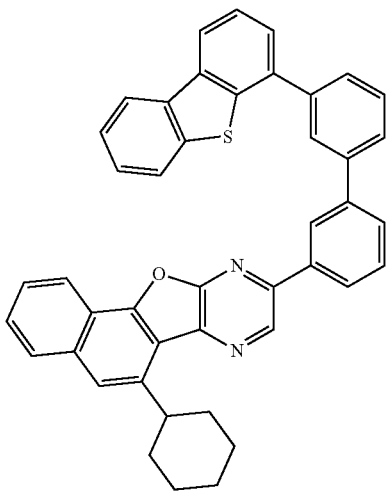

(122)
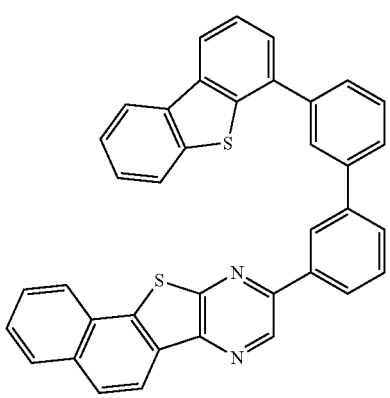

(123)
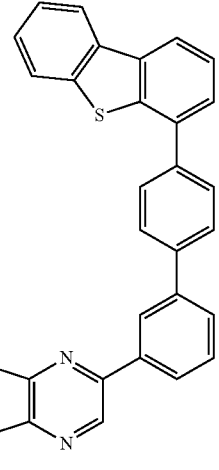

As other hole-transport materials that can be used as the host material in the light-emitting layer 113, it is preferable to use a substance having a hole mobility higher than or equal to $1\times10^{-6}$ cm$^2$/Vs in the case where the square root of the electric field strength [V/cm] is 600. Examples of the substance are shown below.

Examples of the substance include compounds having an aromatic amine skeleton such as 4,4'-bis[N-(1-naphthyl)-N-phenylamino]biphenyl (abbreviation: NPB), NV-bis(3-methylphenyl)-N,N'-diphenyl-[1,1'-biphenyl]-4,4'-diamine (abbreviation: TPD), 4,4'-bis[N-(spiro-9,9'-bifluoren-2-yl)-N-phenylamino]biphenyl (abbreviation: BSPB), 4-phenyl-4'-(9-phenylfluoren-9-yl)triphenylamine (abbreviation: BPAFLP), 4-phenyl-3'-(9-phenylfluoren-9-yl)triphenylamine (abbreviation: mBPAFLP), 4-phenyl-4'-(9-phenyl-9H-carbazol-3-yl)triphenylamine (abbreviation: PCBA1BP), 4,4'-diphenyl-4"-(9-phenyl-9H-carbazol-3-yl)triphenylamine (abbreviation: PCBBi1BP), 4-(1-naphthyl)-4'-(9-phenyl-9H-carbazol-3-yl)triphenylamine (abbreviation: PCBANB), 4,4'-di(1-naphthyl)-4"-(9-phenyl-9H-carbazol-3-yl)triphenylamine (abbreviation: PCBNBB), 9,9-dimethyl-N-phenyl-N-[4-(9-phenyl-9H-carbazol-3-yl)phenyl]fluoren-2-amine (abbreviation: PCBAF), and N-phenyl-N-[4-(9-phenyl-9H-carbazol-3-yl)phenyl]spiro-9,9'-bifluoren-2-amine (abbreviation: PCBASF); compounds having a carbazole skeleton such as 1,3-bis(N-carbazolyl)benzene (abbreviation: mCP), 4,4'-di(N-carbazolyl)biphenyl (abbreviation: CBP), 3,6-bis(3,5-diphenylphenyl)-9-phenylcarbazole (abbreviation: CzTP), and 3,3'-bis(9-phenyl-9H-carbazole) (abbreviation: PCCP); compounds having a thiophene skeleton such as 4,4',4"-(benzene-1,3,5-triyl)tri(dibenzothiophene) (abbreviation: DBT3P-II), 2,8-diphenyl-4-[4-(9-phenyl-9H-fluoren-9-yl)phenyl]dibenzothiophene (abbreviation: DBTFLP-II), and 4-[4-(9-phenyl-9H-fluoren-9-yl)phenyl]-6-phenyldibenzothiophene (abbreviation: DBTFLP-IV); and compounds having a furan skeleton such as 4,4',4"-(benzene-1,3,5-triyl)tri(dibenzofuran) (abbreviation: DBF3P-II) and 4-{3-[3-(9-phenyl-9H-fluoren-9-yl)phenyl]phenyl}dibenzofuran (abbreviation: mmDBFFLBi-UI). Among the above materials, the compound having an aromatic amine skeleton and the compound having a carbazole skeleton are preferred because these compounds are highly reliable and have high bole-transport properties to contribute to a reduction in driving voltage. In addition, the organic compounds given as examples of the above second organic compound can also be used.

As the electron-transport material, it is preferable to use a substance having an electron mobility higher than or equal to $1\times10^{-6}$ cm$^2$/Vs in the case where the square root of the electric field strength [V/cm] is 600. Note that any of these electron-transport materials given below can also be used for the electron-transport layer 114 described later.

Specific examples of the electron-transport material include metal complexes such as bis(10-hydroxybenzo[h]quinolinato)beryllium(II) (abbreviation: BeBq$_2$), tris(8-quinolinolato)aluminum(III) (abbreviation: Alq$_3$), tris(4-methyl-8-quinolinolato)aluminum (abbreviation: Almq$_3$), bis(2-methyl-8-quinolinolato)(4-phenylphenolato)aluminum(III) (abbreviation: BAlq), bis(8-quinolinolato)zinc(II) (abbreviation: Znq), bis[2-(2-benzoxazolyl)phenolato]zinc(II)(abbreviation: ZnPBO), and bis[2-(2-benzothiazolyl)phenolato]zinc(II) (abbreviation: ZnBTZ).

Other specific examples of the electron-transport material include heterocyclic compounds having a polyazole skeleton, such as 2-(4-biphenylyl)-5-(4-tert-butylphenyl)-1,3,4-oxadiazole (abbreviation: PBD), 3-(4-biphenylyl)-4-phenyl-5-(4-tert-butylphenyl)-1,2,4-triazole (abbreviation: TAZ), 1,3-bis[5-(p-tert-butylphenyl)-1,3,4-oxadiazol-2-yl]benzene (abbreviation: OXD-7), 9-[4-(5-phenyl-1,3,4-oxadiazol-2-yl)phenyl]-9H-carbazole (abbreviation: CO11), 2,2',2"-(1,3,5-benzenetriyl)tris(1-phenyl-1H-benzimidazole)(abbreviation: TPBI), and 2-[3-(dibenzothiophen-4-yl)phenyl]-1-phenyl-1H-benzimidazole (abbreviation: mDBTBIm-II).

Other specific examples of the electron-transport material are heterocyclic compounds having a diazine skeleton. The diazine skeleton includes, for example: dibenzoquinoxaline derivatives such as 2-[3-(dibenzothiophen-4-yl)phenyl]dibenzo[f,h]quinoxaline (abbreviation: 2mDBTPDBq-II), 2-[3'-(dibenzothiophen-4-yl)biphenyl-3-yl]dibenzo[f,h]quinoxaline (abbreviation: 2mDBTBPDBq-II), and 2-[3'-(9H-carbazol-9-yl)biphenyl-3-yl]dibenzo[f,h]quinoxaline (abbreviation: 2mCzBPDBq); pyrimidine derivatives such as 4,6-bis[3-(phenanthren-9-yl)phenyl]pyrimidine (abbreviation: 4,6mPnP2Pm), 4,6-bis[3-(4-dibenzothienyl)phenyl]pyrimidine (abbreviation: 4,6mDBTP2Pm-II), 4-[3-(dibenzothiophen-4-yl)phenyl]-8-(naphthalen-2-yl)-[1]benzofuro[3,2-d]pyrimidine (abbreviation: 8βN-4mDBtPBfpm), 4,8-bis[3-(dibenzothiophen-4-yl)phenyl]-[1]benzofuro[3,2-d]pyrimidine (abbreviation: 4,8mDBtP2Bfpm), 8-[3'-(dibenzothiophen-4-yl)(1,1'-biphenyl-3-yl)]naphtho[1,2':4,5]furo[3,2-d]pyrimidine (abbreviation: 8mDBtBPNfpm), and 8-[(2,2'-binaphthalen)-6-yl]-4-[3-(dibenzothiophen-4-yl)phenyl-1]benzofuro[3,2-d]pyrimidine (abbreviation: 8(βN2)-4mDBtPBfpm); and pyrazine derivatives such as 3,8-bis[3-(dibenzothiophen-4-yl)phenyl]benzofuro[2,3-b]pyrazine (abbreviation: 3,8mDBtP2Bfpr), 9-[(3'-dibenzothiophen-4-yl)biphenyl-3-yl]naphtho[1',2':4,5]furo[2,3-b]pyrazine (abbreviation: 9mDBtBPNfpr), 8-[(3'-dibenzothiophen-4-yl)biphenyl-3-yl]naphtho[2',1':4,5]furo[2,3-b]pyrazine (abbreviation: 8mDBtBPNfpr(II)), and 12-[(3-dibenzothiophen-4-yl)biphenyl-3-yl]phenanthro[9',10':4,5]furo[2,3-b]pyrazine (abbreviation: 12mDBtBPPnfpr).

Other specific examples of the electron-transport material include heterocyclic compounds having a pyridine skeleton, such as 3,5-bis[3-(9H-carbazol-9-yl)phenyl]pyridine (abbreviation: 35DCzPPy) and 1,3,5-tri[3-(3-pyridyl)phenyl]benzene (abbreviation: TmPyPB).

Among the above materials, the heterocyclic compound having a diazine skeleton and the heterocyclic compound having a pyridine skeleton have high reliability and thus are preferable. In particular, the heterocyclic compound having a diazine (pyrimidine or pyrazine) skeleton has a high electron-transport property to contribute to a reduction in driving voltage.

As the host material in the light-emitting layer 113, the above-described TADF material can also be used. When the TADF material is used as the host material, triplet excitation energy generated in the TADF material is converted into singlet excitation energy by reverse intersystem crossing and transferred to the emission center substance, whereby the emission efficiency of the light-emitting device can be increased. Here, the TADF material functions as an energy donor, and the emission center substance functions as an energy acceptor. Therefore, the use of the TADF material as the host material is effective in the case where a fluorescent substance is used as the guest material. In that case, it is preferable that the S1 level of the TADF material be higher than the S1 level of the fluorescent substance in order that high emission efficiency be achieved. Furthermore, the T1 level of the TADF material is preferably higher than the S1 level of the fluorescent substance. Therefore, the T1 level of the TADF material is preferably higher than the T1 level of the fluorescent substance.

Besides the above organic compounds, other examples of the organic compound that can be used for the light-emitting layer 113 are given below (some of the following organic compounds overlap with the above) in terms of favorable compatibility with a light-emitting substance (a fluorescent substance or a phosphorescent substance).

In the case where the light-emitting substance is a fluorescent substance, examples of an organic compound that is preferably used in combination with the fluorescent substance include condensed polycyclic aromatic compounds such as an anthracene derivative, a tetracene derivative, a phenanthrene derivative, a pyrene derivative, a chrysene derivative, and a dibenzo[g,p]chrysene derivative.

Specific examples of the organic compound that is preferably used in combination with the fluorescent substance include 9-phenyl-3-[4-(10-phenyl-9-anthryl)phenyl]-9H-carbazole (abbreviation: PCzPA), 3,6-diphenyl-9-[4-(10-phenyl-9-anthryl)phenyl]-9H-carbazole (abbreviation: DPCzPA), 3-[4-(1-naphthyl)-phenyl]-9-phenyl-9H-carbazole (abbreviation: PCPN), 9,10-diphenylanthracene (abbreviation: DPAnth), N,N-diphenyl-9-[4-(10-phenyl-9-anthryl)phenyl]-9H-carbazol-3-amine (abbreviation: CzAIPA), 4-(10-phenyl-9-anthryl)triphenylamine (abbreviation: DPhPA), YGAPA, PCAPA, N,9-diphenyl-N-{4-[4-(10-phenyl-9-anthryl)phenyl]phenyl}-9H-carbazol-3-amine (abbreviation: PCAPBA), N-(9,10-diphenyl-2-anthryl)-N,9-diphenyl-9H-carbazol-3-amine (abbreviation: 2PCAPA), 6,12-dimethoxy-5,11-diphenychrysene, N,N,N',N',N",N",N"',N"'-octaphenyldibenzo[g,p]chrysene-2,7,10,15-tetramine (abbreviation: DBC1), 9-[4-(10-phenyl-9-anthracenyl)phenyl]-9H-carbazole (abbreviation: CzPA), 7-[4-(10-phenyl-9-anthryl)phenyl]-7H-dibenzo[c,g]carbazole (abbreviation: cgDBCzPA), 6-[(3-(9,10-diphenyl-2-anthryl)phenyl]-benzo[b]naphtho[1,2-d]furan (abbreviation: 2mBnfPPA), 9-phenyl-10-{4-(9-phenyl-9H-fluoren-9-yl)-biphenyl-4'-yl}-anthracene (abbreviation: FLPPA), 9,10-bis(3,5-diphenylphenyl)anthracene (abbreviation: DPPA), 9,10-di(2-naphthyl)anthracene (abbreviation: DNA), 2-tert-butyl-9,10-di(2-naphthyl)anthracene (abbreviation: t-BuDNA), 9,9'-bianthryl (abbreviation: BANT), 9,9'-(stilbene-3,3'-diyl)diphenanthrene (abbreviation: DPNS), 9,9'-(stilbene-4,4'-diyl)diphenanthrene (abbreviation: DPNS2), 1,3,5-tri(1-pyrenyl)benzene (abbreviation: TPB3), 5,12-diphenyltetracene, and 5,12-bis(biphenyl-2-yl)tetracene.

In the case where the light-emitting substance is a phosphorescent substance, an organic compound having triplet excitation energy (an energy difference between a ground state and a triplet excited state) which is higher than that of the light-emitting substance is preferably selected as an organic compound that is used in combination with the phosphorescent substance. Note that when a plurality of organic compounds (e.g., a first host material and a second host material (or a host material and an assist material)) are used in combination with a light-emitting substance so that an exciplex is formed, the plurality of organic compounds are preferably mixed with a phosphorescent substance.

With such a structure, light emission can be efficiently obtained by exciplex-triplet energy transfer (ExTET), which is energy transfer from an exciplex to a light-emitting substance. Note that a combination of the plurality of organic compounds that easily forms an exciplex is preferably employed, and it is particularly preferable to combine a compound that easily accepts holes (hole-transport material) and a compound that easily accepts electrons (electron-transport material).

In the case where the light-emitting substance is a phosphorescent substance, examples of an organic compound (a host material or an assist material) that is preferably used in combination with the phosphorescent substance include an aromatic amine, a carbazole derivative, a dibenzothiophene derivative, a dibenzofuran derivative, a zinc- or aluminum-based metal complex, an oxadiazole derivative, a triazole derivative, a benzimidazole derivative, a quinoxaline derivative, a dibenzoquinoxaline derivative, a pyrimidine derivative, a pyrazine derivative, a triazine derivative, a pyridine derivative, a bipyridine derivative, and a phenanthroline derivative.

Specific examples thereof include 2-(4-biphenylyl)-5-(4-tert-butylphenyl)-1,3,4-oxadiazole (abbreviation: PBD), 1,3-bis[5-(p-tert-butylphenyl)-1,3,4-oxadiazol-2-yl]benzene (abbreviation: OXD-7), 9-[4-(5-phenyl-1,3,4-oxadiazol-2-yl)phenyl]-9H-carbazole (abbreviation: CO11), triazole derivatives such as 3-(4-biphenylyl)-4-phenyl-5-(4-tert-butylphenyl)-1,2,4-triazole (abbreviation: TAZ) and 3-(4-tert-butylphenyl)-4-(4-ethylphenyl)-5-(4-biphenylyl)-1,2,4-triazole (abbreviation: p-EtTAZ), 2,2',2''-(1,3,5-benzenetriyl)tris(1-phenyl-1H-benzimidazole) (abbreviation: TPBI), 2-[3-(dibenzothiophen-4-yl)phenyl]-1-phenyl-1H-benzimidazole (abbreviation: mDBTBIm-II), 4,4'-bis(5-methylbenzoxazol-2-yl)stilbene (abbreviation: BzOS), bathophenanthroline (abbreviation: Bphen), bathocuproine (abbreviation: BCP), 2,9-bis(naphthalen-2-yl)-4,7-diphenyl-1,10-phenanthroline (abbreviation: NBphen), and quinoxaline derivatives and dibenzoquinoxaline derivatives, such as 2-[3-(dibenzothiophen-4-yl)phenyl]dibenzo[h]quinoxaline (abbreviation: 2mDBTPDBq-II), 2-[3'-(dibenzothiophen-4-yl)biphenyl-3-yl]dibenzo[f,h]quinoxaline (abbreviation: 2mDBTBPDBq-II), 2-[3'-(9H-carbazol-9-yl)biphenyl-3-yl]dibenzo[f,h]quinoxaline (abbreviation: 2mCzBPDBq), 2-[4-(3,6-diphenyl-9H-carbazol-9-yl)phenyl]dibenzo[f,h]quinoxaline (abbreviation: 2CzPDBq-III), 7-[3-(dibenzothiophen-4-yl)phenyl]dibenzo[f,h]quinoxaline (abbreviation: 7mDBTPDBq-II), and 6-[3-(dibenzothiophen-4-yl)phenyl]dibenzo[f,h]quinoxaline (abbreviation: 6mDBTPDBq-II).

Other examples include pyrimidine derivatives such as 4,6-bis[3-(phenanthren-9-yl)phenyl]pyrimidine (abbreviation: 4,6mPnP2Pm), 4,6-bis[3-(4-dibenzothienyl)phenyl]pyrimidine (abbreviation: 4,6mDBTP2Pm-II), and 4,6-bis[3-(9H-carbazol-9-yl)phenyl]pyrimidine (abbreviation: 4,6mCzP2Pm), triazine derivatives such as 2-{4-[3-(N-phenyl-9N-carbazol-3-yl)-9H-carbazol-9-yl]phenyl}-4,6-diphenyl-1,3,5-triazine (abbreviation: PCCzPTzn) and 9-[3-(4,6-diphenyl-1,3,5-triazin-2-yl)phenyl]-9'-phenyl-2,3'-bi-9H-carbazole (abbreviation: mPCCzPTzn-02), and pyridine derivatives such as 3,5-bis[3-(9H-carbazol-9-yl)phenyl]pyridine (abbreviation: 35DCzPPy) and 1,3,5-tri[3-(3-pyridyl)phenyl]benzene (abbreviation: TmPyPB).

Further alternatively, a high-molecular compound such as poly(2,5-pyridinediyl) (abbreviation: PPy), poly[(9,9-dihexylfluorene-2,7-diyl)-co-(pyridine-3,5-diyl)](abbreviation: PF-Py), or poly[(9,9-dioctylfluorene-2,7-diyl)-co-(2,2'-bipyridine-6,6'-diyl)](abbreviation: PF-BPy) can be used.

Any of the above materials may be used in combination with a low-molecular material or a high-molecular material. For film formation, a known method (a vacuum evaporation method, a coating method, a printing method, or the like) can be used as appropriate.

<Electron-Transport Layer>

The electron-transport layer 114 transports electrons injected from the second electrode 102 to the light-emitting layer 113. Note that the electron-injection layer 115 described later may be provided between the electron-transport layer 114 and the second electrode 102. The electron-transport layer 114 includes an electron-transport material. The electron-transport layer 114 may include any of metals, metal salts, metal oxides, and metal complexes in addition to an electron-transport material. In particular, a metal complex including an alkali metal or an alkaline earth metal is preferably used. Any of such metals, metal salts, metal oxides, and metal complexes is included in any region of the electron-transport layer 114 or is included in any layer in the case where the electron-transport layer 114 has a stacked layer structure, for example. The LUMO level of the electron-transport material in the electron-transport layer 114 in contact with the light-emitting layer 113 (or a layer in contact with the light-emitting layer in the stacked layer structure) is deeper (lower) than the LUMO level of the host material used in the light-emitting layer 113. The difference between the LUMO level of the electron-transport material and the LUMO level of the host material is preferably greater than or equal to 0.15 eV and less than or equal to 0.40 eV or greater than or equal to 0.20 eV and less than or equal to 0.40 eV, further preferably greater than or equal to 0.20 eV and less than or equal to 035 eV.

As the electron-transport material used for the electron-transport layer 114, the electron-transport material with a HOMO level higher than or equal to −6.0 eV is preferred. The electron mobility of the electron-transport material with a HOMO level higher than or equal to −6.0 eV is preferably higher than or equal to $1\times10^{-7}$ cm/Vs and lower than or equal to $1\times10^{-5}$ cm$^2$, further preferably higher than or equal to $1\times10^{-7}$ cm$^2$/Vs and lower than or equal to $5\times10^{-5}$ cm$^2$ in the case where the square root of the electric field strength [V/cm] is 600. Note that the electron-transport material with a HOMO level higher than or equal to −6.0 eV preferably has an anthracene skeleton, further preferably has an anthracene skeleton and a heterocyclic skeleton.

Examples of an organic compound used for the electron-transport layer 114 include materials having a high electron-transport property (electron-transport materials), such as an organic compound having a structure where an aromatic ring is fused to a furan ring of a furodiazine skeleton, a metal complex having a quinoline skeleton, a metal complex having a benzoquinoline skeleton, a metal complex having an oxazole skeleton, a metal complex having a thiazole skeleton, an oxadiazole derivative, a triazole derivative, an imidazole derivative, an oxazole derivative, a thiazole derivative, a phenanthroline derivative, a quinoline derivative having a quinoline ligand, a benzoquinoline derivative, a quinoxaline derivative, a dibenzoquinoxaline derivative, a pyridine derivative, a bipyridine derivative, a pyrimidine derivative, and a π-electron deficient heteroaromatic compound (e.g., a nitrogen-containing heteroaromatic compound). Specifically, some of the above-described electron-transport materials that can be used as the host material in the light-emitting layer 113, or the materials given above as materials that can be used as the host material in combination with the above-described fluorescent substance can be used. Note that other substances may be used as long as the substances have an electron-transport property higher than a hole-transport property. The electron-transport layers 114, 114a, and 114b each function even with a single-layer structure; however, when the electron-transport layer 114 has a stacked layer structure including two or more layers as needed, the device characteristics can be improved.

Any of the substances given below may be used as the metals, metal salts, metal oxides, and metal complexes that can be used for the electron-transport layer 114.

Examples of the metals are alkali metals, alkaline earth metals, and rare earth metals. Specific examples are Li, Na, K, Rb, Cs, Mg, Ca, Sr, Ba, and the like.

Examples of the metal salts are halides and carbonates of the above metals. Specific examples are LiF, NaF, KF, RbF CsF, $MgF_2$, $CaF_2$, $SrF_2$, $BaF_2$, LiCl, NaCl, KCl, RbCl, CsCl, $MgCl_2$, $CaCl_2$, $SrCl_2$, $BaCl_2$, $Li_2CO_3$, $Cs_2CO_3$, and the like.

Examples of the metal oxides are oxides of the above metals. Specific examples are $Li_2O$, $Na_2O$, $Cs_2O$, MgO, CaO, and the like.

As the metal complexes, metal complexes each having a ligand including a g-quinolinolate structure and a univalent metal ion are preferred. Examples of the ligand including a 8-quinolinolate structure are 8-quinolinolato, methyl-substituted (e.g., 2-methyl substituted or 5-methyl substituted) 8-quinolinolato, and the like. Note that the 8-quinolinolate structure refers to a structure in which a proton of a —OH group in substituted or unsubstituted 8-quinolinol has been detached.

Examples of the above metal complexes including alkali metals or alkaline earth metals are 8-(quinolinolato)lithium (abbreviation: Liq), which is a lithium complex having a ligand including a 8-quinolinolate structure, 8-(quinolinolato)sodium (abbreviation: Naq), which is a sodium complex having a ligand including a 8-quinolinolate structure, 8-(quinolinolato)potassium (abbreviation: Kq), which is a potassium complex having a ligand including a 8-quinolinolate structure, 8-(quinolinolato)magnesium (abbreviation: $Mgq_2$), which is a magnesium complex having a ligand including a 8-quinolinolate structure, (8-quinolinolato)zinc (abbreviation: $Znq_2$), which is a zinc complex having a ligand including a 8-quinolinolate structure, and the like.

<Electron-Injection Layer>

The electron-injection layer 115 is a layer for increasing the efficiency of electron injection from the second electrode (cathode) 102 and is preferably formed using a material whose value of the LUMO level has a small difference (0.5 eV or less) from the work function of a material of the cathode 102. Thus, the electron-injection layer 115 can be formed using an alkali metal, an alkaline earth metal, or a compound thereof, such as lithium, cesium, lithium fluoride (LiF), cesium fluoride (CsF), calcium fluoride ($CaF_2$), 8-hydroxyquinolinatolithium (abbreviation: Liq), 2-(2-pyridyl) phenolatolithium (abbreviation: LiPP), 2-(2-pyridyl)-3-pyridinolato lithium (abbreviation: LiPPy), 4-phenyl-2-(2-pyridyl)phenolato lithium (abbreviation: LiPPP), lithium oxide ($LiO_x$), or cesium carbonate. A rare earth metal compound like erbium fluoride ($ErF_3$) can also be used.

When the charge-generation layer 104 is provided between two EL layers 103a and 103b as in the light-emitting device in FIG. 1B, a structure in which a plurality of EL layers are stacked between the pair of electrodes (the structure is also referred to as a tandem structure) can be obtained. Note that functions and materials of the hole-injection layer 111, the hole-transport layer 112, the light-emitting layer 113, the electron-transport layer 114, and the electron-injection layer 115 which are illustrated in FIG. 1A are the same as those of hole-injection layers 111a and 111b, hole-transport layers 112a and 112b, light-emitting layers 113a and 113b, electron-transport layers 114a and 114b, electron-injection layers 115a and 115b which are illustrated in FIG. 1B.

<Charge-Generation Layer>

In the light-emitting device in FIG. 1B, the charge-generation layer 104 has a function of injecting electrons into the EL layer 103a on the first electrode (anode) 101 side and injecting holes into the EL layer 103b on the second electrode (cathode) 102 side when a voltage is applied between the first electrode (anode) 101 and the second electrode (cathode) 102. The charge-generation layer 104 may be either a p-type layer in which an electron acceptor (acceptor) is added to a hole-transport material or an n-type layer in which an electron donor (donor) is added to an electron-transport material. Alternatively, both of these layers may be stacked. Alternatively, the p-type layer and any one or both of an electron-relay layer and an electron-injection buffer layer, which are described later, may be combined. Note that forming the charge-generation layer 104 with the use of any of the above materials can inhibit an increase in driving voltage caused by the stack of the EL layers.

In the case where the charge-generation layer 104 is a p-type layer in which an electron acceptor is added to a hole-transport material, any of the materials described in this embodiment can be used as the hole-transport material. As the electron acceptor, it is possible to use 7,7,8,8-tetracyano-2,3,5,6-tetrafluoroquinodimethane (abbreviation: F4-TCNQ), chloranil, and the like. Other examples include oxides of metals that belong to Group 4 to Group 8 of the periodic table. Specific examples are vanadium oxide, niobium oxide, tantalum oxide, chromium oxide, molybdenum oxide, tungsten oxide, manganese oxide, and rhenium oxide.

In the case where the charge-generation layer 104 is an n-type layer in which an electron donor is added to an electron-transport material, any of the materials described in this embodiment can be used as the electron-transport material. As the electron donor, it is possible to use an alkali metal, an alkaline earth metal, a rare earth metal, metals that belong to Group 2 and Group 13 of the periodic table, or an oxide or carbonate thereof. Specifically, lithium (Li), cesium (Cs), magnesium (Mg), calcium (Ca), ytterbium (Yb), indium (In), lithium oxide, cesium carbonate, or the like is preferably used. An organic compound such as tetrathianaphthacene may be used as the electron donor.

When the electron-relay layer which is preferably combined with the p-type layer as described above is provided between the electron-injection buffer layer and the p-type layer, the electron-relay layer has a function of preventing an interaction between the electron-injection buffer layer and the p-type layer and smoothly transferring electrons. The electron-relay layer includes at least an electron-transport material, and the LUMO level of the electron-transport material is preferably between the LUMO level of the electron-accepting substance in the p-type layer and the LUMO level of a substance in the electron-injection buffer layer. As a specific value of the energy level, the LUMO level of the electron-transport material in the electron-relay layer is preferably higher than or equal to −5.0 eV, more preferably higher than or equal to −5.0 eV and lower than or equal to −3.0 eV. Note that as the electron-transport material in the electron-relay layer, a phthalocyanine-based material or a metal complex having a metal-oxygen bond and an aromatic ligand is preferably used.

A substance having an excellent electron-injection property can be used for the electron-injection buffer layer. For example, an alkali metal, an alkaline earth metal, a rare earth metal, or a compound thereof (an alkali metal compound (including an oxide such as lithium oxide, a halide, and a carbonate such as lithium carbonate and cesium carbonate), an alkaline earth metal compound (including an oxide, a halide, and a carbonate), or a rare earth metal compound (including an oxide, a halide, and a carbonate)) can be used.

In the case where the electron-injection buffer layer includes the electron-transport material and an electron-donating substance, an organic compound such as tetrathianaphthacene (abbreviation: TTN), nickelocene, or decamethylnickelocene can be used as the electron-donating substance, as well as an alkali metal, an alkaline earth metal, a rare earth metal, a compound thereof (an alkali metal compound (including an oxide such as lithium oxide, a halide, and a carbonate such as lithium carbonate and cesium carbonate), an alkaline earth metal compound (including an oxide, a halide, and a carbonate), or a rare earth metal compound (including an oxide, a halide, and a carbonate)). As the electron-transport material, a material similar to the above-described material for the electron-transport layer can be used.

Figure 18:
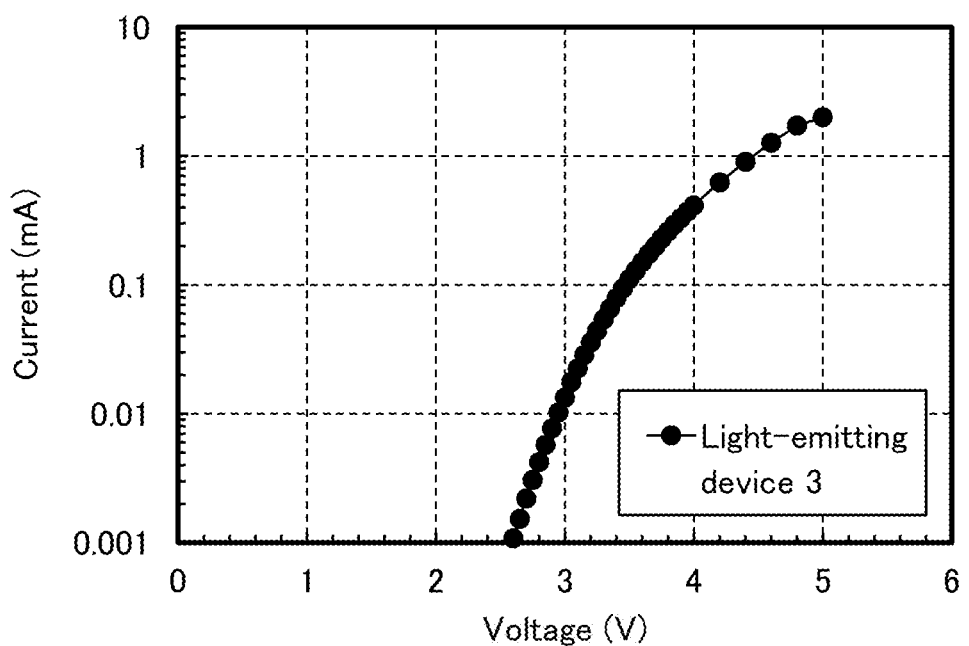
FIG. 18 is a graph showing current-voltage characteristics of the light-emitting device 3.

Although FIG. 18 illustrates the structure in which two EL layers 103 are stacked, three or more EL layers may be stacked with charge-generation layers each provided between two adjacent EL layers.

The above-described charge-generation layer can be used instead of the above-described electron-injection layer. In that case, the electron-injection buffer layer, the electron-relay layer, and the p-type layer are preferably stacked in this order from the anode side.

<Substrate>

The light-emitting device described in this embodiment can be formed over any of a variety of substrates. Note that the type of substrate is not limited to a certain type. Examples of the substrate include semiconductor substrates (e.g., a single crystal substrate and a silicon substrate), an SOI substrate, a glass substrate, a quartz substrate, a plastic substrate, a metal substrate, a stainless steel substrate, a substrate including stainless steel foil, a tungsten substrate, a substrate including tungsten foil, a flexible substrate, an attachment film, paper including a fibrous material, and a base material film.

Examples of the glass substrate include a barium borosilicate glass substrate, an aluminoborosilicate glass substrate, and a soda lime glass substrate. Examples of the flexible substrate, the attachment film, and the base material film include plastics typified by polyethylene terephthalate (PET), polyethylene naphthalate (PEN), and polyether sulfone (PES); a synthetic resin such as an acrylic resin; polypropylene; polyester; polyvinyl fluoride; polyvinyl chloride; polyamide; polyimide; an aramid resin; an epoxy resin; an inorganic vapor deposition film; and paper.

For fabrication of the light-emitting device in this embodiment, a vacuum process such as an evaporation method or a solution process such as a spin coating method or an ink-jet method can be used. When an evaporation method is used, a physical vapor deposition method (a PVD method) such as a sputtering method, an ion plating method, an ion beam evaporation method, a molecular beam evaporation method, or a vacuum evaporation method, a chemical vapor deposition method (a CVD method), or the like can be used. Specifically, the functional layers (the hole-injection layers 111, 111a, and 111b, the hole-transport layers 112, 112a, and 112b, the light-emitting layers 113, 113a, and 113b, the electron-transport layers 114, 114a, and 114b, and the electron-injection layers 115, 115a, and 115b) included in the EL layers and the charge-generation layer 104 of the light-emitting device can be formed by an evaporation method (e.g., a vacuum evaporation method), a coating method (e.g., a dip coating method, a die coating method, a bar coating method, a spin coating method, or a spray coating method), a printing method (e.g., an ink-jet method, screen printing (stencil), offset printing (planography), flexography (relief printing), gravure printing, micro-contact printing, or nanoimprint lithography), or the like.

Note that materials that can be used for the functional layers (the hole-injection layers 111, 111a, and 111b, the hole-transport layers 112, 112a, and 112b, the light-emitting layers 113, 113a, and 113b, the electron-transport layers 114, 114a, and 114b, and the electron-injection layers 115, 115a, and 115b) which are included in the EL layers 103, 103a, and 103b and the charge-generation layer 104 of the light-emitting device described in this embodiment are not limited to the above materials, and other materials can be used in combination as long as the functions of the layers are fulfilled. For example, a high-molecular compound (e.g., an oligomer, a dendrimer, and a polymer), a middle molecular compound (a compound between a low molecular compound and a high-molecular compound with a molecular weight of 400 to 4000), or an inorganic compound (e.g., a quantum dot material) can be used. The quantum dot material may be a colloidal quantum dot material, an alloyed quantum dot material, a core-shell quantum dot material, a core quantum dot material, or the like.

The structures described in this embodiment can be used in combination with any of the structures described in the other embodiments, as appropriate.

Embodiment 2

Figure 2A:
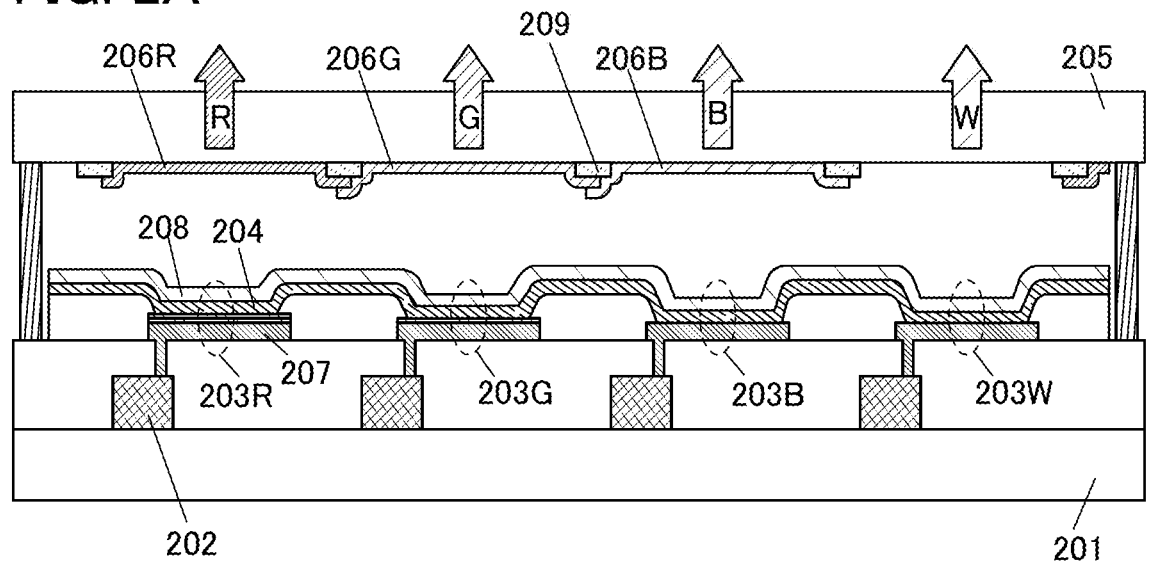
FIGS. 2A to 2C illustrate light-emitting apparatuses.

In this embodiment, a light-emitting apparatus of one embodiment of the present invention will be described. Note that a light-emitting apparatus illustrated in FIG. 2A is an active-matrix light-emitting apparatus in which transistors (FETs) 202 over a first substrate 201 are electrically connected to light-emitting devices 203R, 203G, 203B, and 203W. The light-emitting devices 203R, 203G, 203B, and 203W include a common EL layer 204 and each have a microcavity structure in which the optical path length between electrodes is adjusted according to the emission color of the light-emitting device. The light-emitting apparatus is a top-emission light-emitting apparatus in which light is emitted from the EL layer 204 through color filters 206R, 206G, and 206B formed on a second substrate 205.

In the light-emitting apparatus illustrated in FIG. 2A, a first electrode 207 is formed to function as a reflective electrode. A second electrode 208 is formed to function as a transflective electrode having both semi-transparent and semi-reflective functions for light (visible light or infrared light). Note that description in any of the other embodiments can be referred to as appropriate for electrode materials for the first electrode 207 and the second electrode 208.

Figure 2B:
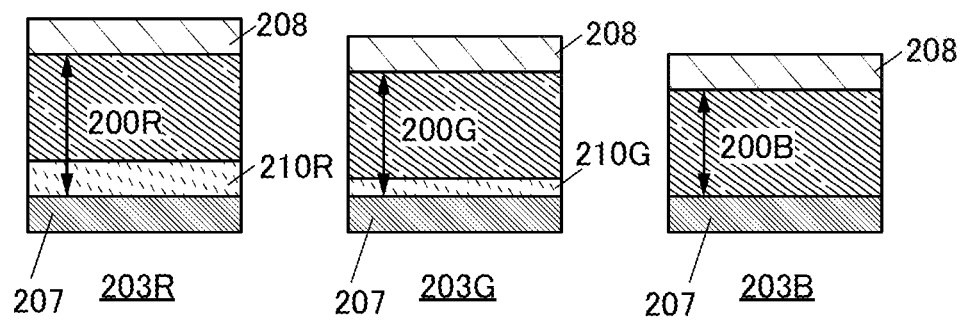

In the case where the light-emitting device 203R functions as a red light-emitting device, the light-emitting device 203G functions as a green light-emitting device, the light-emitting device 203B functions as a blue light-emitting device, and the light-emitting device 203W functions as a white light-emitting device in FIG. 2A, for example, a gap between the first electrode 207 and the second electrode 208 in the light-emitting device 203R is adjusted to have an optical path length 200R, a gap between the first electrode 207 and the second electrode 208 in the light-emitting device 203G is adjusted to have an optical path length 200G, and a gap between the first electrode 207 and the second electrode 208 in the light-emitting device 203B is adjusted to have an optical path length 200B as illustrated in FIG. 2B. Note that optical adjustment can be performed in such a manner that a conductive layer 210R is stacked over the first electrode 207 in the light-emitting device 203R and a conductive layer 210G is stacked over the first electrode 207 in the light-emitting device 203G as illustrated in FIG. 2B.

The second substrate 205 is provided with the color filters 206R, 206G, and 206B. Note that the color filters each transmit visible light in a specific wavelength range and blocks visible light in a specific wavelength range. Thus, as illustrated in FIG. 2A, the color filter 206R that transmits only light in the red wavelength range is provided in a position overlapping with the light-emitting device 203R, whereby red light emission can be obtained from the light-emitting device 203R. Furthermore, the color filter 206G that transmits only light in the green wavelength range is provided in a position overlapping with the light-emitting device 203G, whereby green light emission can be obtained from the light-emitting device 203G. Moreover, the color filter 206B that transmits only light in the blue wavelength range is provided in a position overlapping with the light-emitting device 203B, whereby blue light emission can be obtained from the light-emitting device 203B. Note that the light-emitting device 203W can emit white light without a color filter. Note that a black layer (black matrix) 209 may be provided at an end portion of each color filter. The color filters 206R, 206G, and 206B and the black layer 209 may be covered with an overcoat layer formed using a transparent material.

Figure 2C:
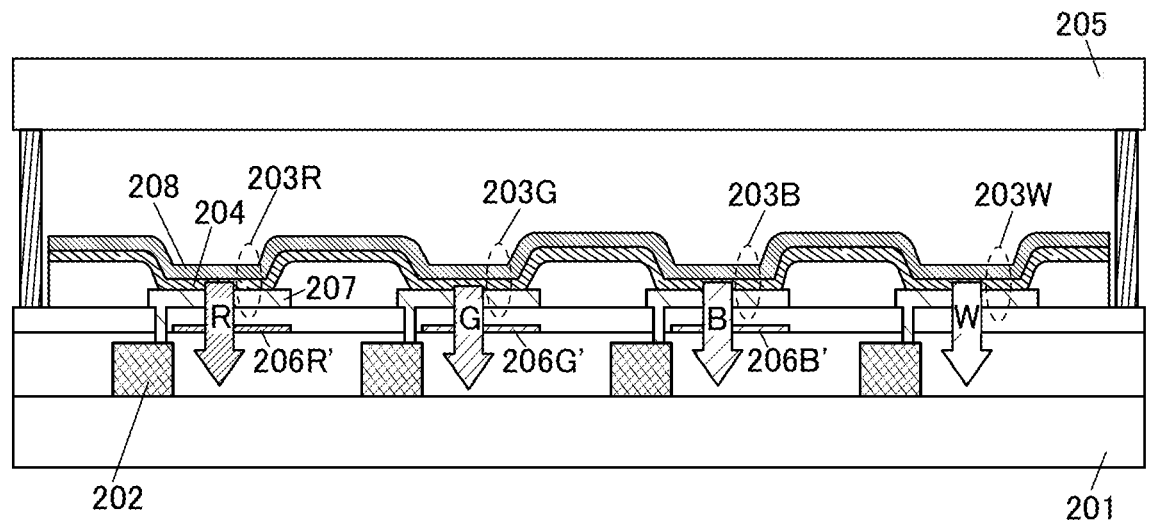

Although the light-emitting apparatus in FIG. 2A has a structure in which light is extracted from the second substrate 205 side (a top emission structure), a structure in which light is extracted from the first substrate 201 side where the FETs 202 are formed (a bottom emission structure) may be employed as illustrated in FIG. 2C. In the case of a bottom-emission light-emitting apparatus, the first electrode 207 is formed as a transflective electrode and the second electrode 208 is formed as a reflective electrode. As the first substrate 201, a substrate having at least a light-transmitting property is used. As illustrated in FIG. 2C, color filters 206R', 206G', and 206B' are provided closer to the first substrate 201 than the light-emitting devices 203R, 203G, and 203B are.

In FIG. 2A, the light-emitting devices are the red light-emitting device, the green light-emitting device, the blue light-emitting device, and the white light-emitting device; however, the light-emitting devices of one embodiment of the present invention are not limited to the above, and a yellow light-emitting device or an orange light-emitting device may be used. Note that description in any of the other embodiments can be referred to as appropriate for materials that are used for the EL layers (a light-emitting layer, a hole-injection layer, a hole-transport layer, an electron-transport layer, an electron-injection layer, a charge-generation layer, and the like) to fabricate each of the light-emitting devices. In that case, a color filter needs to be appropriately selected according to the emission color of the light-emitting device.

With the above structure, a light-emitting apparatus including light-emitting devices that exhibit a plurality of emission colors can be fabricated.

The structures described in this embodiment can be used in combination with any of the structures described in the other embodiments, as appropriate.

Embodiment 3

In this embodiment, a light-emitting apparatus of one embodiment of the present invention will be described.

The use of the device structure of the light-emitting device of one embodiment of the present invention allows fabrication of an active-matrix light-emitting apparatus or a passive-matrix light-emitting apparatus. Note that an active-matrix light-emitting apparatus has a structure including a combination of a light-emitting device and a transistor (FET). Thus, each of a passive-matrix light-emitting apparatus and an active-matrix light-emitting apparatus is one embodiment of the present invention. Note that any of the light-emitting devices described in other embodiments can be used in the light-emitting apparatus described in this embodiment.

In this embodiment, an active-matrix light-emitting apparatus will be described with reference to FIGS. 3A and 3B.

Figure 3A:
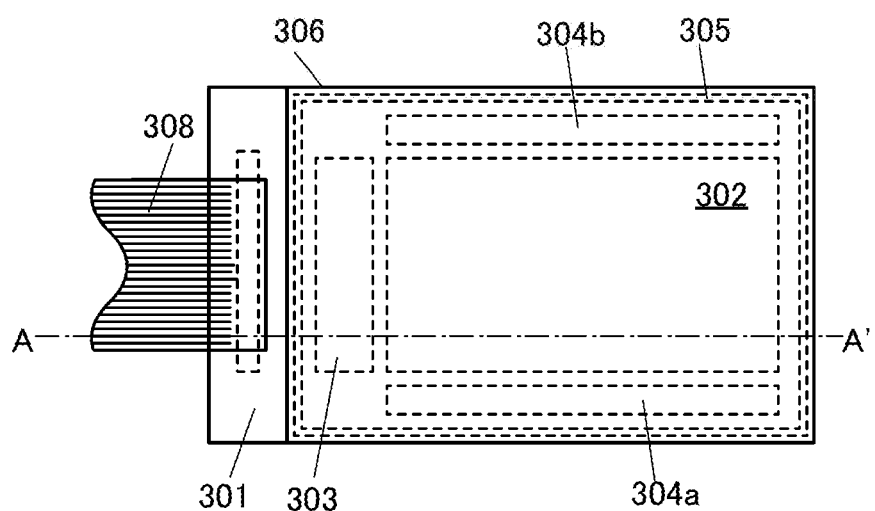
FIGS. 3A and 3B are a top view and a cross-sectional view, respectively, illustrating a light-emitting apparatus.
Figure 3B:
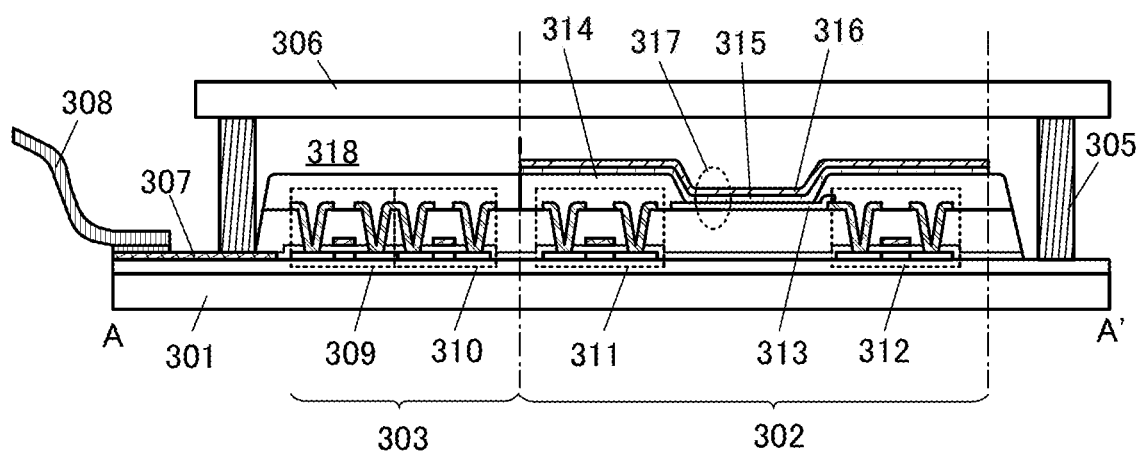

FIG. 3A is a top view illustrating the light-emitting apparatus, and FIG. 3B is a cross-sectional view taken along chain line A-A' in FIG. 3A. The active-matrix light-emitting apparatus includes a pixel portion 302, a driver circuit portion (source line driver circuit) 303, and driver circuit portions (gate line driver circuits) 304a and 304b which are provided over a first substrate 301. The pixel portion 302 and the driver circuit portions 303, 304a, and 304b are sealed between the first substrate 301 and a second substrate 306 with a sealant 305.

A lead wiring 307 is provided over the first substrate 301. The lead wiring 307 is electrically connected to an FPC 308 that is an external input terminal. Note that the FPC 308 transmits a signal (e.g., a video signal, a clock signal, a start signal, or a reset signal) or a potential from the outside to the driver circuit portions 303, 304a, and 304b. The FPC 308 may be provided with a printed wiring board (PWB). Note that the light-emitting apparatus provided with an FPC or a PWB is included in the category of a light-emitting apparatus.

FIG. 3B illustrates a cross-sectional structure of the light-emitting apparatus.

The pixel portion 302 includes a plurality of pixels each of which includes a FET (a switching FET) 311, a FET (a current control FET) 312, and a first electrode 313 electrically connected to the FET 312. Note that the number of FETs included in each pixel is not particularly limited and can be set appropriately.

As FETs 309, 310, 311, and 312, for example, a staggered transistor or an inverted staggered transistor can be used without particular limitation. A top-gate transistor, a bottom-gate transistor, or the like may be used.

Note that there is no particular limitation on the crystallinity of a semiconductor that can be used for the FETs 309, 310.311, and 312, and an amorphous semiconductor or a semiconductor having crystallinity (a microcrystalline semiconductor, a polycrystalline semiconductor, a single crystal semiconductor, or a semiconductor partly including crystal regions) may be used. A semiconductor having crystallinity is preferably used, in which case deterioration of the transistor characteristics can be inhibited.

For the semiconductor, a Group 14 element, a compound semiconductor, an oxide semiconductor, an organic semiconductor, or the like can be used, for example. As a typical example, a semiconductor containing silicon, a semiconductor containing gallium arsenide, or an oxide semiconductor containing indium can be used.

The driver circuit portion 303 includes the FETs 309 and 310. The driver circuit portion 303 may be formed with a circuit including transistors having the same conductivity type (either n-channel transistors or p-channel transistors) or a CMOS circuit including an n-channel transistor and a p-channel transistor. Furthermore, a driver circuit may be provided outside.

An end portion of the first electrode 313 is covered with an insulator 314. The insulator 314 can be formed using an organic compound such as a negative photosensitive resin or a positive photosensitive resin (acrylic resin), or an inorganic compound such as silicon oxide, silicon oxynitride, or silicon nitride. The insulator 314 preferably has a curved surface with an appropriate curvature at an upper end portion or a lower end portion thereof. In that case, favorable coverage with a film formed over the insulator 314 can be obtained.

An EL layer 315 and a second electrode 316 are stacked over the first electrode 313. The EL layer 315 includes a light-emitting layer, a hole-injection layer, a hole-transport layer, an electron-transport layer, an electron-injection layer, a charge-generation layer, and the like.

The structure and materials described in any of the other embodiments can be used for the components of a light-emitting device 317 described in this embodiment. Although not illustrated, the second electrode 316 is electrically connected to the FPC 308 that is an external input terminal.

Although the cross-sectional view in FIG. 3B illustrates only one light-emitting device 317, a plurality of light-emitting devices are arranged in a matrix in the pixel portion 302. Light-emitting devices that emit light of three kinds of colors (R, G, and B) are selectively formed in the pixel portion 302, whereby a light-emitting apparatus capable of displaying a full-color image can be obtained. In addition to the light-emitting devices that emit light of three kinds of colors (R, G, and B), for example, light-emitting devices that emit light of white (W), yellow (Y), magenta (M), cyan (C), and the like may be formed. For example, the light-emitting devices that emit light of some of the above colors are used in combination with the light-emitting devices that emit light of three kinds of colors (R, G and B), whereby effects such as an improvement in color purity and a reduction in power consumption can be achieved. Alternatively, a light-emitting apparatus which is capable of displaying a full-color image may be fabricated by a combination with color filters. As color filters, red (R), green (G), blue (B), cyan (C), magenta (M), and yellow (Y) color filters and the like can be used.

When the second substrate 306 and the first substrate 301 are bonded to each other with the sealant 305, the FETs 309, 310, 311, and 312 and the light-emitting device 317 over the first substrate 301 are provided in a space 318 surrounded by the first substrate 301, the second substrate 306, and the sealant 305. Note that the space 31g may be filled with an inert gas (e.g., nitrogen or argon) or an organic substance (including the sealant 305).

An epoxy resin, glass frit, or the like can be used for the sealant 305. It is preferable to use a material that is permeable to as little moisture and oxygen as possible for the sealant 305. As the second substrate 306, a substrate that can be used as the first substrate 301 can be similarly used. Thus, any of the various substrates described in the other embodiments can be appropriately used. As the substrate, a glass substrate, a quartz substrate, or a plastic substrate made of fiber-reinforced plastic (FRP), polyvinyl fluoride (PVF), polyester, acrylic resin, or the like can be used. In the case where glass frit is used for the sealant, the first substrate 301 and the second substrate 306 are preferably glass substrates in terms of adhesion.

Accordingly, the active-matrix light-emitting apparatus can be obtained.

In the case where the active-matrix light-emitting apparatus is provided over a flexible substrate, the FETs and the light-emitting device may be directly formed over the flexible substrate; alternatively, the FETs and the light-emitting device may be formed over a substrate provided with a separation layer and then separated at the separation layer by application of heat, force, laser, or the like to be transferred to a flexible substrate. For the separation layer, a stack including inorganic films such as a tungsten film and a silicon oxide film, or an organic resin film of polyimide or the like can be used, for example. Examples of the flexible substrate include, in addition to a substrate over which a transistor can be formed, a paper substrate, a cellophane substrate, an aramid film substrate, a polyimide film substrate, a cloth substrate (including a natural fiber (silk, cotton, or hemp), a synthetic fiber (nylon, polyurethane, or polyester), a regenerated fiber (acetate, cupro, rayon, or regenerated polyester), or the like), a leather substrate, and a rubber substrate. With the use of any of these substrates, an increase in durability, an increase in heat resistance, a reduction in weight, and a reduction in thickness can be achieved.

The light-emitting device included in the active matrix light-emitting apparatus may emit pulsed light (with a frequency of kHz or MHz, for example) so that the light is used for display. The light-emitting device formed using any of the above organic compounds has excellent frequency characteristics; therefore, time for driving the light-emitting device can be shortened, resulting in a reduction in power consumption. Furthermore, a reduction in driving time leads to inhibition of heat generation, so that the degree of deterioration of the light-emitting device can be reduced.

The structures described in this embodiment can be used in combination with any of the structures described in the other embodiments, as appropriate.

Embodiment 4

In this embodiment, examples of a variety of electronic devices and an automobile manufactured using the light-emitting device of one embodiment of the present invention or a light-emitting apparatus including the light-emitting device of one embodiment of the present invention will be described. Note that the light-emitting apparatus can be used mainly in a display portion of the electronic device described in this embodiment.

Electronic devices illustrated in FIGS. 4A to 4E can include a housing 7000, a display portion 7001, a speaker 7003, an LED lamp 7004, operation keys 7005 (including a power switch or an operation switch), a connection terminal 7006, a sensor 7007 (a sensor having a function of measuring or sensing force, displacement, position, speed, acceleration, angular velocity, rotational frequency, distance, light, liquid, magnetism, temperature, chemical substance, sound, time, hardness, electric field, current, voltage, electric power, radiation, flow rate, humidity, gradient, oscillation, odor, or infrared ray), a microphone 7008, and the like.

Figure 4A:
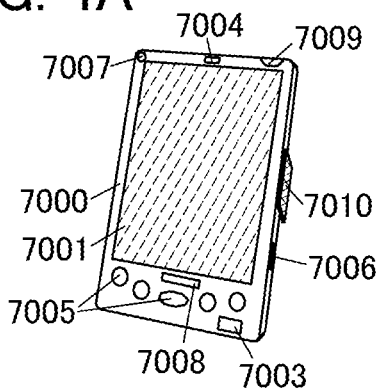
FIG. 4A illustrates a mobile computer.

FIG. 4A illustrates a mobile computer that can include a switch 7009, an infrared port 7010, and the like in addition to the above components.

Figure 4B:
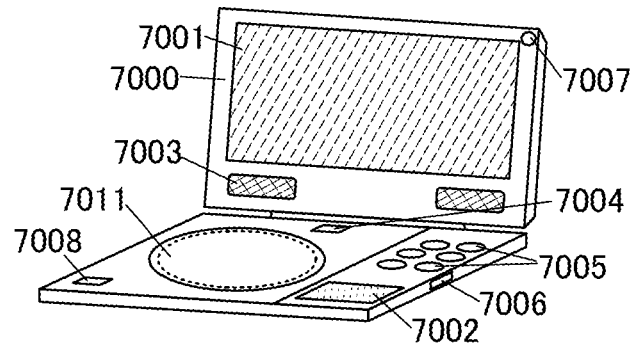
FIG. 4B illustrates a portable image reproducing device.

FIG. 4B illustrates a portable image reproducing device (e.g., a DVD player) that is provided with a recording medium and can include a second display portion 7002, a recording medium reading portion 7011, and the like in addition to the above components.

Figure 4C:
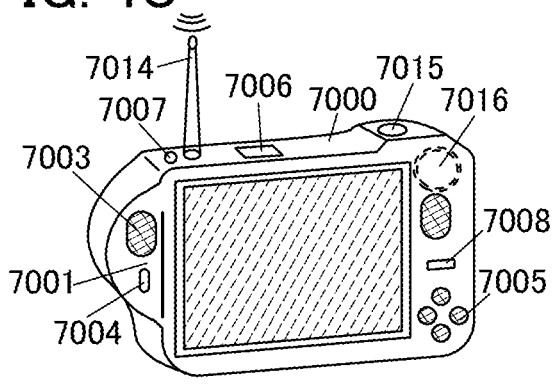
FIG. 4C illustrates a digital camera.

FIG. 4C illustrates a digital camera that has a television reception function and can include an antenna 7014, a shutter button 7015, an image receiving portion 7016, and the like in addition to the above components.

Figure 4D:
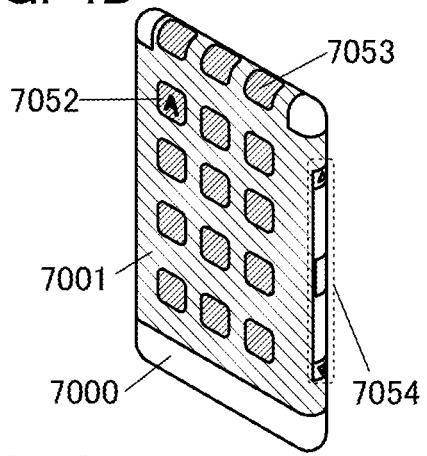
FIG. 4D illustrates a portable information terminal.

FIG. 4D illustrates a portable information terminal. The portable information terminal has a function of displaying information on three or more surfaces of the display portion 7001. Here, information 7052, information 7053, and information 7054 are displayed on different surfaces. For example, a user of the portable information terminal can check the information 7053 displayed such that it can be seen from above the portable information terminal, with the portable information terminal put in a breast pocket of his/her clothes. Thus, the user can see the display without taking out the portable information terminal from the pocket and decide whether to answer the call, for example.

Figure 4E:
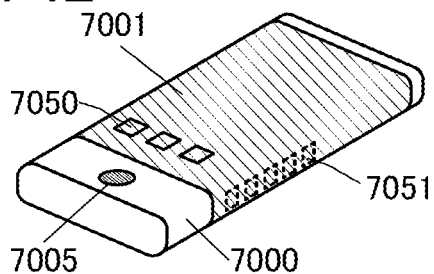
FIG. 4E illustrates a portable information terminal.

FIG. 4E illustrates a portable information terminal (e.g., a smartphone) and can include the display portion 7001, the operation key 7005, and the like in the housing 7000. Note that the portable information terminal may include a speaker 9003, a connection terminal 7006, a sensor 9007, or the like. The portable information terminal can display text and image data on its plurality of surfaces. Here, three icons 7050 are displayed. Furthermore, information 7051 indicated by dashed rectangles can be displayed on another surface of the display portion 7001. Examples of the information 7051 include notification of reception of an e-mail, an SNS message, or an incoming call, the title and sender of an e-mail, an SNS message, or the like, the date, the time, remaining battery, and the reception strength of an antenna. The icon 7050 or the like may be displayed at the position where the information 7051 is displayed.

Figure 4F:
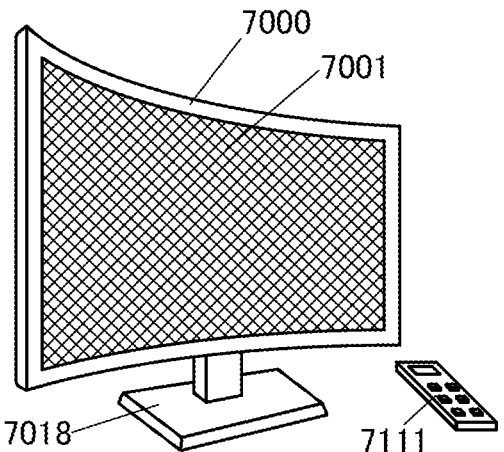
FIG. 4F illustrates a television set.

FIG. 4F illustrates a large-size television set (also referred to as TV or a television receiver) and can include the housing 7000, the display portion 7001, and the like. In addition, here, the housing 7000 is supported by a stand 7018. The television set can be operated with a separate remote controller 7111 or the like. The display portion 7001 may include a touch sensor. The television set can be operated by touching the display portion 7001 with a finger or the like. The remote controller 7111 may be provided with a display portion for displaying information output from the remote controller 7111. With operation keys or a touch panel of the remote controller 7111, channels and volume can be controlled and images displayed on the display portion 7001 can be controlled.

The electronic devices illustrated in FIGS. 4A to 4F can have a variety of functions, such as a function of displaying a variety of information (a still image, a moving image, a text image, and the like) on the display portion, a touch panel function, a function of displaying a calendar, date, time, and the like, a function of controlling processing with a variety of types of software (programs), a wireless communication function, a function of connecting to a variety of computer networks with a wireless communication function, a function of transmitting and receiving a variety of data with a wireless communication function, a function of reading a program or data stored in a recording medium and displaying the program or data on the display portion, and the like. Furthermore, the electronic device including a plurality of display portions can have a function of displaying image data mainly on one display portion while displaying text data mainly on another display portion, a function of displaying a three-dimensional image by displaying images on a plurality of display portions with a parallax taken into account, or the like. Furthermore, the electronic device including an image receiving portion can have a function of shooting a still image, a function of shooting a moving image, a function of automatically or manually correcting a shot image, a function of storing a shot image in a recording medium (an external recording medium or a recording medium incorporated in the camera), a function of displaying a shot image on the display portion, or the like. Note that functions that can be provided for the electronic devices illustrated in FIGS. 4A to 4F are not limited to those described above, and the electronic devices can have a variety of functions.

Figure 4G:
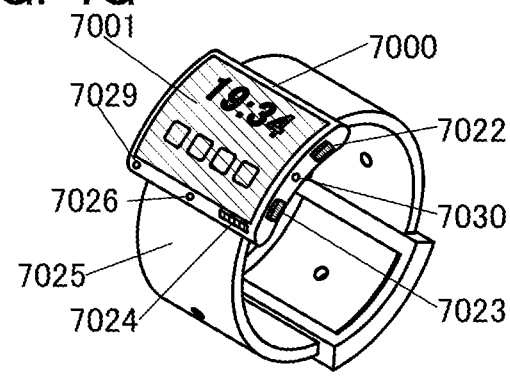
FIG. 4G illustrates a portable information terminal.

FIG. 4G illustrates a watch-type portable information terminal, which can be used as a smart watch, for example. The watch-type portable information terminal includes the housing 7000, the display portion 7001, operation buttons 7022 and 7023, a connection terminal 7024, a band 7025, a microphone 7026, a sensor 7029, a speaker 7030, and the like. The display surface of the display portion 7001 is curved, and images can be displayed on the curved display surface. Furthermore, mutual communication between the portable information terminal and, for example, a headset capable of wireless communication can be performed, and thus hands-free calling is possible with the portable information terminal. Note that the connection terminal 7024 allows mutual data transmission with another information terminal and charging. Wireless power feeding can also be employed for the charging operation.

The display portion 7001 mounted in the housing 7000 serving as a bezel includes anon-rectangular display region. The display portion 7001 can display an icon indicating time 7027, another icon 7028, and the like. The display portion 7001 may be a touch panel (an input/output device) including a touch sensor (an input device).

The smart watch illustrated in FIG. 4G can have a variety of functions, such as a function of displaying a variety of information (e.g., a still image, a moving image, and a text image) on the display portion, a touch panel function, a function of displaying a calendar, date, time, and the like, a function of controlling processing with a variety of types of software (programs), a wireless communication function, a function of connecting to a variety of computer networks with a wireless communication function, a function of transmitting and receiving a variety of data with a wireless communication function, and a function of reading a program or data stored in a recording medium and displaying the program or data on the display portion.

The housing 7000 can include a speaker, a sensor (a sensor having a function of measuring or sensing force, displacement, position, speed, acceleration, angular velocity, rotational frequency, distance, light, liquid, magnetism, temperature, chemical substance, sound, time, hardness, electric field, current, voltage, electric power, radiation, flow rate, humidity, gradient, oscillation, odor, or infrared rays), a microphone, and the like.

Note that the light-emitting apparatus of one embodiment of the present invention can be used in the display portion of each electronic device described in this embodiment, so that a long lifetime electronic device can be obtained.

Figure 5A:
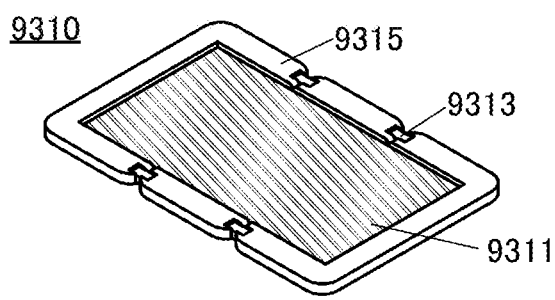
FIGS. 5A to 5C illustrate an electronic device.
Figure 5B:
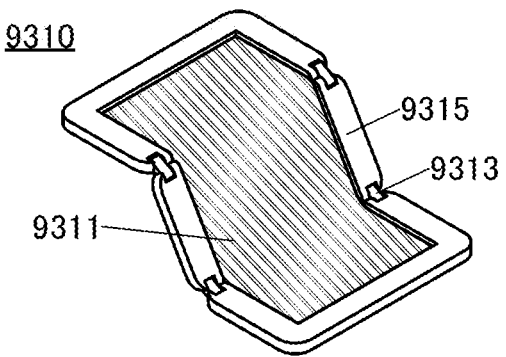
Figure 5C:
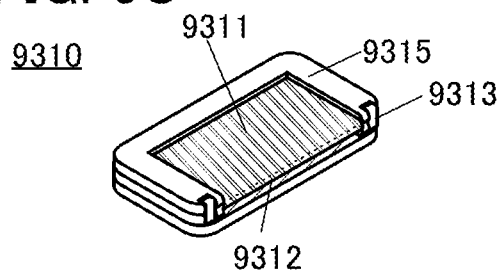

Another electronic device including the light-emitting apparatus is a foldable portable information terminal illustrated in FIGS. 5A to 5C. FIG. 5A illustrates a portable information terminal 9310 which is opened. FIG. 5B illustrates the portable information terminal 9310 which is being opened or being folded. FIG. 5C illustrates the portable information terminal 9310 which is folded. The portable information terminal 9310 is highly portable when folded. The portable information terminal 9310 is highly browsable when opened because of a seamless large display region.

A display portion 9311 is supported by three housings 9315 joined together by hinges 9313. Note that the display portion 9311 may be a touch panel (an input/output device) including a touch sensor (an input device). By bending the display portion 9311 at a connection portion between two housings 9315 with the use of the hinges 9313, the portable information terminal 9310 can be reversibly changed in shape from an opened state to a folded state. The light-emitting apparatus of one embodiment of the present invention can be used for the display portion 9311. In addition, along lifetime electronic device can be obtained. A display region 9312 in the display portion 9311 is a display region that is positioned at a side surface of the portable information terminal 9310 which is folded. On the display region 9312, information icons, file shortcuts of frequently used applications or programs, and the like can be displayed, and confirmation of information and start of application and the like can be smoothly performed.

Figure 6A:
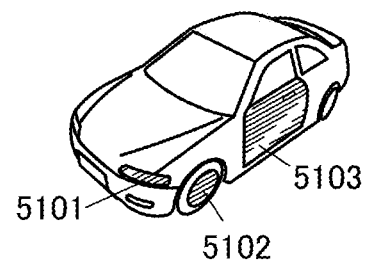
FIGS. 6A and 6B illustrate an automobile.
Figure 6B:
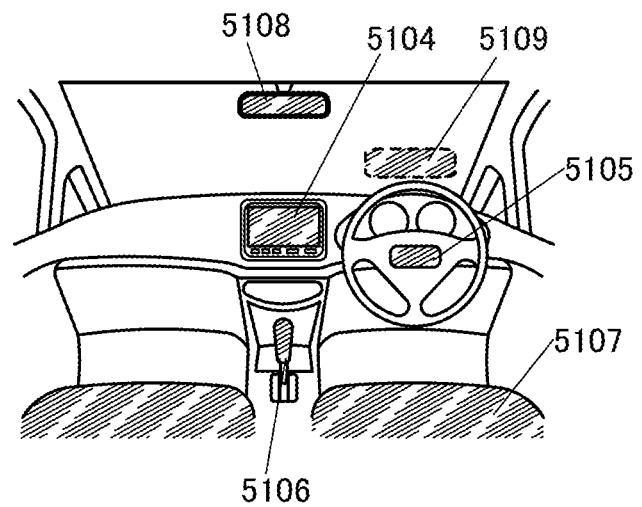

FIGS. 6A and 6B illustrate an automobile including the light-emitting apparatus. The light-emitting apparatus can be incorporated in the automobile, and specifically, can be included in lights 5101 (including lights of the rear part of the car), a wheel cover 5102, a part or whole of a door 5103, or the like on the outer side of the automobile which is illustrated in FIG. 6A. The light-emitting apparatus can also be included in a display portion 5104, a steering wheel 5105, a gear lever 5106, a seat 5107, an inner rearview mirror 5108, an windshield 5109, or the like on the inner side of the automobile which is illustrated in FIG. 68, or in a part of a glass window.

In the above manner, the electronic devices and automobiles can be obtained using the light-emitting apparatus of one embodiment of the present invention. In that case, a long lifetime electronic device can be obtained. Note that the light-emitting apparatus can be used for electronic devices and automobiles in a variety of fields without being limited to those described in this embodiment.

The structures described in this embodiment can be used in combination with any of the structures described in the other embodiments, as appropriate.

Embodiment 5

In this embodiment, the structure of a lighting device fabricated using the light-emitting apparatus of one embodiment of the present invention or the light-emitting device which is part of the light-emitting apparatus will be described with reference to FIGS. 7A and 7B.

Figure 7A:
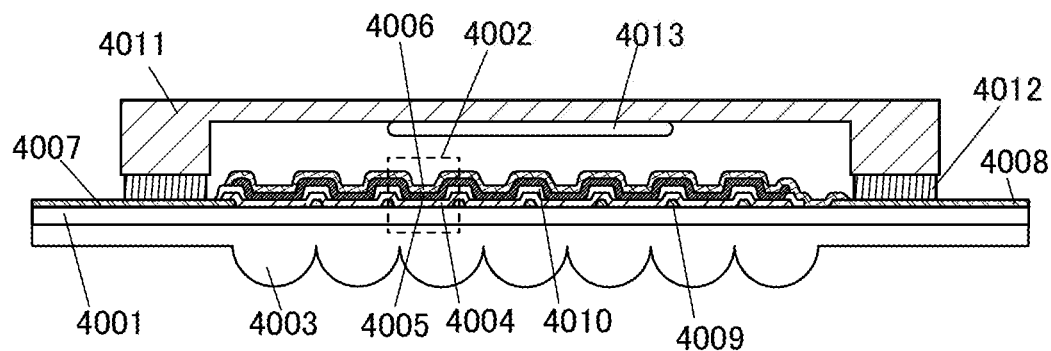
FIGS. 7A and 7B each illustrate a lighting device.
Figure 7B:
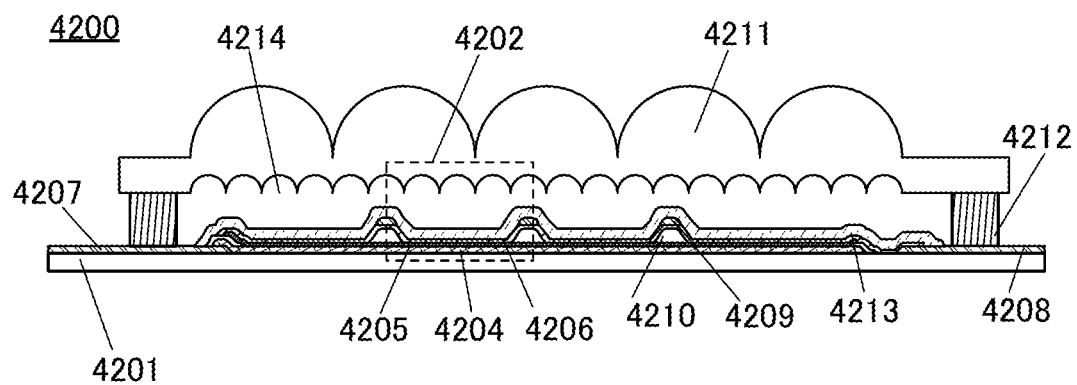

FIGS. 7A and 7B are examples of cross-sectional views of lighting devices. FIG. 7A illustrates a bottom-emission lighting device in which light is extracted from the substrate side, and FIG. 7B illustrates a top-emission lighting device in which light is extracted from the sealing substrate side.

A lighting device 4000 illustrated in FIG. 7A includes a light-emitting device 4002 over a substrate 4001. In addition, the lighting device 4000 includes a substrate 4003 with unevenness on the outside of the substrate 4001. The light-emitting device 4002 includes a first electrode 4004, an EL layer 4005, and a second electrode 4006.

The first electrode 4004 is electrically connected to an electrode 4007, and the second electrode 4006 is electrically connected to an electrode 4008. In addition, an auxiliary wiring 4009 electrically connected to the first electrode 4004 may be provided. Note that an insulating layer 4010 is formed over the auxiliary wiring 4009.

The substrate 4001 and a sealing substrate 4011 are bonded to each other with a sealant 4012. A desiccant 4013 is preferably provided between the sealing substrate 4011 and the light-emitting device 4002. The substrate 4003 has the unevenness illustrated in FIG. 7A, whereby the extraction efficiency of light emitted from the light-emitting device 4002 can be increased.

A lighting device 4200 illustrated in FIG. 7B includes a light-emitting device 4202 over a substrate 4201. The light-emitting device 4202 includes a first electrode 4204, an EL layer 4205, and a second electrode 4206.

The first electrode 4204 is electrically connected to an electrode 4207, and the second electrode 4206 is electrically connected to an electrode 4208. An auxiliary wiring 4209 electrically connected to the second electrode 4206 may be provided. An insulating layer 4210 may be provided under the auxiliary wiring 4209.

The substrate 4201 and a sealing substrate 4211 with unevenness are bonded to each other with a sealant 4212. A barrier film 4213 and a planarization film 4214 may be provided between the sealing substrate 4211 and the light-emitting device 4202. The sealing substrate 4211 has the unevenness illustrated in FIG. 7B, whereby the extraction efficiency of light emitted from the light-emitting device 4202 can be increased.

Examples of such lighting devices include a ceiling light as an indoor lighting. Examples of the ceiling light include a direct-mount light and an embedded light. Such lighting devices are fabricated using the light-emitting apparatus and a housing or a cover in combination.

For another example, such lighting devices can be used for a foot light that lights a floor so that safety on the floor can be improved. A foot light can be effectively used in a bedroom, on a staircase, or on a passage, for example. In that case, the size or shape of the foot light can be changed in accordance with the area or structure of a room. The foot light can be a stationary lighting device fabricated using the light-emitting apparatus and a support in combination.

Such lighting devices can also be used for a sheet-like lighting device (sheet-like lighting). The sheet-like lighting, which is attached to a wall when used, is space-saving and thus can be used for a wide variety of uses. Furthermore, the area of the sheet-like lighting can be easily increased. The sheet-like lighting can also be used on a wall or housing having a curved surface.

Besides the above examples, when the light-emitting apparatus of one embodiment of the present invention or the light-emitting device which is part of the light-emitting apparatus is used as part of furniture in a room, a lighting device that functions as the furniture can be obtained.

As described above, a variety of lighting devices that include the light-emitting apparatus can be obtained. Note that these lighting devices are also embodiments of the present invention.

Note that the structures described in this embodiment can be used in combination with any of the structures described in the other embodiments, as appropriate.

Example 1

Figure 8:
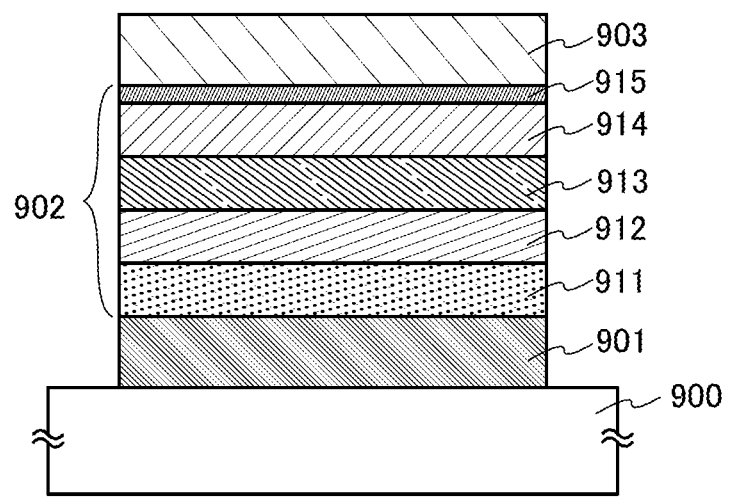
FIG. 8 illustrates a light-emitting device.

In this example, a light-emitting device 1 as a light-emitting device of one embodiment of the present invention was fabricated. Its device structure, fabrication method, and characteristics are described. A comparative light-emitting device 2 was fabricated and device characteristics of both devices were compared. Note that FIG. 8 illustrates a device structure of the light-emitting devices used in this example, and Table 1 shows specific structures. The chemical formulae of materials used in this example are shown below.

TABLE 1

| | First electrode 901 | Hole-injection layer 911 | Hole-transport layer 912 | Light-emitting layer 913 | Electron-transport layer 914 | Electron-injection layer 915 | Second electrode 903 |
|---|---|---|---|---|---|---|---|
| Light-emitting device 1 | HSO (70 nm) | DBT3P-II:MoOx (2:1, 60 nm) | PCBBiF (20 nm) | * | 8mDBtBPNfpr(II) (25 nm) | NBphen (15 nm) | LiF (1 nm) | Al (200 nm) |
| Comparative light-emitting device 2 | HSO (70 nm) | DBT3P-II:MoOx (2:1, 60 nm) | PCBBiF (20 nm) | ** | 12mDBtBPPnfpr (25 nm) | NBphen (15 nm) | LiF (1 nm) | Al (200 nm) |

* 8mDBtBPNfpr(II):PCBBiF:[Ir(dppm)$_2$(acac)] (0.75:0.25:0.075, 40 mn)
** 12mDBtBPPnfpr:PCBBiF:[Ir(dppm)$_2$(acac)] (0.75:0.25:0.075, 40 nm)

[Chemical Formulae 8]

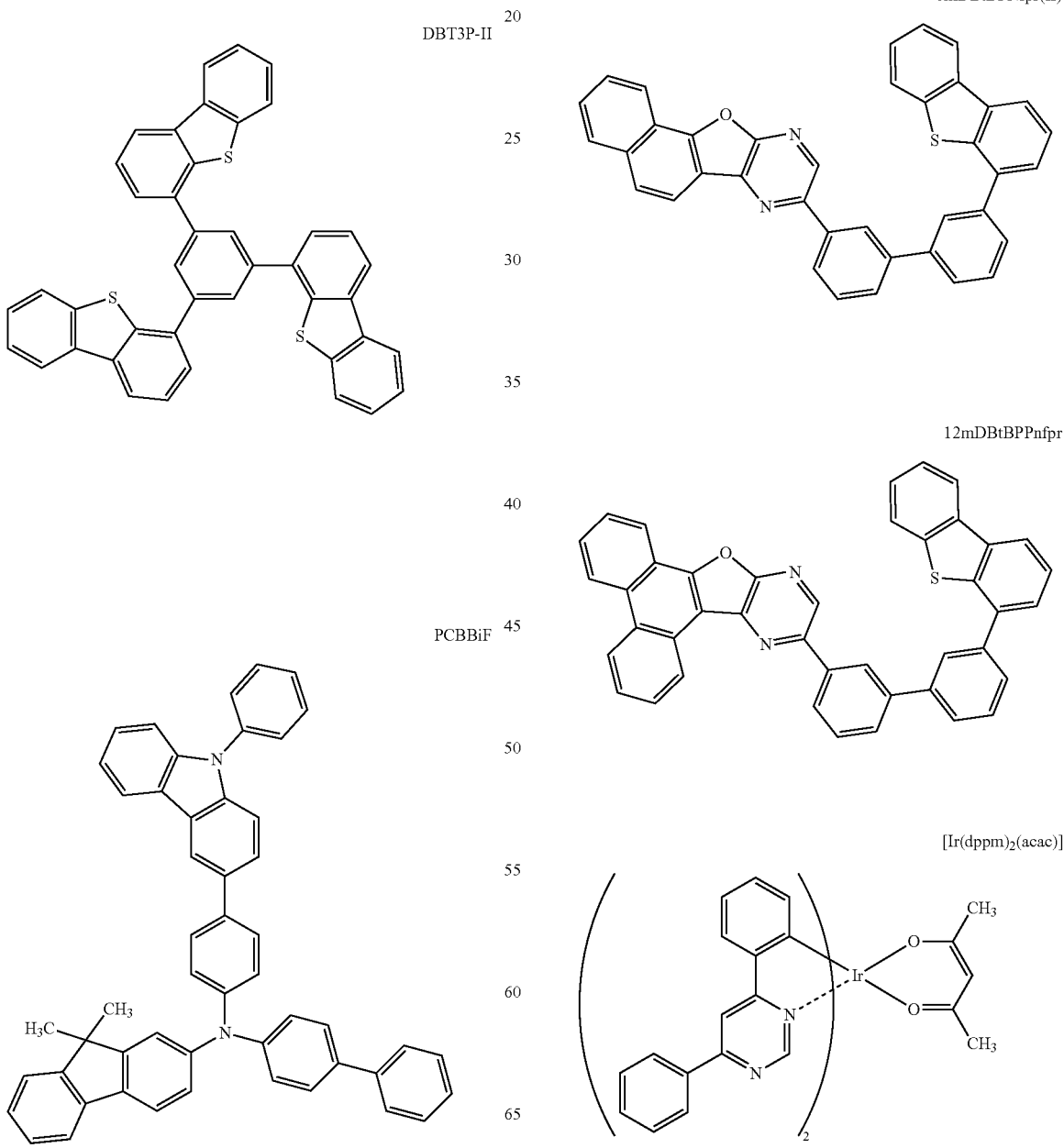

-continued

NBphen

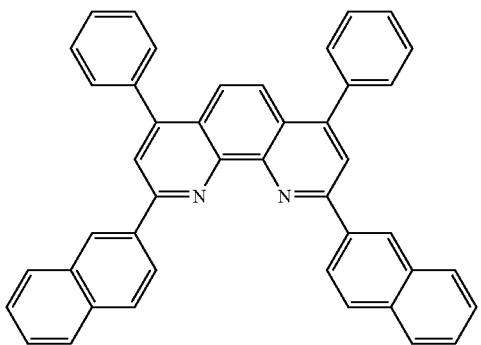

<<Fabrication of Light-Emitting Devices>>

In each of the light-emitting devices described in this example, as illustrated in FIG. 8, a hole-injection layer 911, a hole-transport layer 912, a light-emitting layer 913, an electron-transport layer 914, and an electron-injection layer 915 are stacked in this order over a first electrode 901 formed over a substrate 900, and a second electrode 903 is stacked over the electron-injection layer 915.

First, the first electrode 901 was formed over the substrate 900. The electrode area was set to 4 mm² (2 mm×2 mm). A glass substrate was used as the substrate 900. The first electrode 901 was formed to a thickness of 70 nm using indium tin oxide containing silicon oxide (ITSO) by a sputtering method.

For pretreatment, a surface of the substrate was washed with water, baking was performed at 200° C. for 1 hour, and then UV ozone treatment was performed for 370 seconds. After that, the substrate was transferred into a vacuum evaporation apparatus where the pressure had been reduced to approximately 1×10⁻⁴ Pa, and was subjected to vacuum baking at 170° C. for 30 minutes in a heating chamber of the vacuum evaporation apparatus, and then the substrate was cooled down for approximately 30 minutes.

Next, the hole-injection layer 911 was formed over the first electrode 901. After the pressure in the vacuum evaporation apparatus was reduced to 1×10⁻⁴ Pa, the hole-injection layer 911 was formed by co-evaporation to have a mass ratio of 1,3,5-tri(dibenzothiophen-4-yl)benzene (abbreviation: DBT3P-II) to molybdenum oxide of 2:1 and a thickness of 60 nm.

Then, the hole-transport layer 912 was formed over the hole-injection layer 911. The hole-transport layer 912 was formed to a thickness of 20 nm by evaporation of N-(1,1'-biphenyl-4-yl)-N-[4-(9-phenyl-9H-carbazol-3-yl)phenyl]-9,9-dimethyl-9H-fluoren-2-amine (abbreviation: PCBBiF).

Next, the light-emitting layer 913 was formed over the hole-transport layer 912.

The light-emitting layer 913 of the light-emitting device 1 was formed by co-evaporation using bis(4,6-diphenylpyrimidinato)iridium(I) (abbreviation: [Ir(dppm)₂(acac)]) as a guest material (a phosphorescent material) in addition to 8-[(3'-dibenzothiophen-4-yl)biphenyl-3-yl]naphtho[2',1':4,5]furo[2,3-b]pyrazine (abbreviation: 8mDBtBPNfpr(II)) and PCBBiF to have a weight ratio of 8mDBtBPNfpr(II): PCBBiF:[Ir(dppm)₂(acac)]=0.75:0.25:0.075. The thickness was set to 40 nm. The light-emitting layer 913 of the comparative light-emitting device 2 was formed by co-evaporation using [Ir(dppm)₂(acac)] as a guest material (a phosphorescent material) in addition to 12-[(3'-dibenzothiophen-4-yl)biphenyl-3-yl]phenanthro[9',10':4,5]furo[2,3-b]pyrazine (abbreviation: 12mDBtBPPnfpr) and PCBBiF to have a weight ratio of 12mDBtBPPnfpr: PCBBiF:[Ir(dppm)₂(acac)]=0.75:0.25:0.075. The thickness was set to 40 nm.

Next, the electron-transport layer 914 was formed over the light-emitting layer 913.

The electron-transport layer 914 of the light-emitting device 1 was formed in such a manner that 8mDBtBPNfpr (II) and 2,9-bis(naphthalen-2-yl)-4,7-diphenyl-1,10-phenanthroline (abbreviation: NBphen) were sequentially deposited by evaporation to thicknesses of 25 nm and 15 nm, respectively. The electron-transport layer 914 of the comparative light-emitting device 2 was formed in such a manner that 12mDBtBPNfpr and Bphen were sequentially deposited by evaporation to thicknesses of 25 nm and 15 nm, respectively.

Then, the electron-injection layer 915 was formed over the electron-transport layer 914. The electron-injection layer 915 was formed to a thickness of 1 nm by evaporation of lithium fluoride (LiF).

After that, the second electrode 903 was formed over the electron-injection layer 915. The second electrode 903 was formed to a thickness of 200 nm by an evaporation method using aluminum. In this example, the second electrode 903 functions as a cathode.

Through the above steps, the light-emitting devices each including an EL layer 902 between the pair of electrodes were formed over the substrate 900. Note that the hole-injection layer 911, the hole-transport layer 912, the light-emitting layer 913, the electron-transport layer 914, and the electron-injection layer 915 described above are functional layers forming the EL layer in one embodiment of the present invention. Furthermore, in all the evaporation steps in the above fabrication method, evaporation was performed by a resistance-heating method.

Each of the light-emitting devices fabricated as described above was sealed using another substrate (not illustrated) in such a manner that the substrate (not illustrated) to which a sealant to be cured by ultraviolet light was applied was fixed to the substrate 900 in a glove box containing a nitrogen atmosphere, and the substrates were bonded to each other such that the sealant was attached so as to surround the light-emitting device formed over the substrate 900. In the sealing process, the sealant was irradiated with 365-nm ultraviolet light at 6 J/cm² to be cured, and the sealant was heated at 80° C. for 1 hour to be stabilized.

<<Operation Characteristics of Light-Emitting Devices>>

Figure 9:
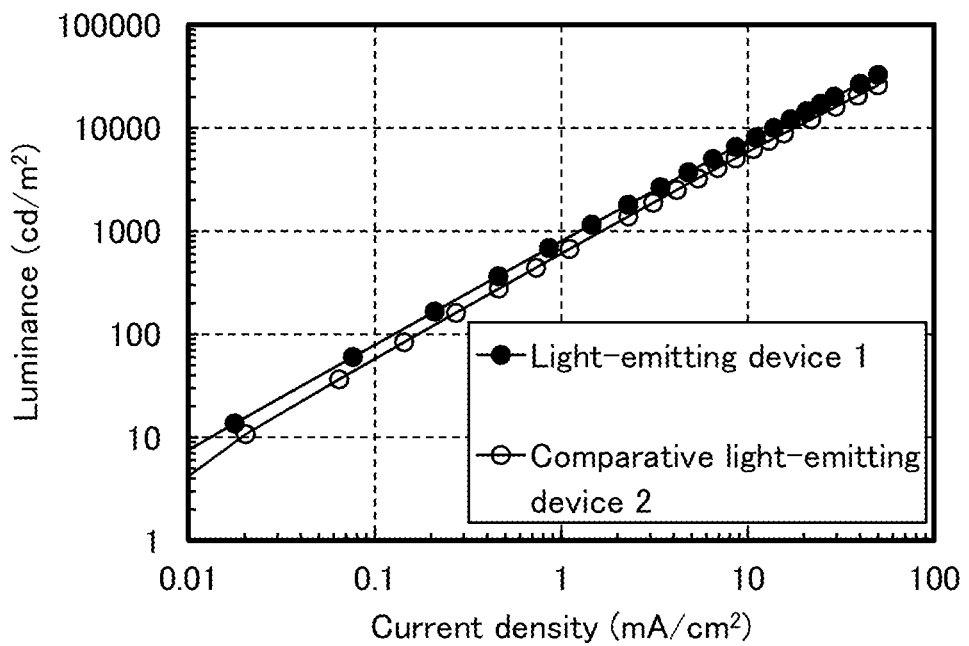
FIG. 9 is a graph showing luminance-current density characteristics of a light-emitting device 1 and a comparative light-emitting device 2.
Figure 10:
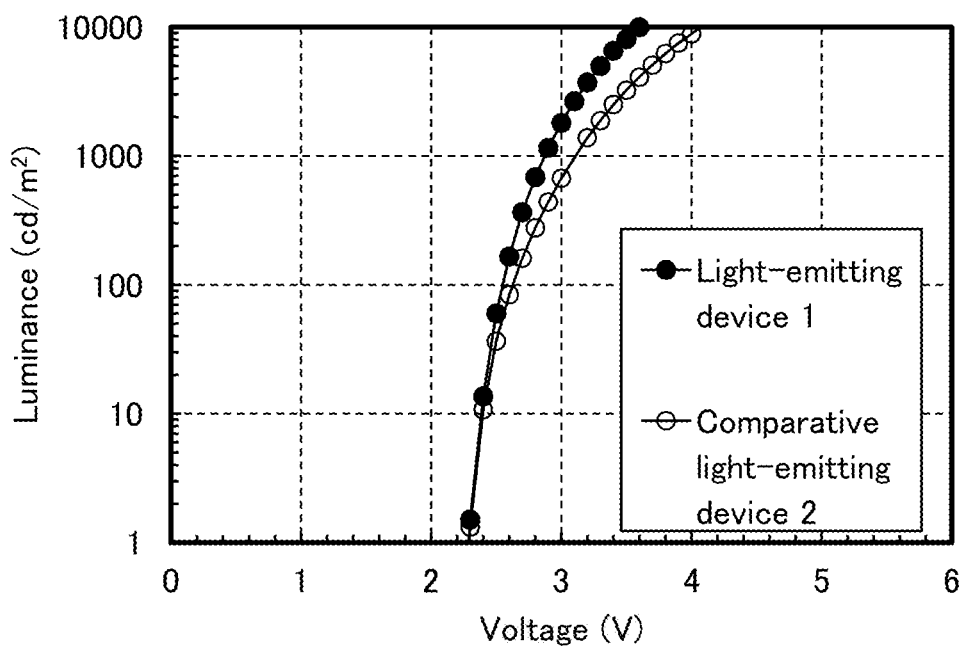
FIG. 10 is a graph showing luminance-voltage characteristics of the light-emitting device 1 and the comparative light-emitting device 2.
Figure 11:
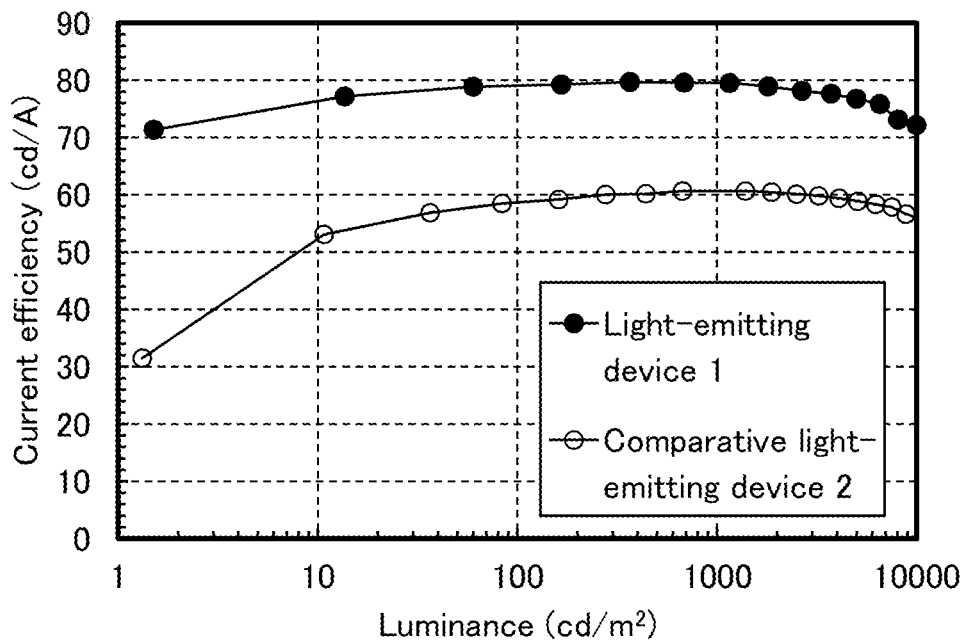
FIG. 11 is a graph showing current efficiency-luminance characteristics of the light-emitting device 1 and the comparative light-emitting device 2.
Figure 12:
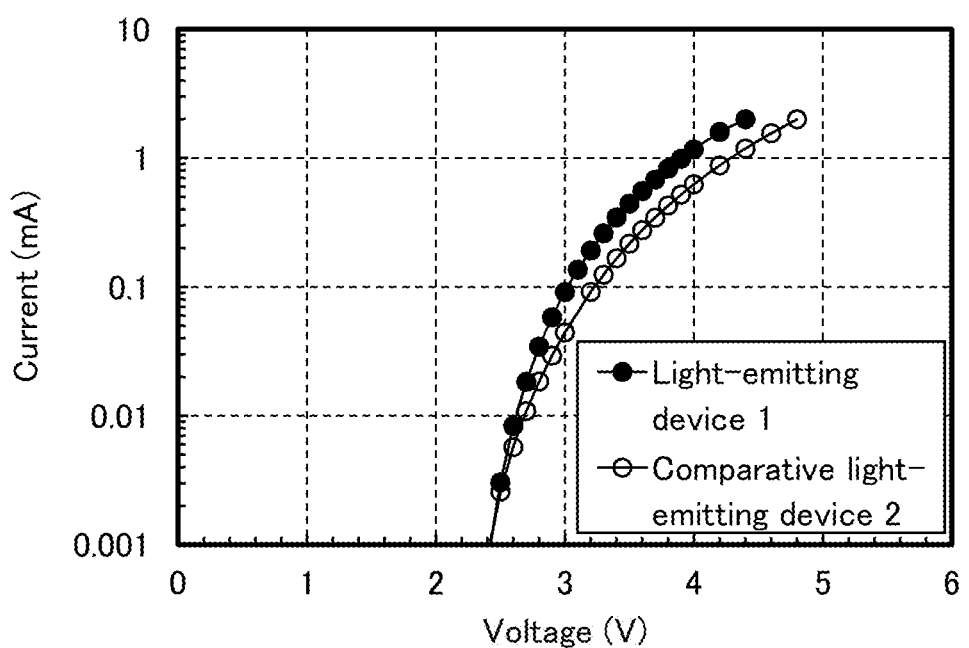
FIG. 12 is a graph showing current-voltage characteristics of the light-emitting device 1 and the comparative light-emitting device 2.

Operation characteristics of the fabricated light-emitting devices were measured. Note that the measurement was performed at room temperature (in an atmosphere kept at 25° C.). As the results of the operation characteristics of the light-emitting devices, the current density-luminance characteristics are shown in FIG. 9, the voltage-luminance characteristics are shown in FIG. 10, the luminance-current efficiency characteristics are shown in FIG. 11, and the voltage-current characteristics are shown in FIG. 12.

Table 2 shows the initial values of main characteristics of the light-emitting devices at around 1000 cd/m².

TABLE 2

|  | Voltage (V) | Current (mA) | Current density (mA/cm³) | Chromaticity (x, y) | Luminance (cd/m²) | Current efficiency (cd/A) | Power efficiency (lm/W) | External quantum efficiency (%) |
|---|---|---|---|---|---|---|---|---|
| Light-emitting device 1 | 2.9 | 0.058 | 1.5 | (0.56, 0.44) | 1200 | 80 | 86 | 31 |
| Comparative light-emitting device 2 | 3.0 | 0.044 | 1.1 | (0.56, 0.44) | 670 | 61 | 64 | 26 |

The above results reveal that the light-emitting device 1 described in this example exhibits higher emission efficiency than the comparative light-emitting device 2, as shown in the initial characteristics shown in FIG. 9 to FIG. 12 or Table 2.

Figure 13:
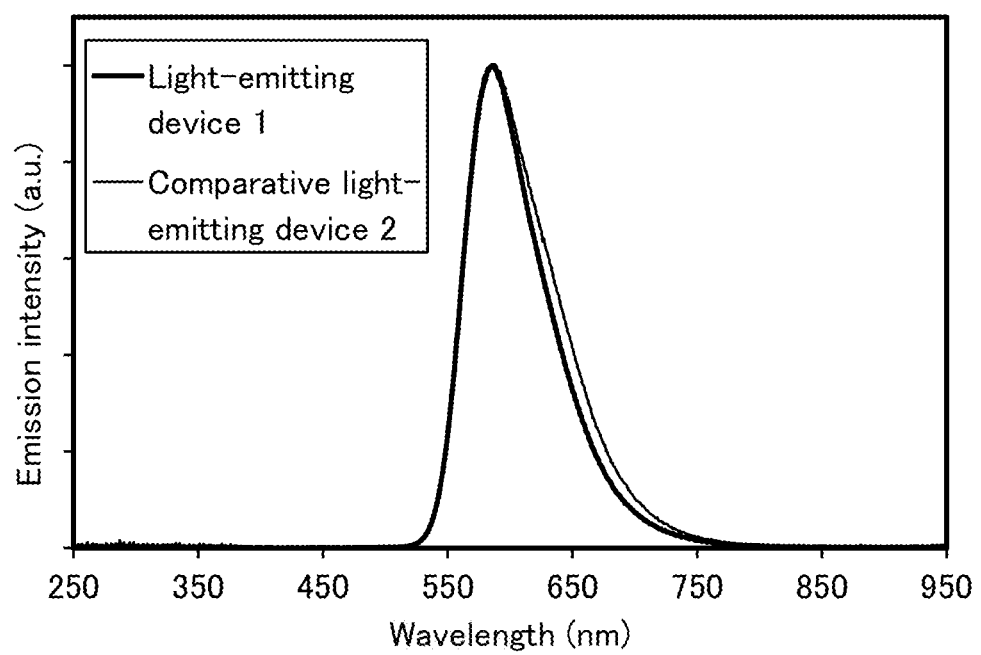
FIG. 13 is a graph showing emission spectra of the light-emitting device 1 and the comparative light-emitting device 2.

FIG. 13 shows emission spectra when a current at a current density of 0.1 mA/cm² was supplied to the light-emitting device 1 and the comparative light-emitting device 2. As shown in FIG. 13, the emission spectrum of the light-emitting device 1 and the comparative light-emitting device 2 has a peak at around 589 nm, each of which is presumably derived from light emission of [Ir(dppm)$_2$(acac)] contained in the light-emitting layer 913.

Figure 14:
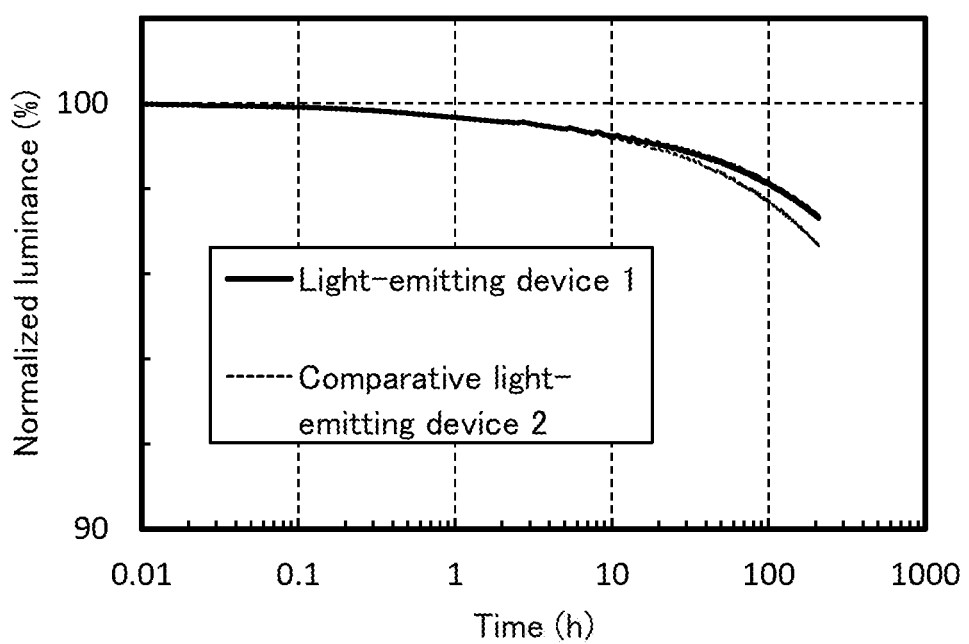
FIG. 14 is a graph showing reliabilities of the light-emitting device 1 and the comparative light-emitting device 2.
Figure 15:
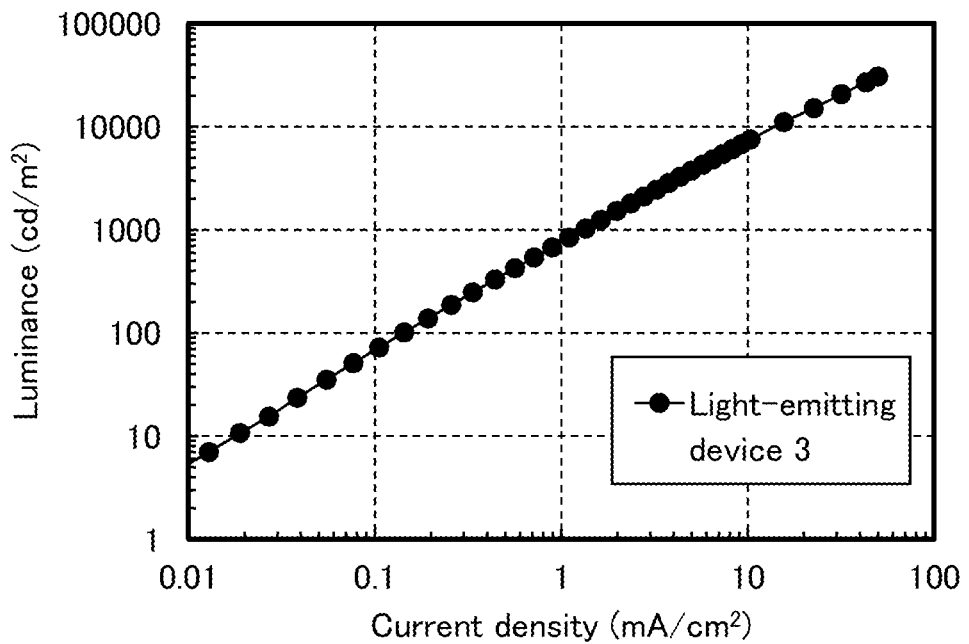
FIG. 15 is a graph showing luminance-current density characteristics of a light-emitting device 3.
Figure 16:
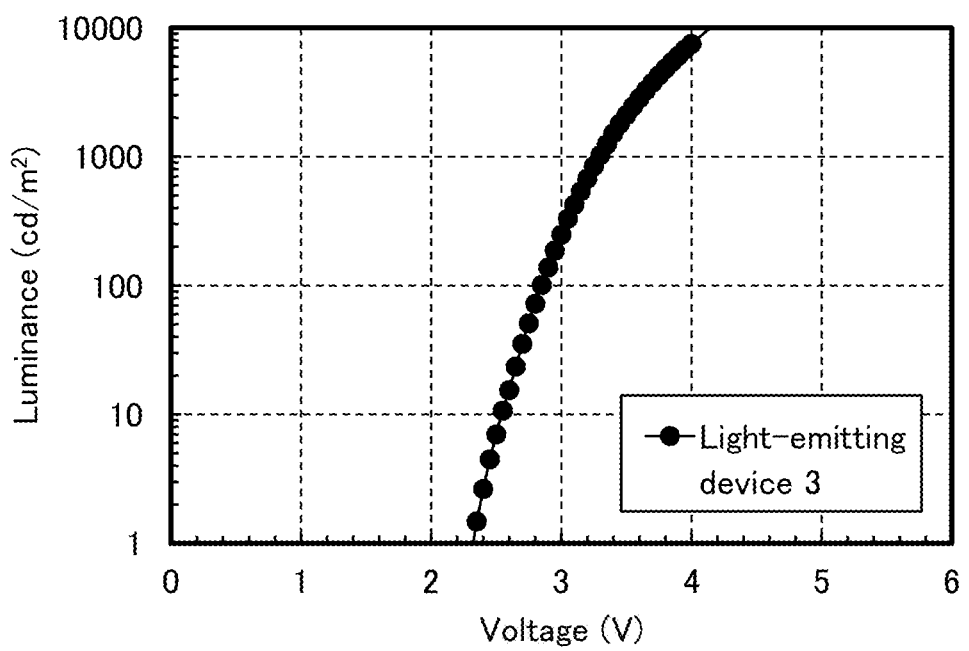
FIG. 16 is a graph showing luminance-voltage characteristics of the light-emitting device 3.
Figure 17:
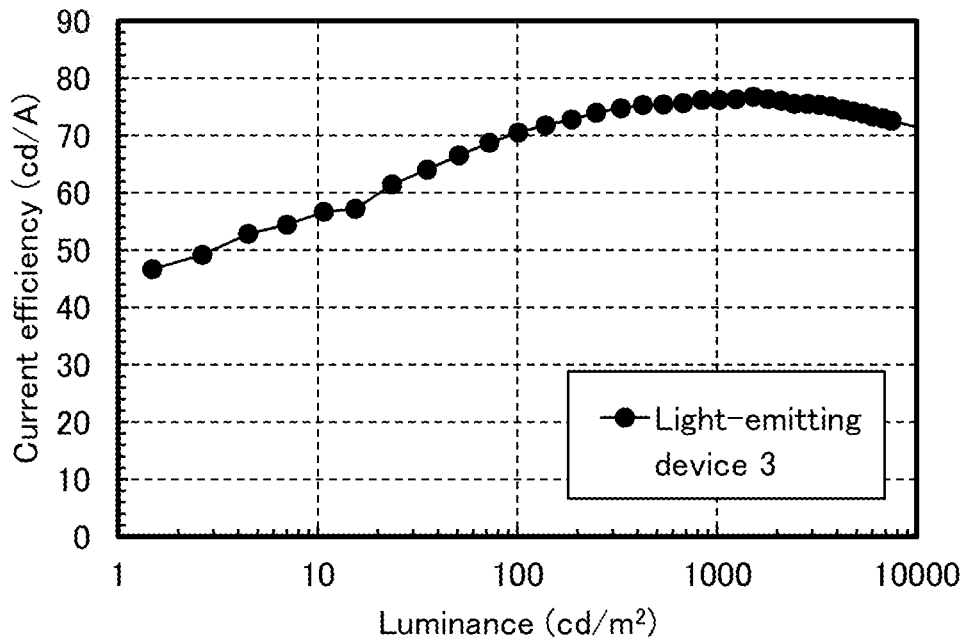
FIG. 17 is a graph showing current efficiency-luminance characteristics of the light-emitting device 3.

Next, reliability tests were performed on the light-emitting device 1 and the comparative light-emitting device 2. FIG. 14 shows results of the reliability tests. In FIG. 14, the vertical axis represents normalized luminance (%) with an initial luminance of 100%, and the horizontal axis represents driving time (h) of the devices. As the reliability tests, driving tests were performed at a constant luminance of 1000 cd/cm². As shown in the results in FIG. 14, the light-emitting device 1 has higher reliability than the comparative light-emitting device 2.

Figure 21A:
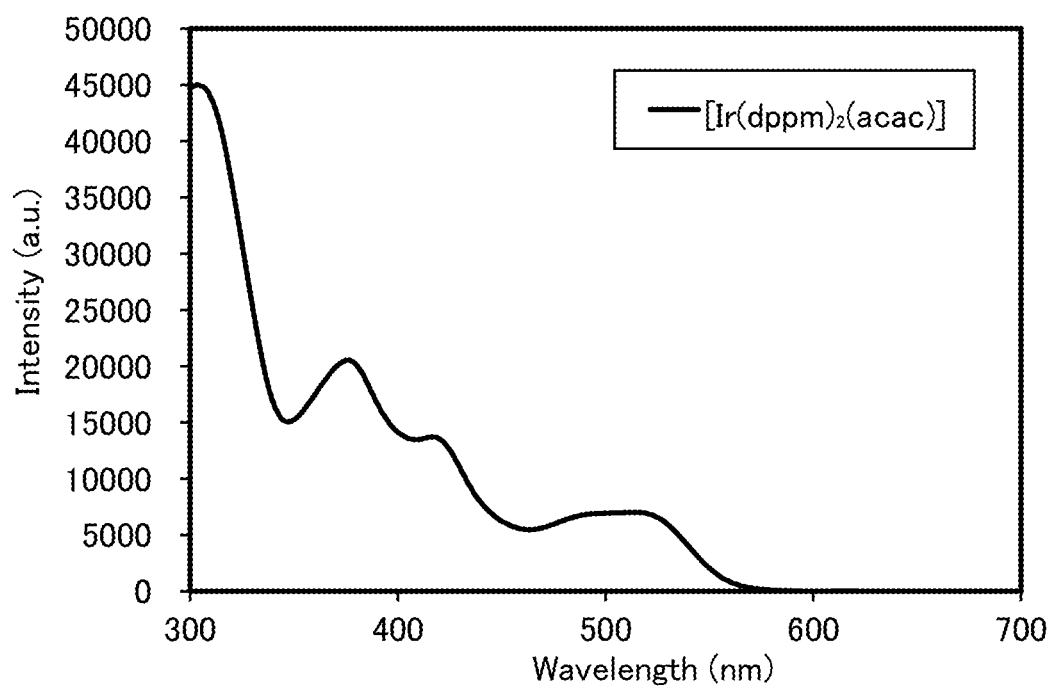
FIG. 21A shows an absorption spectrum of [Ir(dppm)$_2$(acac)] and FIG. 21B is an enlarged view of an absorption edge and its vicinity of the absorption spectrum of [Ir(dppm)$_2$(acac)].
Figure 21B:
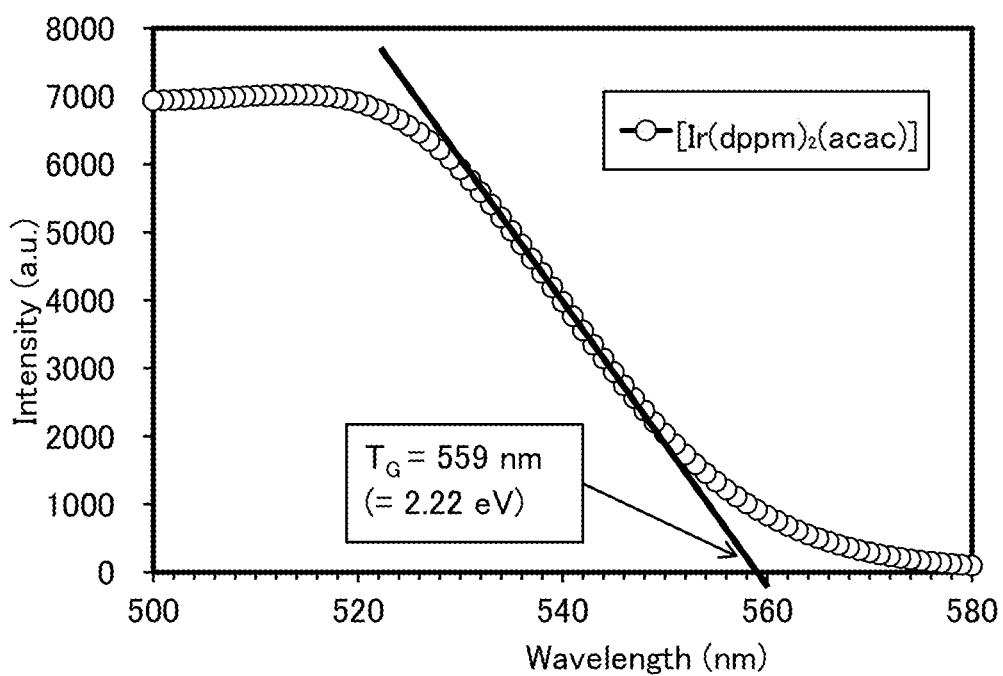

Here, FIG. 21A shows an absorption spectrum of [Ir(dppm)$_2$(acac)], which was used as the guest material (phosphorescent substance), in a dichloromethane solution, and FIG. 21B shows an enlarged view of an absorption edge and its vicinity of the absorption spectrum. FIG. 21B reveals that the T1 level (denoted by T$_G$, which means the T1 level derived from an absorption edge of the absorption spectrum of a phosphorescent substance) of [Ir(dppm)$_2$(acac)], which is a phosphorescent substance, is 2.22 eV (=559 nm). Thus, in the light-emitting layer 913 of the light-emitting device 1 described in this example, 8mDBtBPNfpr(I) was used as the organic compound having a naphtho[2',1':4,5]furo[2,3-b]pyrazine skeleton, and [Ir(dppm)$_2$(acac)], whose T1 level is 2.22 eV (calculated from the measured absorption spectrum of the dichloromethane solution), was used as the phosphorescent substance whose T1 level is lower than or equal to 2.5 eV. In the light-emitting layer 913 of the comparative light-emitting device 2, 12mDBtBPPnfpr was used as an organic compound that does not have a naphtho[2',1':4,5]furo[2,3-b]pyrazine skeleton, and [Ir(dppm)$_2$(acac)] was used as a light-emitting substance as in the light-emitting device 1.

As described above, the light-emitting device 1 of this example has not only higher emission efficiency as the initial characteristics but also has higher reliability than the comparative light-emitting device 2. This results from an increase in the efficiency of energy transfer from 8mDBtBPNfpr(II) in an excited state to [Ir(dppm)$_2$(acac)] in the light-emitting layer 913 of the light-emitting device 1 having a structure of one embodiment of the present invention.

Figure 22A:
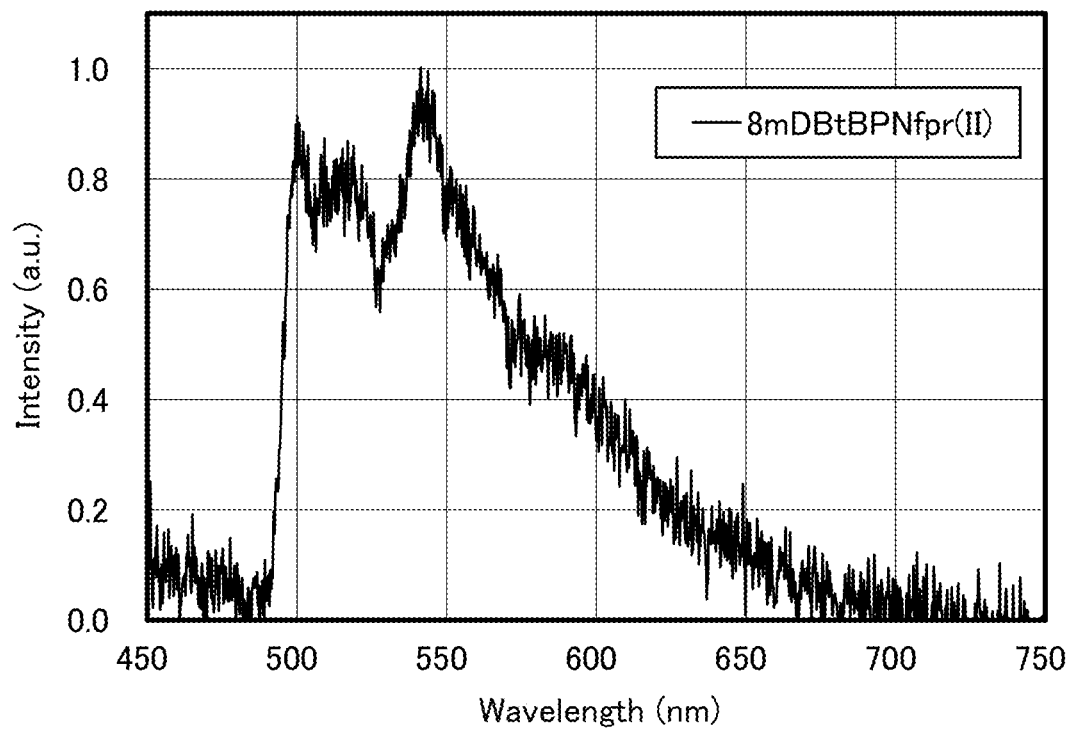
FIG. 22A shows a phosphorescence spectrum of 8mDBtBPNfpr(II) and FIG. 22B is an enlarged view of an emission edge and its vicinity of the phosphorescence spectrum of 8mDBtBPNfpr(II).
Figure 22B:
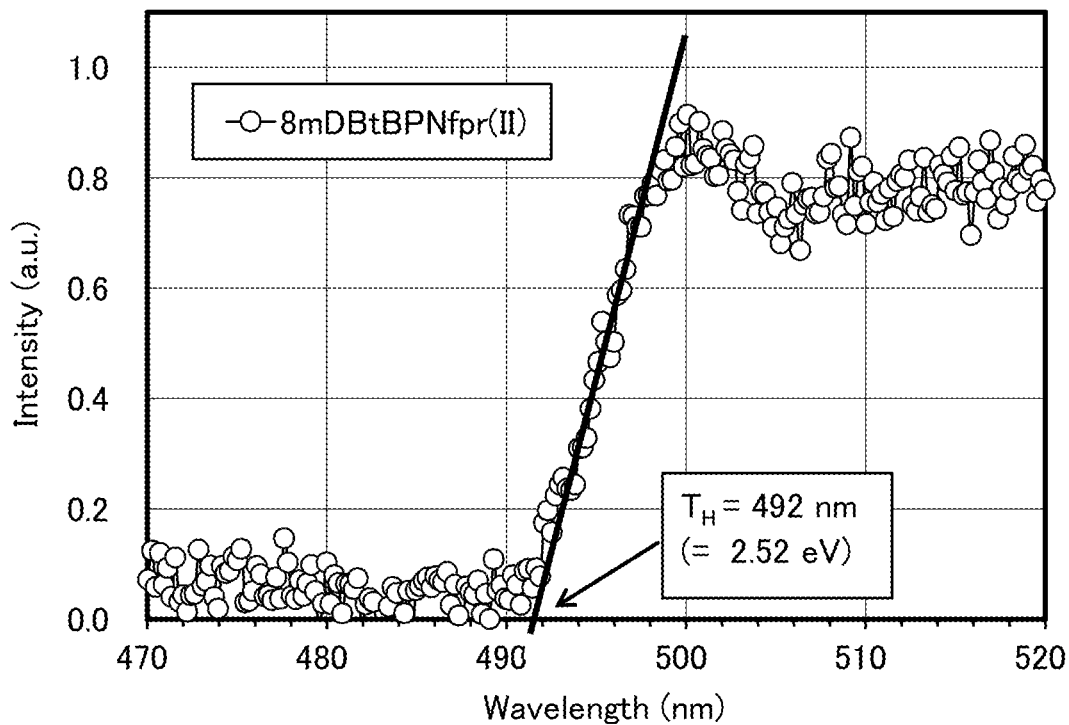

FIG. 22A shows a phosphorescence spectrum of 8mDBtBPNfpr(II), which is an organic compound having a naphtho[2',1':4.5]furo[2,3-b]pyrazine skeleton. FIG. 22B is an enlarged view of an emission edge and its vicinity. The phosphorescence spectrum was measured by time-resolved spectroscopy with a mechanical shutter. A PL microscope (LabRAM HR-PL produced by HORIBA, Ltd.) was used and the measurement temperature was 10 K. According to FIG. 22B, the T1 level (denoted by T$_H$, which means the T1 level derived from an emission edge on the short wavelength side of the phosphorescence spectrum of the organic compound that is the host material) of 8mDBtBPNfpr(II) as the host material is 2.52 eV (=492 nm). Hence, the T$_H$-T$_G$ in the light-emitting device 1 is 0.30 eV and the following condition represented by Expression (1) in Embodiment 1 is satisfied: 0.1 eV ≤ T$_H$-T$_G$ ≤ 0.4 eV.

Example 2

In this example, a light-emitting device 3 was fabricated as a light-emitting device according to one embodiment of the present invention, and the measurement results of the characteristics thereof are described.

The device structure of the light-emitting device 3 fabricated in this example is similar to that described in Example 1 with reference to FIG. 8. Table 3 lists the specific structures of the layers in the device structure. The chemical formulae of materials used in this example are shown below.

TABLE 3

|  | First electrode 901 | Hole-injection layer 911 | Hole-transport layer 912 | Light-emitting layer 913 | Electron-transport layer 914 | | Electron-injection layer 915 | Second electrode 903 |
|---|---|---|---|---|---|---|---|---|
| Light-emitting device 3 | ITSO (70 nm) | DBT3P-H:MoOx (2:1, 45 nm) | PCBBiIBP (20 nm) | * | 8mDBtBPNfpr(II) (20 nm) | NBphen (10 nm) | LiF (1 nm) | Al (200 nm) |

* 8mDBtBPNfpr(II):PCCP:[Ir(ppy)$_2$(mdppy)] (0.5:0.5:0.1, 40 nm)

[Chemical Formulae 9]

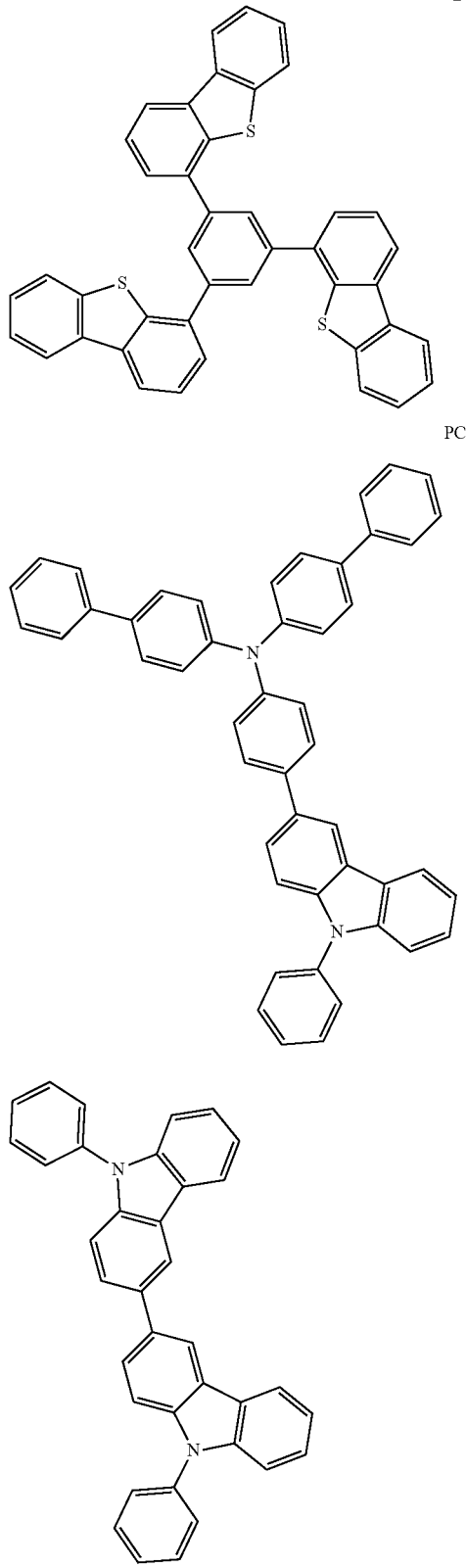

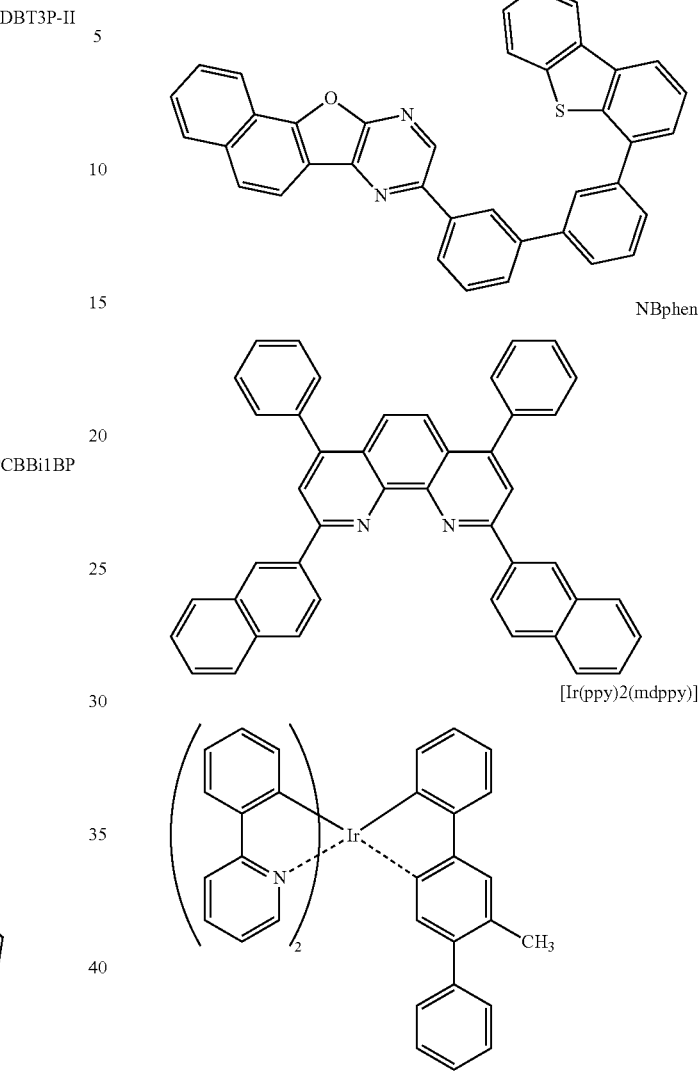

Note that for the hole-transport layer 912, 4,4'-diphenyl-4''-(9-phenyl-9H-carbazol-3-yl)triphenylamine (abbreviation: PCBBi1BP) was used. For the light-emitting layer 913, [2-(4-methyl-5-phenyl-2-pyridinyl-κN)phenyl-κC]bis[2-(2-pyridinyl-κN)phenyl-κC]iridium (abbreviation: Ir(ppy)$_2$(mdppy)) was used as a guest material (a phosphorescent material) in addition to 8-[(3'-dibenzothiophen-4-yl)biphenyl-3-yl]naphtho[2',1':4,5]furo[2,3-b]pyrazine (abbreviation: 8mDBtBPNfpr(II)) and 3,3'-bis(9-phenyl-9H-carbazole) (abbreviation: PCCP).

<<Operation Characteristics of Light-Emitting Device 3>>

The operation characteristics of the light-emitting device 3 which was fabricated were measured at room temperature. Note that the measurement was performed at room temperature (in an atmosphere kept at 25° C.).

FIG. 15, FIG. 16, FIG. 17, and FIG. 18 show the current density-luminance characteristics, the voltage-luminance characteristics, the luminance-current efficiency characteristics, and the voltage-current characteristics, respectively, of the light-emitting device 3.

Table 4 shows the initial values of main characteristics of the light-emitting device at around 1000 cd/m$^2$.

TABLE 4

| | Voltage (V) | Current (mA) | Current density (mA/cm$^3$) | Chromaticity (x, y) | Luminance (cd/m$^2$) | Current efficiency (cd/A) | Power efficiency (lm/W) | External quantum efficiency (%) |
|---|---|---|---|---|---|---|---|---|
| Light-emitting device 3 | 3.3 | 0.054 | 1.3 | (0.34, 0.62) | 1000 | 76 | 73 | 21 |

Figure 19:
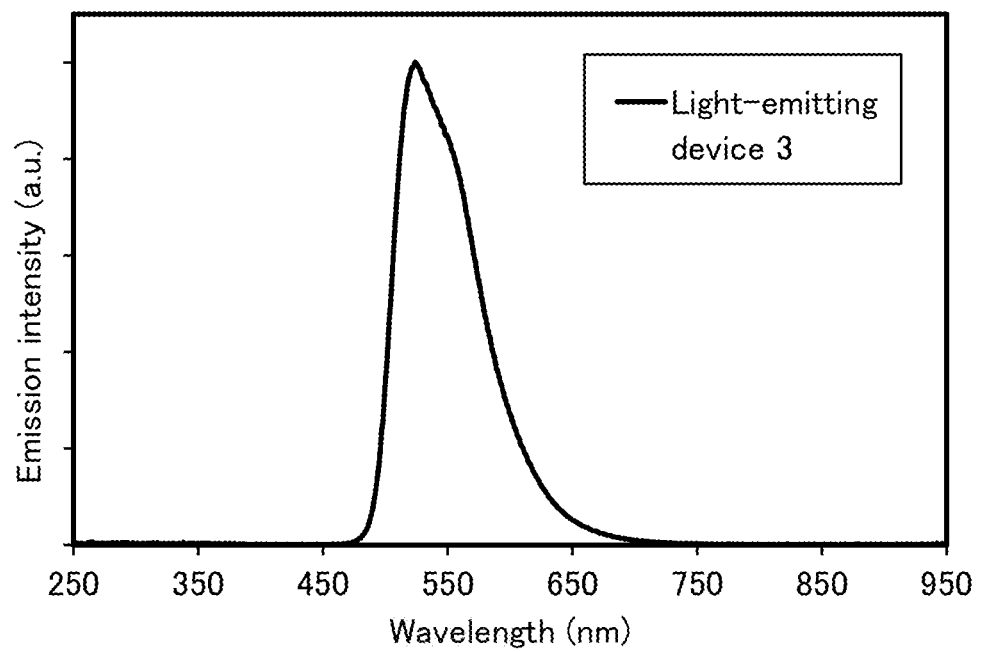
FIG. 19 is a graph showing an emission spectrum of the light-emitting device 3.

FIG. 19 shows emission spectra when current at a current density of 2.5 mA/cm$^2$ was supplied to the light-emitting device 3. As shown in FIG. 19, the emission spectrum of the light-emitting device has a peak at around 524 nm, which is presumably derived from light emission of [Ir(ppy)$_2$(mdppy)] contained in the light-emitting layer 913.

Figure 23A:
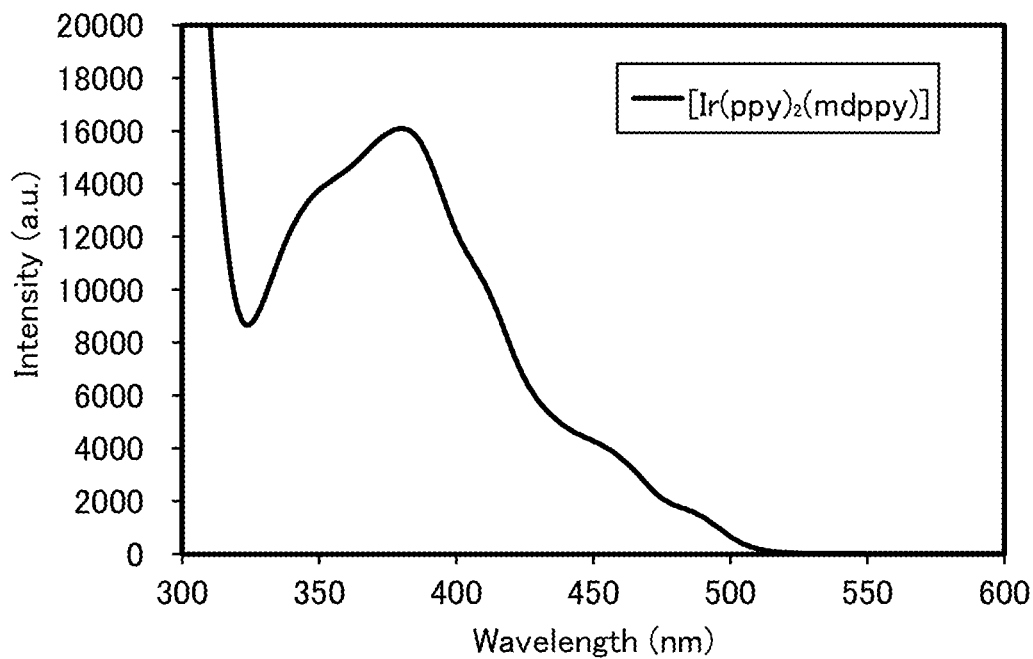
FIG. 23A shows an absorption spectrum of [Ir(ppy)$_2$(mdppy)] and FIG. 23B is an enlarged view of an absorption edge and its vicinity of the absorption spectrum of [Ir(ppy)$_2$(mdppy)].
Figure 23B:
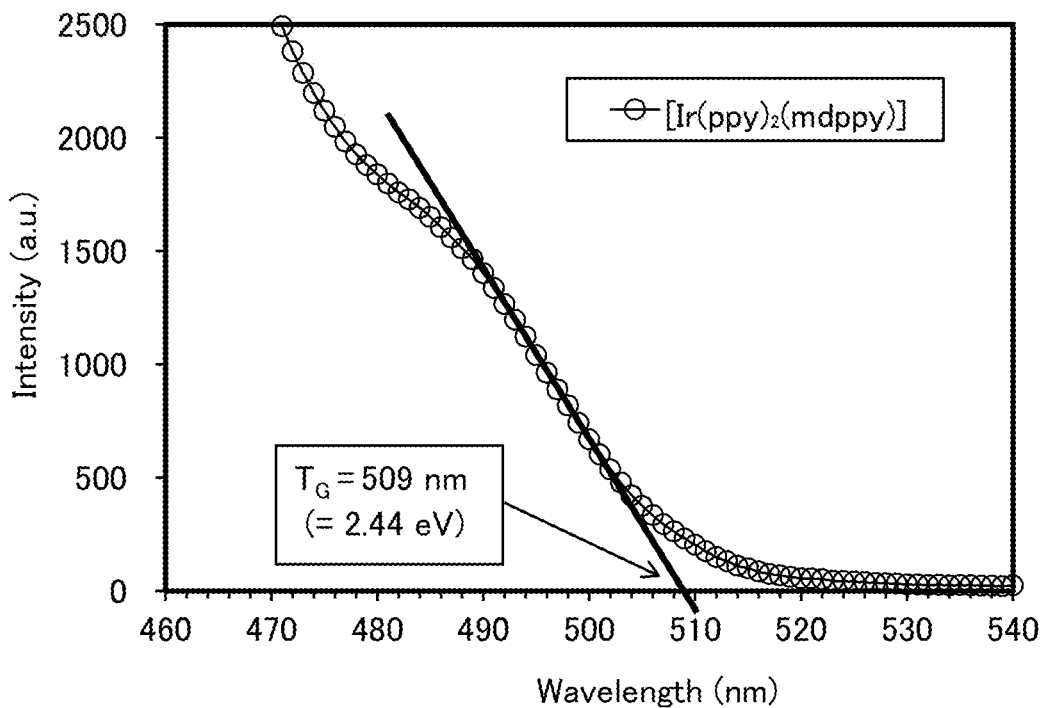

Here, FIG. 23A shows an absorption spectrum of [Ir(ppy)$_2$(mdppy)], which was used as the guest material (phosphorescent substance), in a dichloromethane solution, and FIG. 23B shows an enlarged view of an absorption edge and its vicinity of the absorption spectrum. FIG. 23B reveals that the T1 level (denoted by T$_G$, which means the T1 level derived from an absorption edge of the absorption spectrum of a phosphorescent substance) of [Ir(ppy)$_2$(mdppy)], which is a phosphorescent substance, is 2.44 eV (=509 nm). Thus, in the light-emitting layer 913 of the light-emitting device 3 described in this example, 8mDBtBPNfpr) was used as the organic compound having a naphtho[2',1':4,5]furo[2,3-b]pyrazine skeleton, and [Ir(ppy)$_2$(mdppy)] was used as the light-emitting substance whose T1 level is lower than or equal to 2.5 eV. Thus, the high emission efficiency of the light-emitting device 3 of this example results from an increase in the efficiency of energy transfer from 8mDBtBPNfpr(II) in an excited state to [Ir(ppy)$_2$(mdppy)] in the light-emitting layer 913 of the light-emitting device 3 having a structure of one embodiment of the present invention.

Reference Synthesis Example 1

A method for synthesizing 8-[(3'-dibenzothiophen-4-yl)biphenyl-3-yl]naphtho[2',1':4,5]furo[2,3-b]pyrazine (abbreviation: 8mDBtBPNfpr(II)), which is the organic compound used in Examples 1 and 2, will be described. The structural formula of 8mDBtBPNfpr(II) is shown below.

[Chemical Formula 10]

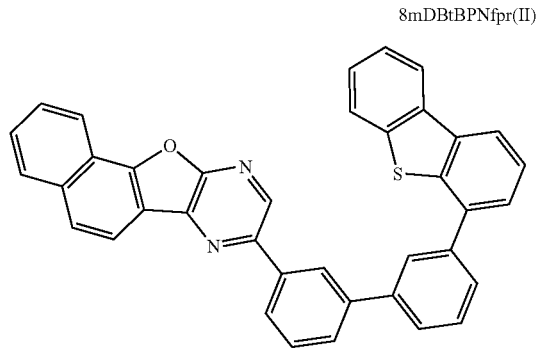

8mDBtBPNfpr(II)

<Step 1: Synthesis of 5-chloro-31-methoxynaphthalen-2-yl))pyrazin-2-anine

First, into a three-neck flask equipped with a reflux pipe, 0.92 g of 3-bromo-5-chloropyrazin-2-amine, 0.96 g of 1-methoxynaphthalen-2-boronic acid, 11 mL of a 2 M aqueous solution of sodium carbonate, and 22 mL of toluene were put, and the air in the flask was replaced with nitrogen. The mixture in the flask was degassed by being stirred under reduced pressure, and then 0.10 g of tetrakis(triphenylphosphine)palladium(0) (abbreviation: Pd(PPh$_3$)$_4$) was added thereto. The mixture was stirred at 110° C. for 15 hours to be reacted.

After a predetermined time elapsed, extraction was performed with toluene. Then, purification by silica gel column chromatography using a developing solvent (toluene:ethyl acetate=30:1) was performed, so that a pyrazine derivative which was the object was obtained (0.97 g of a yellowish white solid in a yield of 77%). The synthesis scheme of Step 1 is shown in (a-1) below.

[Chemcial Formula 11]

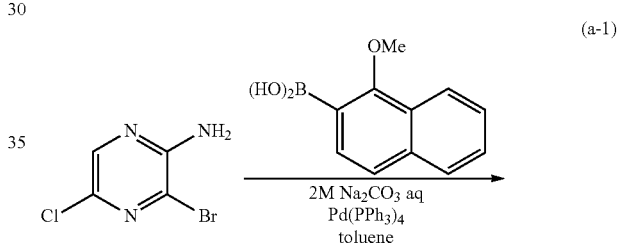

(a-1)

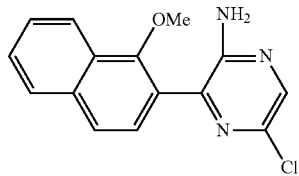

Step 2: Synthesis of 8-chloronaphtho[2',1':4,5]furo[2,3-b]pyrazine

Next, into a three-neck flask were put 0.96 g of 5-chloro-3-(1-methoxynaphthalen-2-yl)pyrazin-2-amine obtained in Step 1, 17 mL of dehydrated tetrahydrofuran, and 17 mL of a glacial acetic acid, and the air in the flask was replaced with nitrogen. After the flask was cooled down to −10° C., 1.2 mL of tert-butyl nitrite was dripped, and the mixture was stirred at −10° C. for 1 hour and at 0° C. for 3.5 hours. After a predetermined time elapsed, 200 mL of water was added to the obtained suspension and suction filtration was performed, so that a pyrazine derivative which was the object was obtained (0.69 g of a yellowish white solid in a yield of 81%). The synthesis scheme of Step 2 is shown in (a-2) below.

[Chemical Formula 12]

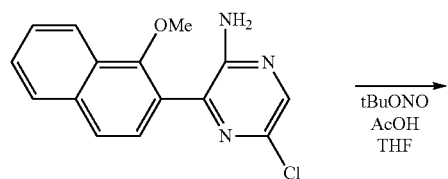

(a-2)

$\xrightarrow{\text{tBuONO} \atop \text{AcOH} \atop \text{THF}}$

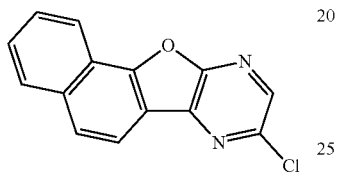

Step 3: Synthesis of 8-(3-chlorophenyl)naphtho[2′,1′:4,5]furo[2,3-b]pyrazine Into a three-neck flask, 1.24 g of 8-chloronaphtho[2′,1′:4,5]furo[2,3-b]pyrazine obtained in Step 2, 0.81 g of 3-chlorophenylboronic acid, 7.0 mL of a 2 M aqueous solution of potassium carbonate, 47 mL of toluene, and 4.7 mL of ethanol were put, and the air in the flask was replaced with nitrogen. The mixture in the flask was degassed by being stirred under reduced pressure, and then 0.15 g of palladium (I) acetate (abbreviation: Pd(OAc)₂) and 0.56 g of triphenylphosphine were added thereto. The mixture was stirred at 90° C. for 11 hours to be reacted.

After a predetermined time elapsed, extraction was performed with toluene. Then, purification by silica gel column chromatography using toluene as a developing solvent was performed, so that a pyrazine derivative which was the object was obtained (1.13 g of a yellowish white solid in a yield of 68%). The synthesis scheme of Step 3 is shown in (a-3) below.

[Chemical Formula 13]

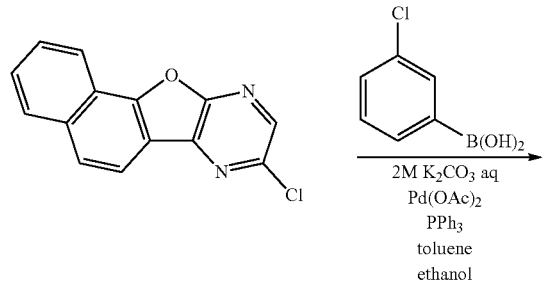

(a-3)

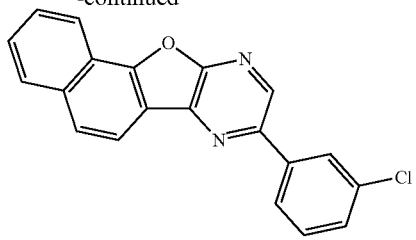

Step 4: Synthesis of gmDBtBPNfpr(II)

Into a three-neck flask, 1.12 g of 8-(3-chlorophenyl)naphtho[2′,1′:4,5]furo[2,3-b]pyrazine obtained in Step 3, 1.69 g of 3-(4-dibenzothiophene)phenylboronic acid, 3.14 g of tripotassium phosphate, 0.91 g of tert-butyl alcohol, and 27 mL of diethylene glycol dimethyl ether (abbreviation: diglyme) were put, and the air in the flask was replaced with nitrogen. The mixture in the flask was degassed by being stirred under reduced pressure, and then 37 mg of palladium (II) acetate (abbreviation: Pd(OAc)₂) and 0.12 g of di(1-adamantyl)-n-butylphosphine (abbreviation: CataCXium A) were added thereto. The mixture was stirred at 140° C. for 40.5 hours to be reacted.

After a predetermined time elapsed, the obtained suspension was subjected to suction filtration, followed by washing with water and ethanol. The obtained solid was dissolved in toluene, and the mixture was filtered through a filter aid in which Celite, alumina, and Celite were stacked in this order. Recrystallization was then performed from toluene, so that the object substance was obtained (0.99 g of a yellowish white solid in a yield of 54%).

By a train sublimation method, 0.99 g of the obtained yellowish white solid was purified by sublimation. The solid was heated under the sublimation purification conditions where the pressure was 2.7 Pa and the argon flow rate was 10.5 mL/min at 310° C. After the purification by sublimation, 0.81 g of a yellowish white solid which was the object was obtained at a collection rate of 82%. The synthesis scheme of Step 4 is shown in (a-4) below.

[Chemical Formula 14]

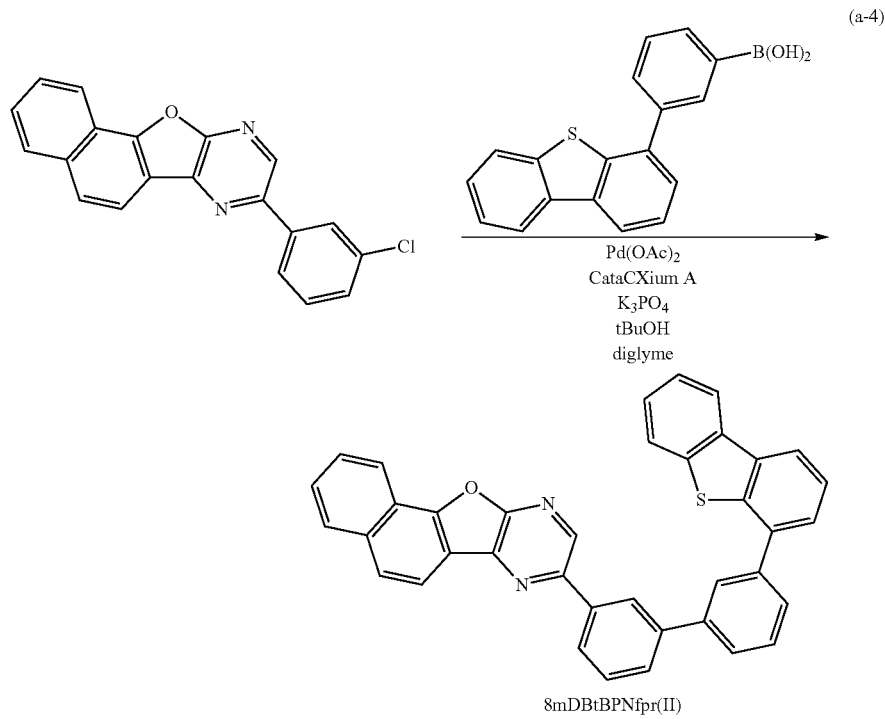

Figure 20:
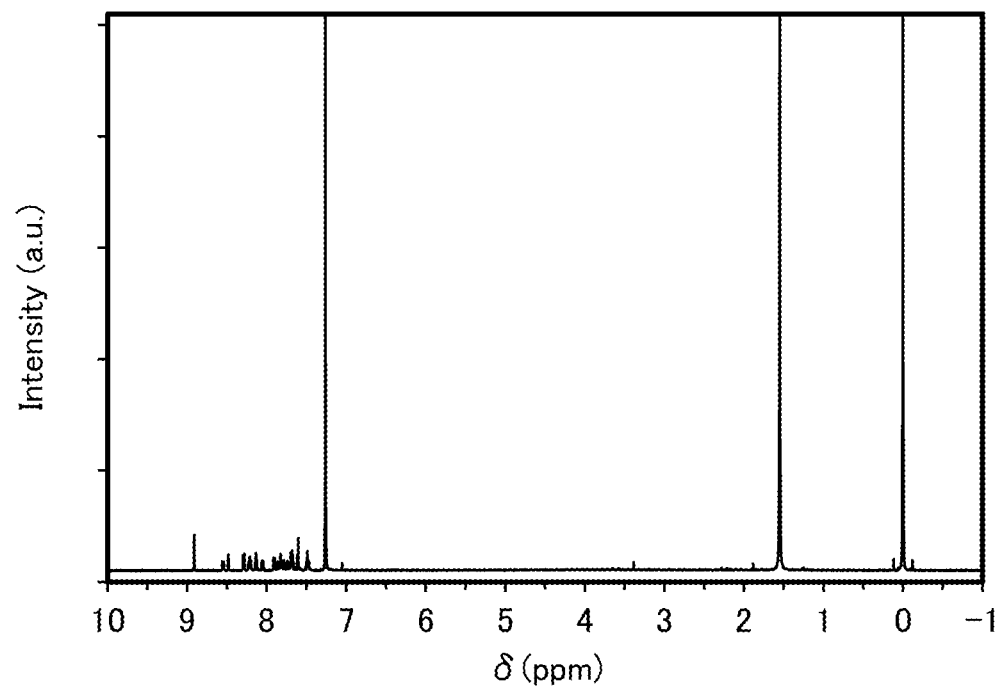
FIG. 20 is a $^1$H-NMR chart of 8mDBtBPNfpr(II).

Note that results of the analysis of the yellowish white solid obtained in Step 4 by nuclear magnetic resonance spectrometry ($^1$H-NMR) are shown below. The $^1$H-NMR chart is shown in FIG. 20. These results reveal that 8mDBtBPNfpr(II), the organic compound, was obtained in this reference synthesis example.

$^1$H-NMR. δ (CDCl$_3$): 7.47-7.49 (m, 2H), 7.60-7.62 (m, 2H), 7.66-7.88 (m, 8H), 7.91 (d, 1H), 8.05 (d, 1H), 8.13-8.14 (m, 2H), 8.20-8.23 (m, 2H), 8.29 (d, 1H), 8.48 (s, 1H), 8.55 (d, 1H), 8.91 (s, 1H).

This application is based on Japanese Patent Application Serial No. 2019-111025 filed with Japan Patent Office on Jun. 14, 2019, the entire contents of which are hereby incorporated by reference.

What is claimed is:

1. A light-emitting device comprising:
an EL layer between a pair of electrodes,
wherein the EL layer comprises a light-emitting layer,
wherein the light-emitting layer comprises an organic compound comprising a naphtho[2',1':4,5]furo[2,3-b]pyrazine skeleton and a phosphorescent substance,
wherein a T1 level of the phosphorescent substance ($T_G$) is lower than or equal to 2.5 eV, and
wherein the $T_G$ is a T1 level derived from an absorption edge of an absorption spectrum of the phosphorescent substance.

2. The light-emitting device according to claim 1,
wherein a difference between a T1 level of the organic compound ($T_H$) and the T1 level of the phosphorescent substance ($T_G$) satisfies Expression (1), and $$0.1 \text{ eV} \le T_H - T_G \le 0.4 \text{ eV} \quad (1)$$

wherein the $T_H$ is a T1 level derived from an emission edge on a short wavelength side of a phosphorescence spectrum of the organic compound.

3. The light-emitting device according to claim 1,
wherein a difference between a T1 level of the organic compound ($T_H$) and the T1 level of the phosphorescent substance ($T_G$) satisfies Expression (2), and $$0.2 \text{ eV} \le T_H - T_G \le 0.4 \text{ eV} \quad (2)$$

wherein the $T_H$ is a T1 level derived from an emission edge on a short wavelength side of a phosphorescence spectrum of the organic compound.

4. A light-emitting apparatus comprising:
the light-emitting device according to claim 1; and
an FPC.

5. An electronic device comprising:
the light-emitting apparatus according to claim 4; and
at least one of a microphone, a camera, an operation button, an external connection portion, and a speaker.

6. A lighting device comprising:
the light-emitting device according to claim 1; and
at least one of a housing and a cover.

7. A light-emitting device comprising:
an EL layer between a pair of electrodes,
wherein the EL layer comprises a light-emitting layer, and
wherein the light-emitting layer comprises:
an organic compound comprising a naphtho[2',1':4,5]furo[2,3-b]pyrazine skeleton; and
an organometallic complex comprising a diazine skeleton.

8. The light-emitting device according to claim 7,
wherein the diazine skeleton is a pyrazine skeleton or a pyrimidine skeleton.

9. The light-emitting device according to claim 7,
wherein a difference between a T1 level of the organic compound ($T_H$) and a T1 level of the organometallic complex ($T_G$) satisfies Expression (1), $$0.1 \text{ eV} \le T_H - T_G \le 0.4 \text{ eV} \quad (1)$$

wherein the $T_G$ is a T1 level derived from an absorption edge of an absorption spectrum of the organometallic complex, and wherein the $T_H$ is a T1 level derived from an emission edge on a short wavelength side of a phosphorescence spectrum of the organic compound.

10. The light-emitting device according to claim 7,
wherein a difference between a T1 level of the organic compound ($T_H$) and a T1 level of the organometallic complex ($T_G$) satisfies Expression (2), $$0.2\ eV \le T_H - T_G \le 0.4\ eV \tag{2}$$

wherein the $T_G$ is a T1 level derived from an absorption edge of an absorption spectrum of the organometallic complex, and wherein the $T_H$ a T1 level derived from an emission edge on a short wavelength side of a phosphorescence spectrum of the organic compound.

11. A light-emitting apparatus comprising:
the light-emitting device according to claim 7; and
an FPC.

12. An electronic device comprising:
the light-emitting apparatus according to claim 11; and
at least one of a microphone, a camera, an operation button, an external connection portion, and a speaker.

13. A lighting device comprising:
the light-emitting device according to claim 7; and
at least one of a housing and a cover.

14. A light-emitting device comprising:
an EL layer between a pair of electrodes,
wherein the EL layer comprises a light-emitting layer,
wherein the light-emitting layer comprises an organic compound represented by a general formula (G1) and a phosphorescent substance,
wherein a T1 level of the phosphorescent substance ($T_G$) is lower than or equal to 2.5 eV,
wherein the $T_G$ is a T1 level derived from an absorption edge of an absorption spectrum of the phosphorescent substance, and

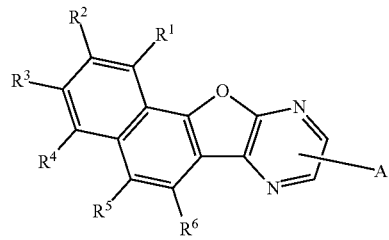
(G1)

wherein:
Q represents oxygen or sulfur;
A represents a group with a molecular weight lower than or equal to 1000; and
$R^1$ to $R^6$ independently represent any one of hydrogen, a substituted or unsubstituted alkyl group having 1 to 6 carbon atoms, a substituted or unsubstituted cycloalkyl group having 3 to 7 carbon atoms, and a substituted or unsubstituted aryl group having 6 to 30 carbon atoms.

15. The light-emitting device according to claim 14,
wherein a difference between a T1 level of the organic compound ($T_H$) and the T1 level of the phosphorescent substance ($T_G$) satisfies Expression (1), and $$0.1\ eV \le T_H - T_G \le 0.4\ eV \tag{1}$$

wherein the $T_H$ is a T1 level derived from an emission edge on a short wavelength side of a phosphorescence spectrum of the organic compound.

16. The light-emitting device according to claim 14,
wherein a difference between a T1 level of the organic compound ($T_H$) and the T1 level of the phosphorescent substance ($T_G$) satisfies Expression (2), and $$0.2\ eV \le T_H - T_G \le 0.4\ eV \tag{2}$$

wherein the $T_H$ is a T1 level derived from an emission edge on a short wavelength side of a phosphorescence spectrum of the organic compound.

17. A light-emitting apparatus comprising:
the light-emitting device according to claim 14; and
an FPC.

18. An electronic device comprising:
the light-emitting apparatus according to claim 17; and
at least one of a microphone, a camera, an operation button, an external connection portion, and a speaker.

19. A lighting device comprising:
the light-emitting device according to claim 14; and
at least one of a housing and a cover.

* * * * *